(12) United States Patent
Motozuka et al.

(10) Patent No.: US 11,184,031 B2
(45) Date of Patent: Nov. 23, 2021

(54) TRANSMISSION APPARATUS, RECEPTION APPARATUS, TRANSMISSION METHOD, AND RECEPTION METHOD

(71) Applicant: Panasonic Intellectual Property Corporation of America, Torrance, CA (US)

(72) Inventors: Hiroyuki Motozuka, Kanagawa (JP); Takenori Sakamoto, Kanagawa (JP)

(73) Assignee: Panasonic Intellectual Property Corporation Of America, Torrance, CA (US)

( * ) Notice: Subject to any disclaimer, the term of this patent is extended or adjusted under 35 U.S.C. 154(b) by 46 days.

(21) Appl. No.: 16/613,838

(22) PCT Filed: Apr. 10, 2018

(86) PCT No.: PCT/JP2018/015017
§ 371 (c)(1),
(2) Date: Nov. 15, 2019

(87) PCT Pub. No.: WO2018/235396
PCT Pub. Date: Dec. 27, 2018

(65) Prior Publication Data
US 2020/0177207 A1  Jun. 4, 2020

Related U.S. Application Data

(60) Provisional application No. 62/527,863, filed on Jun. 30, 2017, provisional application No. 62/521,977, filed on Jun. 19, 2017.

(30) Foreign Application Priority Data

Mar. 6, 2018 (JP) .............................. JP2018-039686

(51) Int. Cl.
*H03M 13/27* (2006.01)
*H04B 7/0456* (2017.01)
(Continued)

(52) U.S. Cl.
CPC ...... *H03M 13/2764* (2013.01); *H04B 7/0482* (2013.01); *H04L 5/0007* (2013.01); *H04L 27/2605* (2013.01); *H04L 27/2636* (2013.01)

(58) Field of Classification Search
CPC ............. H03M 13/27; H03M 13/2703; H03M 13/2707; H03M 13/276; H03M 13/2764;
(Continued)

(56) References Cited

U.S. PATENT DOCUMENTS

| 7,185,241 B2 * | 2/2007 | Ko | H03M 13/2732 |
| | | | 714/701 |
| 7,408,999 B2 * | 8/2008 | Xue | H03M 13/2732 |
| | | | 375/262 |

(Continued)

FOREIGN PATENT DOCUMENTS

| JP | 2015-226098 A | 12/2015 |
| WO | 2008/082277 A2 | 7/2008 |

OTHER PUBLICATIONS

International Search Report of PCT application No. PCT/JP2018/015017 dated Jul. 17, 2018.
(Continued)

*Primary Examiner* — Kevin D Mew
(74) *Attorney, Agent, or Firm* — Seed IP Law Group LLP

(57) ABSTRACT

The interleaver 104 interleaves first to Nth code words. The OFDM modulation circuit 105 converts the interleaved first to Nth code words into OFDM signals. The transmission RF circuit 106 transmits the OFDM signals. The number of data symbols included in the first code word is less than the number of data symbols included in the second code word.
(Continued)

The interleaver 104 writes the first code word to the Nth code word in ascending order and starts reading from the second code word.

12 Claims, 46 Drawing Sheets

(51) Int. Cl.
  *H04L 5/00* (2006.01)
  *H04L 27/26* (2006.01)
(58) Field of Classification Search
  CPC . H04B 7/0482; H04L 5/0007; H04L 27/2605; H04L 27/2636
  See application file for complete search history.

(56) References Cited

U.S. PATENT DOCUMENTS

| | | | |
|---|---|---|---|
| 9,281,009 B1* | 3/2016 | Burton | G11B 20/18 |
| 9,698,826 B2* | 7/2017 | Park | H03M 13/255 |
| 2003/0070138 A1* | 4/2003 | Chow | H03M 13/2732 |
| | | | 714/796 |
| 2006/0150059 A1* | 7/2006 | Modlin | H04L 47/30 |
| | | | 714/755 |
| 2011/0235723 A1* | 9/2011 | Limberg | H03M 13/3746 |
| | | | 375/240.25 |
| 2012/0155384 A1* | 6/2012 | Choi | H04W 48/12 |
| | | | 370/328 |
| 2012/0266040 A1* | 10/2012 | Hamkins | H03M 13/6591 |
| | | | 714/752 |
| 2014/0126674 A1* | 5/2014 | Petrov | H03M 13/2792 |
| | | | 375/340 |
| 2015/0063484 A1* | 3/2015 | Kliger | H04L 27/2627 |
| | | | 375/267 |
| 2015/0082131 A1* | 3/2015 | Jeong | H04L 1/0057 |
| | | | 714/776 |
| 2016/0226786 A1* | 8/2016 | Klenner | H04L 1/0076 |
| 2018/0358987 A1* | 12/2018 | Zhang | G06F 11/00 |

OTHER PUBLICATIONS

IEEE Std 802.11(TM)—2016, IEEE Standard for Information technology—Telecommunications and information exchange between systems, Local and metropolitan area networks—Specific requirements, Part 11: Wireless LAN Medium Access Control (MAC) and Physical Layer (PHY) Specifications, Dec. 14, 2016, pp. 2436-2496.
IEEE Std 802.11(TM)—2016, IEEE Standard for Information technology—Telecommunications and information exchange between systems, Local and metropolitan area networks—Specific requirements, Part 11: Wireless LAN Medium Access Control (MAC) and Physical Layer (PHY) Specifications, Dec. 14, 2016, All Pages.
IEEE 802.11-17/0589r0, "Block Interleaver Design for SC PHY in 11ay", Apr. 11, 2017.
IEEE 802.11-17/0597r1, "30.6.1 OFDM Signal Parameters", Apr. 14, 2017.
3GPP TS 36.212 V14.2.0, "3rd Generation Partnership Project; Technical Specification Group Radio Access Network Evolved Universal Terrestrial Radio Access (E-UTRA); Multiplexing and channel coding (Release 14)", Mar. 23, 2017.
Extended European Search Report dated Jun. 16, 2020 for the related European Patent Application No. 18821011.6, 9 pages.

* cited by examiner

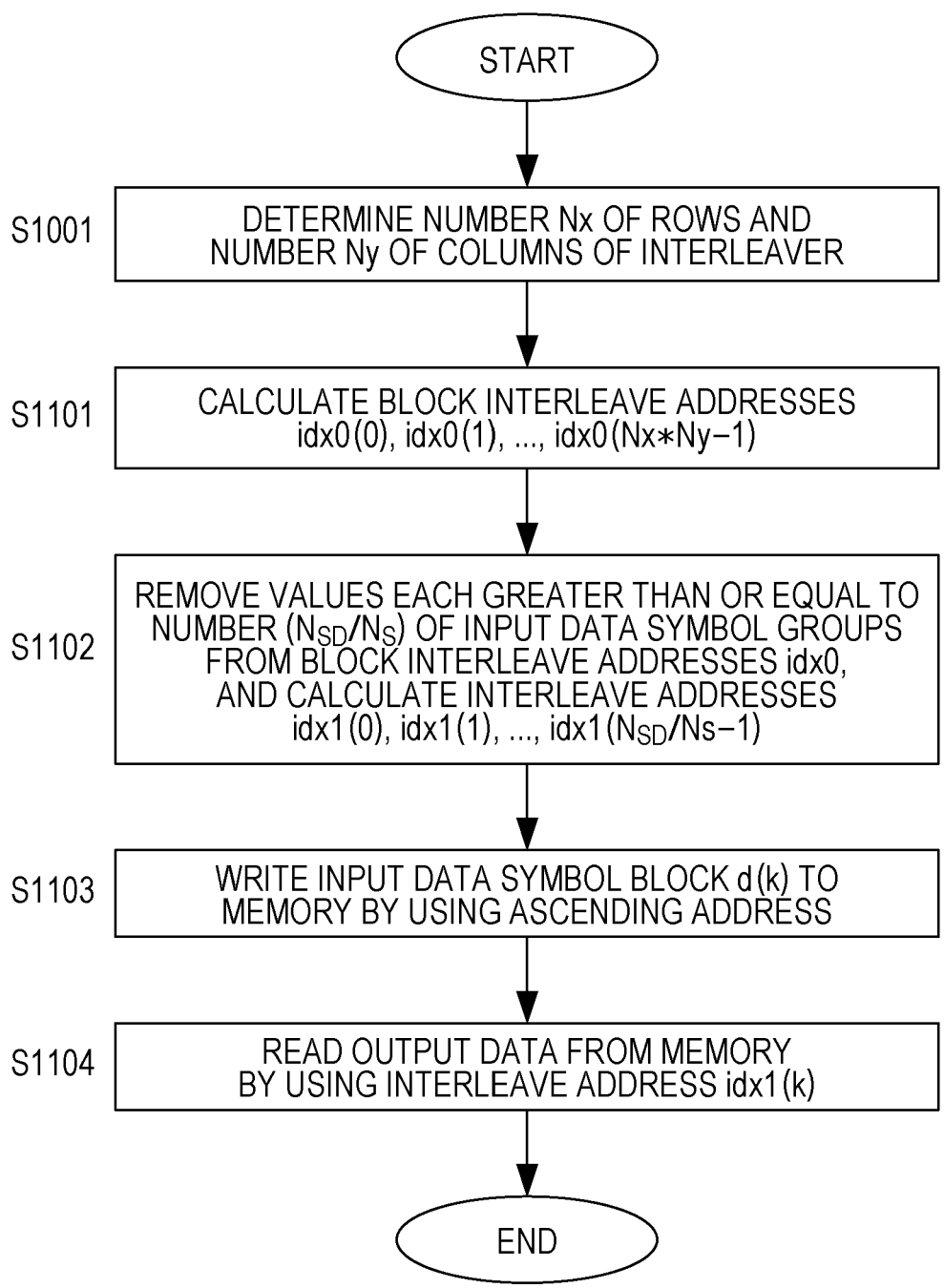

FIG. 5C

| k | idx1(k) |
|---:|---:|
| 0 | 0 |
| 1 | 21 |
| 2 | 42 |
| 3 | 63 |
| 4 | 84 |
| 5 | 1 |
| 6 | 22 |
| 7 | 43 |
| 8 | 64 |
| 9 | 85 |
| 10 | 2 |
| 11 | 23 |
| 12 | 44 |
| 13 | 65 |
| 14 | 86 |
| 15 | 3 |
| 16 | 24 |
| 17 | 45 |
| 18 | 66 |
| 19 | 87 |
| 20 | 4 |
| 21 | 25 |
| 22 | 46 |
| 23 | 67 |
| 24 | 88 |
| 25 | 5 |
| 26 | 26 |
| 27 | 47 |
| 28 | 68 |
| 29 | 89 |

| k | idx1(k) |
|---:|---:|
| 30 | 6 |
| 31 | 27 |
| 32 | 48 |
| 33 | 69 |
| 34 | 90 |
| 35 | 7 |
| 36 | 28 |
| 37 | 49 |
| 38 | 70 |
| 39 | 8 |
| 40 | 29 |
| 41 | 50 |
| 42 | 71 |
| 43 | 9 |
| 44 | 30 |
| 45 | 51 |
| 46 | 72 |
| 47 | 10 |
| 48 | 31 |
| 49 | 52 |
| 50 | 73 |
| 51 | 11 |
| 52 | 32 |
| 53 | 53 |
| 54 | 74 |
| 55 | 12 |
| 56 | 33 |
| 57 | 54 |
| 58 | 75 |
| 59 | 13 |

| k | idx1(k) |
|---:|---:|
| 60 | 34 |
| 61 | 55 |
| 62 | 76 |
| 63 | 14 |
| 64 | 35 |
| 65 | 56 |
| 66 | 77 |
| 67 | 15 |
| 68 | 36 |
| 69 | 57 |
| 70 | 78 |
| 71 | 16 |
| 72 | 37 |
| 73 | 58 |
| 74 | 79 |
| 75 | 17 |
| 76 | 38 |
| 77 | 59 |
| 78 | 80 |
| 79 | 18 |
| 80 | 39 |
| 81 | 60 |
| 82 | 81 |
| 83 | 19 |
| 84 | 40 |
| 85 | 61 |
| 86 | 82 |
| 87 | 20 |
| 88 | 41 |
| 89 | 62 |
| 90 | 83 |

FIG. 6A

| COLUMN NUMBER | 0 | 1 | 2 | 3 | 4 | 5 | 6 | 7 | 8 | 9 | 10 | 11 | 12 | 13 | 14 | 15 | 16 | 17 | 18 | 19 | 20 | |
|---|---|---|---|---|---|---|---|---|---|---|---|---|---|---|---|---|---|---|---|---|---|---|
| 0 | d(0) | d(1) | d(2) | d(3) | d(4) | d(5) | d(6) | d(7) | d(8) | d(9) | d(10) | d(11) | d(12) | d(13) | d(14) | d(15) | d(16) | d(17) | d(18) | d(19) | d(20) | CW1 |
| 1 | d(21) | d(22) | d(23) | d(24) | d(25) | d(26) | d(27) | d(28) | d(29) | d(30) | d(31) | d(32) | d(33) | d(34) | d(35) | d(36) | d(37) | d(38) | d(39) | d(40) | d(41) | CW2 |
| 2 | d(42) | d(43) | d(44) | d(45) | d(46) | d(47) | d(48) | d(49) | d(50) | d(51) | d(52) | d(53) | d(54) | d(55) | d(56) | d(57) | d(58) | d(59) | d(60) | d(61) | d(62) | CW3 |
| 3 | d(63) | d(64) | d(65) | d(66) | d(67) | d(68) | d(69) | d(70) | d(71) | d(72) | d(73) | d(74) | d(75) | d(76) | d(77) | d(78) | d(79) | d(80) | d(81) | d(82) | d(83) | CW4 |
| 4 | d(84) | d(85) | d(86) | d(87) | d(88) | d(89) | d(90) | | | | | | | | | | | | | | | |
| ROW NUMBER | | | | | | | | | | | | | | | | | | | | | | |

CW5 (7 DATA SYMBOL GROUPS IN FIRST HALF)

OFDM SYMBOL 0

| COLUMN NUMBER | 0 | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|---|
| 0 | d(0) | d(1) | d(2) | d(3) | d(4) | d(5) | d(6) | d(7) | d(8) | d(9) | d(10) | d(11) | d(12) | d(13) | d(14) | d(15) | d(16) | d(17) | d(18) | d(19) | d(20) |
| 1 | d(21) | d(22) | d(23) | d(24) | d(25) | d(26) | d(27) | d(28) | d(29) | d(30) | d(31) | d(32) | d(33) | d(34) | d(35) | d(36) | d(37) | d(38) | d(39) | d(40) | d(41) |
| 2 | d(42) | d(43) | d(44) | d(45) | d(46) | d(47) | d(48) | d(49) | d(50) | d(51) | d(52) | d(53) | d(54) | d(55) | d(56) | d(57) | d(58) | d(59) | d(60) | d(61) | d(62) |
| 3 | d(63) | d(64) | d(65) | d(66) | d(67) | d(68) | d(69) | d(70) | d(71) | d(72) | d(73) | d(74) | d(75) | d(76) | d(77) | d(78) | d(79) | d(80) | d(81) | d(82) | d(83) |
| 4 | d(84) | d(85) | d(86) | d(87) | d(88) | d(89) | d(90) | | | | | | | | | | | | | | |

CW9 (7 DATA SYMBOL GROUPS IN SECOND HALF)

Row 0: CW10, Row 1: CW11, Row 2: CW12, Row 3: CW13, Row 4: CW13

OFDM SYMBOL 2

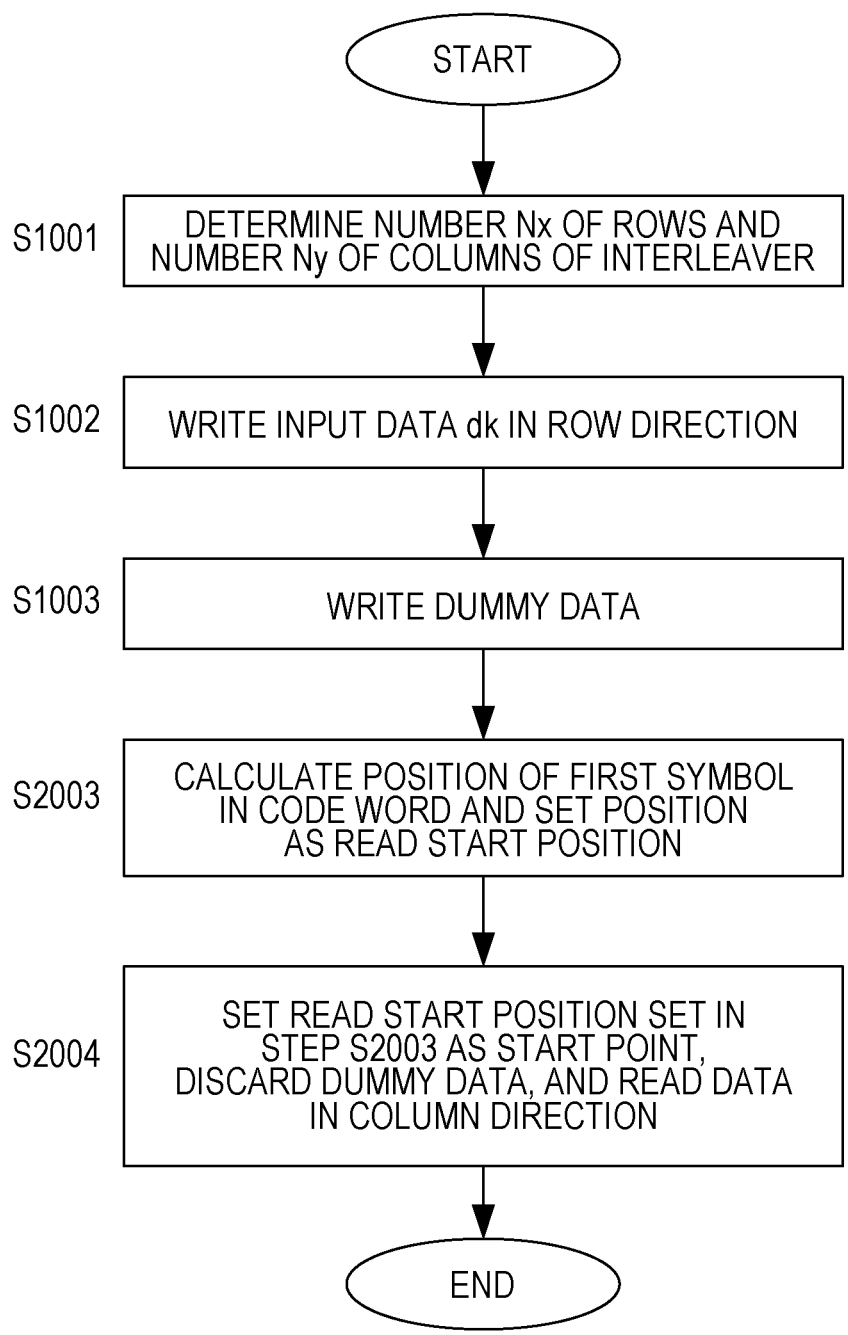

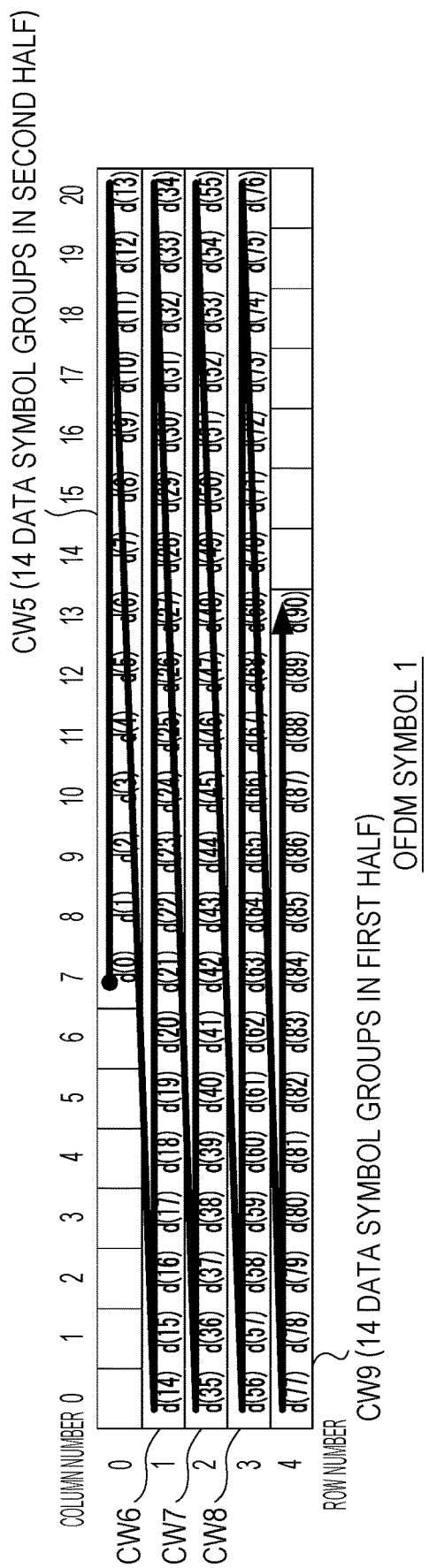

| n | idx1(n) | idx2(n,1) |
|---|---|---|
| 0 | 0 | 14 |
| 1 | 21 | 35 |
| 2 | 42 | 56 |
| 3 | 63 | 77 |
| 4 | 84 | 15 |
| 5 | 1 | 36 |
| 6 | 22 | 57 |
| 7 | 43 | 78 |
| 8 | 64 | 16 |
| 9 | 85 | 37 |
| 10 | 2 | 58 |
| 11 | 23 | 79 |
| 12 | 44 | 17 |
| 13 | 65 | 38 |
| 14 | 86 | 59 |
| 15 | 3 | 80 |
| 16 | 24 | 18 |
| 17 | 45 | 39 |
| 18 | 66 | 60 |
| 19 | 87 | 81 |
| 20 | 4 | 19 |
| 21 | 25 | 40 |
| 22 | 46 | 61 |
| 23 | 67 | 82 |
| 24 | 88 | 20 |
| 25 | 5 | 41 |
| 26 | 26 | 62 |
| 27 | 47 | 83 |
| 28 | 68 | 0 |
| 29 | 89 | 21 |
| 30 | 6 | 42 |
| 31 | 27 | 63 |
| 32 | 48 | 84 |
| 33 | 69 | 1 |
| 34 | 90 | 22 |
| 35 | 7 | 43 |
| 36 | 28 | 64 |
| 37 | 49 | 85 |
| 38 | 70 | 2 |
| 39 | 8 | 23 |
| 40 | 29 | 44 |
| 41 | 50 | 65 |
| 42 | 71 | 86 |
| 43 | 9 | 3 |
| 44 | 30 | 24 |
| 45 | 51 | 45 |
| 46 | 72 | 66 |
| 47 | 10 | 87 |
| 48 | 31 | 4 |
| 49 | 52 | 25 |
| 50 | 73 | 46 |
| 51 | 11 | 67 |
| 52 | 32 | 88 |
| 53 | 53 | 5 |
| 54 | 74 | 26 |
| 55 | 12 | 47 |
| 56 | 33 | 68 |
| 57 | 54 | 89 |
| 58 | 75 | 6 |
| 59 | 13 | 27 |
| 60 | 34 | 48 |
| 61 | 55 | 69 |
| 62 | 76 | 90 |
| 63 | 14 | 7 |
| 64 | 35 | 28 |
| 65 | 56 | 49 |
| 66 | 77 | 70 |
| 67 | 15 | 8 |
| 68 | 36 | 29 |
| 69 | 57 | 50 |
| 70 | 78 | 71 |
| 71 | 16 | 9 |
| 72 | 37 | 30 |
| 73 | 58 | 51 |
| 74 | 79 | 72 |
| 75 | 17 | 10 |
| 76 | 38 | 31 |
| 77 | 59 | 52 |
| 78 | 80 | 73 |
| 79 | 18 | 11 |
| 80 | 39 | 32 |
| 81 | 60 | 53 |
| 82 | 81 | 74 |
| 83 | 19 | 12 |
| 84 | 40 | 33 |
| 85 | 61 | 54 |
| 86 | 82 | 75 |
| 87 | 20 | 13 |
| 88 | 41 | 34 |
| 89 | 62 | 55 |
| 90 | 83 | 76 |

| n | idx3(n) | idx4(n,1) |
|---|---------|-----------|
| 0 | 0 | 28 |
| 1 | 5 | 33 |
| 2 | 10 | 38 |
| 3 | 15 | 43 |
| 4 | 20 | 48 |
| 5 | 25 | 53 |
| 6 | 30 | 58 |
| 7 | 35 | 63 |
| 8 | 39 | 67 |
| 9 | 43 | 71 |
| 10 | 47 | 75 |
| 11 | 51 | 79 |
| 12 | 55 | 83 |
| 13 | 59 | 87 |
| 14 | 63 | 0 |
| 15 | 67 | 4 |
| 16 | 71 | 8 |
| 17 | 75 | 12 |
| 18 | 79 | 16 |
| 19 | 83 | 20 |
| 20 | 87 | 24 |
| 21 | 1 | 29 |
| 22 | 6 | 34 |
| 23 | 11 | 39 |
| 24 | 16 | 44 |
| 25 | 21 | 49 |
| 26 | 26 | 54 |
| 27 | 31 | 59 |
| 28 | 36 | 64 |
| 29 | 40 | 68 |

| n | idx3(n) | idx4(n,1) |
|---|---------|-----------|
| 30 | 44 | 72 |
| 31 | 48 | 76 |
| 32 | 52 | 80 |
| 33 | 56 | 84 |
| 34 | 60 | 88 |
| 35 | 64 | 1 |
| 36 | 68 | 5 |
| 37 | 72 | 9 |
| 38 | 76 | 13 |
| 39 | 80 | 17 |
| 40 | 84 | 21 |
| 41 | 88 | 25 |
| 42 | 2 | 30 |
| 43 | 7 | 35 |
| 44 | 12 | 40 |
| 45 | 17 | 45 |
| 46 | 22 | 50 |
| 47 | 27 | 55 |
| 48 | 32 | 60 |
| 49 | 37 | 65 |
| 50 | 41 | 69 |
| 51 | 45 | 73 |
| 52 | 49 | 77 |
| 53 | 53 | 81 |
| 54 | 57 | 85 |
| 55 | 61 | 89 |
| 56 | 65 | 2 |
| 57 | 69 | 6 |
| 58 | 73 | 10 |
| 59 | 77 | 14 |

| n | idx3(n) | idx4(n,1) |
|---|---------|-----------|
| 60 | 81 | 18 |
| 61 | 85 | 22 |
| 62 | 89 | 26 |
| 63 | 3 | 31 |
| 64 | 8 | 36 |
| 65 | 13 | 41 |
| 66 | 18 | 46 |
| 67 | 23 | 51 |
| 68 | 28 | 56 |
| 69 | 33 | 61 |
| 70 | 38 | 66 |
| 71 | 42 | 70 |
| 72 | 46 | 74 |
| 73 | 50 | 78 |
| 74 | 54 | 82 |
| 75 | 58 | 86 |
| 76 | 62 | 90 |
| 77 | 66 | 3 |
| 78 | 70 | 7 |
| 79 | 74 | 11 |
| 80 | 78 | 15 |
| 81 | 82 | 19 |
| 82 | 86 | 23 |
| 83 | 90 | 27 |
| 84 | 4 | 32 |
| 85 | 9 | 37 |
| 86 | 14 | 42 |
| 87 | 19 | 47 |
| 88 | 24 | 52 |
| 89 | 29 | 57 |
| 90 | 34 | 62 |

FIG. 19

| r | k=map(r) |
|---|---|
| 0 TO 10 | −383 TO −373 |
| 11 TO 31 | −371 TO −351 |
| 32 TO 52 | −349 TO −329 |
| 53 TO 73 | −327 TO −307 |
| 74 TO 94 | −305 TO −285 |
| 95 TO 115 | −283 TO −263 |
| 116 TO 136 | −261 TO −241 |
| 137 TO 157 | −239 TO −219 |
| 158 TO 178 | −217 TO −197 |
| 179 TO 199 | −195 TO −175 |
| 200 TO 220 | −173 TO −153 |
| 221 TO 241 | −151 TO −131 |
| 242 TO 262 | −129 TO −109 |
| 263 TO 283 | −107 TO −87 |
| 284 TO 304 | −85 TO −65 |
| 305 TO 325 | −63 TO −43 |
| 326 TO 346 | −41 TO −21 |
| 347 TO 362 | −19 TO −4 |

| r | k=map(r) |
|---|---|
| 363 | −2 |
| 364 TO 368 | 2 TO 6 |
| 369 TO 384 | 8 TO 23 |
| 385 TO 405 | 25 TO 45 |
| 406 TO 426 | 47 TO 67 |
| 427 TO 447 | 69 TO 89 |
| 448 TO 468 | 91 TO 111 |
| 469 TO 489 | 113 TO 133 |
| 490 TO 510 | 135 TO 155 |
| 511 TO 531 | 157 TO 177 |
| 532 TO 552 | 179 TO 199 |
| 553 TO 573 | 201 TO 221 |
| 574 TO 594 | 223 TO 243 |
| 595 TO 615 | 245 TO 265 |
| 616 TO 636 | 267 TO 287 |
| 637 TO 657 | 289 TO 309 |
| 658 TO 678 | 311 TO 331 |
| 679 TO 699 | 333 TO 353 |
| 700 TO 720 | 355 TO 375 |
| 721 TO 727 | 377 TO 383 |

FIG. 20

TRANSMISSION APPARATUS, RECEPTION APPARATUS, TRANSMISSION METHOD, AND RECEPTION METHOD

CROSS-REFERENCE TO RELATED APPLICATIONS

This application is a U.S. national stage application of the PCT International Application No. PCT/JP2018/015017 filed on Apr. 10, 2018, which claims the benefit of foreign priority of Japanese patent application 2018-039686 filed on Mar. 6, 2018 and claims the benefit of U.S. provisional application No. 62/527,863 filed on Jun. 30, 2017 and U.S. provisional application No. 62/521,977 filed on Jun. 19, 2017, the contents all of which are incorporated herein by reference.

TECHNICAL FIELD

The present disclosure relates to a communication apparatus and a communication method.

BACKGROUND ART

IEEE 802.11 is one of wireless LAN related standards, which includes, for example, the IEEE 802.11ad standard and the IEEE 802.11ay standard (hereinafter referred to as "11ad standard" and "11ay standard", respectively) (refer to, for example, NPL 1 to 3).

If the number of data symbols included in a code word is smaller than the number of data symbols included in an OFDM (Orthogonal Frequency Division Multiplexing) symbol, an "interleaving process" is applied so that the data symbols are rearranged in the OFDM symbol. By the interleaving process, the data symbols included in the code word are distributedly allocated across a wide frequency band and, thus, the communication quality in a frequency selective channel is improved.

CITATION LIST

Non Patent Literature

NPL 1: IEEE 802.11TM-2016 pp. 2436 to 2496 Published on Dec. 14, 2016
NPL 2: IEEE 802.11-17/0589r0 Published on Apr. 11, 2017
NPL 3: IEEE 802.11-17/0597r1 Published on Apr. 25, 2017

SUMMARY OF INVENTION

Technical Problem

However, in the case where a code word is fragmented into a plurality of OFDM symbols and is allocated, an interleave pattern in which the fragmented code words are allocated in a wide frequency domain has not been sufficiently studied. Consequently, the communication quality may be deteriorated in a frequency selective channel.

One aspect of the present disclosure provides a transmission apparatus, a reception apparatus, a transmission method, and a reception method capable of performing an interleaving process so that a code word fragmented into a plurality of OFDM symbols is allocated in a wide frequency domain and, thus, increasing the communication quality in a frequency selective channel with a simple configuration.

Solution to Problem

According to an aspect of the present disclosure, a transmission apparatus includes an interleaver circuit that interleaves first to Nth code words, an OFDM modulation circuit that converts the interleaved first to Nth code words into OFDM signals, and a transmission circuit that transmits the OFDM signals. The number of data symbols included in the first code word is less than the number of data symbols included in the second code word, and the interleaver circuits writes the first code word to the Nth code word in ascending order and starts reading from the second code word.

According to an aspect of the present disclosure, a reception apparatus includes a reception circuit that receives OFDM signals including first to Nth code words interleaved by a transmission apparatus, a DFT circuit that extracts the interleaved first to Nth code words from the OFDM signals, and a deinterleaver circuit that deinterleaves the interleaved first to Nth code words. The number of data symbols included in the first code word is less than the number of data symbols included in the second code word. The interleaved first to Nth code words are written in ascending order by an interleaver circuit of the transmission apparatus, and reading is started from the second code word so that the interleaved first to Nth code words are generated.

According to an aspect of the present disclosure, a transmission method includes interleaving first to Nth code words, converting the interleaved first to Nth code words into OFDM signals, and transmitting the OFDM signals. The number of data symbols included in the first code word is less than the number of data symbols included in the second code word, and the first code word to the Nth code word are written in ascending order, and reading is started from the second code word.

According to an aspect of the present disclosure, a reception method includes receiving OFDM signals including first to Nth code words interleaved by a transmission apparatus, extracting the interleaved first to Nth code words from the OFDM signals, and deinterleaving the interleaved first to Nth code words. The number of data symbols included in the first code word is less than the number of data symbols included in the second code word. The interleaved first to Nth code words are written in ascending order by an interleaver circuit of the transmission apparatus, and reading is started from the second code word so that the interleaved first to Nth code words are generated.

It should be noted that general or specific embodiments may be implemented as a system, an apparatus, a method, an integrated circuit, a computer program, a storage medium, or any selective combination thereof.

Advantageous Effects of Invention

According to one aspect of the present disclosure, interleaving can be performed with a simple configuration such that code words fragmented into a plurality of OFDMs are allocated in a wide frequency domain, and the communication quality in a frequency selective channel can be increased.

Additional benefits and advantages of an aspect of the present disclosure will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF DRAWINGS

FIG. 4B is a flowchart illustrating an interleaving procedure according to the first embodiment.

FIG. 5C is a diagram illustrating an example of an address table according to the first embodiment.

FIG. 6A is a diagram illustrating a relationship between a two-dimensional array and a code word in OFDM symbol 0 in interleaving according to the first embodiment.

FIG. 7A is a diagram illustrating a relationship between a two-dimensional array for interleaving and a code word in OFDM symbol 1 according to the first embodiment.

FIG. 8A illustrates a relationship between a two-dimensional array and a code word in OFDM symbol 2 in interleaving according to the first embodiment.

FIG. 9A is a flowchart illustrating another interleaving procedure according to the first embodiment.

FIG. 11A is a schematic illustration of the write operation performed by the interleaver when the write start position is changed in OFDM symbol 1 according to the first embodiment.

FIG. 11B is a schematic illustration of the read operation performed by the interleaver when the write start position is changed in OFDM symbol 1 according to the first embodiment.

FIG. 12 is a schematic illustration of the read operation performed by the interleaver when the read start position is changed in OFDM symbol 2 according to the first embodiment.

FIG. 14 is a diagram illustrating an example of the values of idx1(n) and idx2(n, 1) in OFDM symbol 1 according to the first embodiment.

FIG. 17 is a diagram illustrating an example of the values of idx3(n) and idx4(n, 1) in OFDM symbol 1 according to the first embodiment.

FIG. 19 is a diagram illustrating an example of a correspondence between the ordinal value of a data subcarrier and a subcarrier number according to the first embodiment.

FIG. 20 is a schematic illustration of another example of the operation performed by the interleaver for OFDM symbol 0 according to the first embodiment.

DESCRIPTION OF EMBODIMENTS

An embodiment of the present disclosure is described in detail below with reference to the accompanying drawings.

According to the 11ay standard, LDPC (Low Density Parity Check) coding is used, and rate matching (adjustment of a code word size) is not performed. For this reason, according to the 11ay standard, the amount of calculation of coding and decoding processes per one transmission bit (the computation complexity and circuit scale) can be maintained constant and, thus, the circuit scale or the power consumption can be reduced.

However, according to the 11ay standard, one of the number of bits included in an OFDM symbol and the number of LDPC-coded bits (the size of a code word) is not a multiple or a divisor of the other. For this reason, a code word may be divided and included in different OFDM symbols and, thus, the performance (the communication quality) may be degraded depending on the interleaving method.

In addition, according to the 11ay standard, since the bandwidth is wide (for example, a maximum of 8.64 GHz), the number of subcarriers and the number of bits per OFDM symbol are large. However, to reduce the calculation amount of encoding and decoding, the number of LDPC encoded bits is small (a code word size is small). Consequently, according to the 11ay standard, a small sized code word is divided, and a problem of performance degradation due to the inability to distribute the code word in a wide range in a bandwidth easily occurs.

According to another standard, for example, according to LTE, the bandwidth is small (for example, 100 MHz), and the code word size is large (e.g., 6144 bits). For this reason, according to LTE, even when a code word is split, code word data can be dispersed in a sufficiently wide range in the bandwidth. In addition, according to LTE, a turbo code is used and, thus, rate matching (puncturing) can be performed so that the code word size matches the OFDM symbol size or the code word is distributed. As a result, the above-described problem that occurs in the 11ay standard does not occur. Note that in puncturing (a discard is made by a transmitter), encoding and decoding are performed on even bits that are not transmitted, the circuit scale and the power consumption increase.

In addition, according to another standard, for example, the 11ad standard, since the code word size is a divisor of the number of bits that can be included in an OFDM symbol, code word splitting does not occur.

Therefore, according to the present disclosure, an interleaving method is described below that is capable of, even when a code word is split into a plurality of OFDM symbols as in the 11ay standard, distributing a code word over a wide frequency domain and increasing the communication quality.

First Embodiment

Configuration of Communication Apparatus

Figure 1:
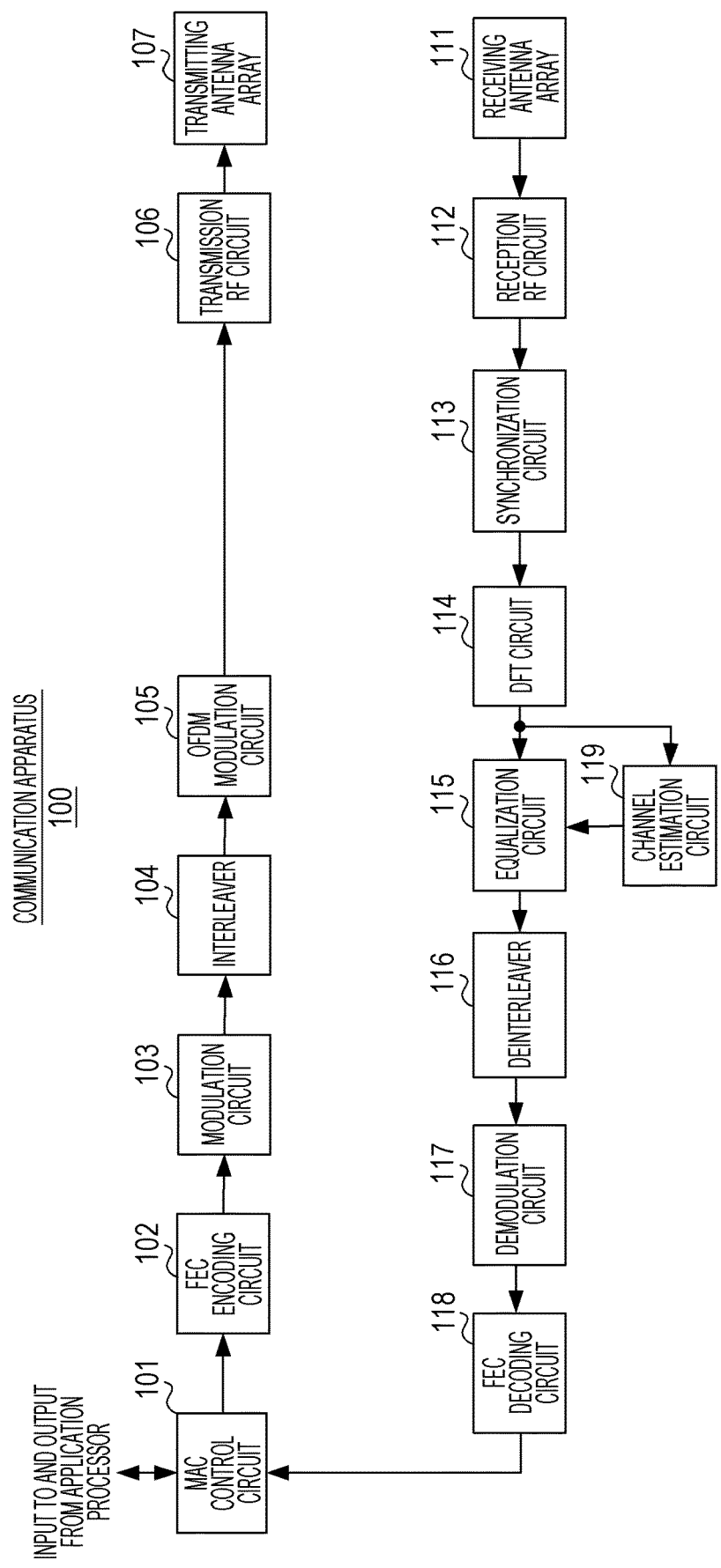
FIG. 1 is a block diagram illustrating an example of the configuration of a communication apparatus according to a first embodiment.

FIG. 1 is a diagram illustrating an example of the configuration of a communication apparatus. A communication apparatus 100 is configured to include a MAC (Medium Access Control) control circuit 101, an FEC (Forward Error Correction) encoding circuit 102, a modulation circuit 103, an interleaver 104, an OFDM modulation circuit 105, a transmission RF circuit 106, a transmission antenna array 107, and a reception antenna array 111, a reception RF circuit 112, a synchronization circuit 113, a DFT (Discrete Fourier Transform) circuit 114, an equalization circuit 115, a deinterleaver 116, a demodulation circuit 117, an FEC decoding circuit 118, and a channel estimation circuit 119.

Note that in the communication apparatus 100, the MAC control circuit 101, the FEC encoding circuit 102, the modulation circuit 103, the interleaver 104, the OFDM modulation circuit 105, the transmission RF circuit 106, and the transmission antenna array 107 constitute a transmission apparatus, for example. The reception antenna array 111, the reception RF circuit 112, the synchronization circuit 113, the DFT circuit 114, the equalization circuit 115, the deinterleaver 116, the demodulation circuit 117, the FEC decoding circuit 118, and the channel estimation circuit 119 constitute a reception apparatus, for example.

The MAC control circuit 101 generates transmission data on the basis of data input from an application processor (not illustrated) and inputs the transmission data to the FEC encoding circuit 102. In addition, the MAC control circuit 101 determines transmission parameters (for example, a radio channel to be used, the transmission data size, the number of channel bonding, the LDPC coding scheme, and the antenna directivity) and controls the FEC coding circuit 102, the modulation circuit 103, the interleaver 104, the OFDM modulation circuit 105, the transmission RF circuit 106, and the transmission antenna array 107 on the basis of the determined transmission parameters (not illustrated).

In addition, the MAC control circuit 101 determines reception parameters (for example, a radio channel to be used, the number of channel bonding, a reception power threshold, and the antenna directivity) and controls the reception antenna array 111, the reception RF circuit 112, the synchronization circuit 113, the DFT circuit 114, the equalization circuit 115, the deinterleaver 116, the demodulation circuit 117, the FEC decoding circuit 118, and the channel estimation circuit 119 on the basis of the determined reception parameters (not illustrated). The MAC control circuit 101 receives the received data from the FEC decoding circuit 118 and outputs the received data to an application processor (not illustrated).

The FEC encoding circuit 102 adds an error detection code to the transmission data and performs bit scrambling and error correction encoding on the transmission data. For example, a cyclic redundancy check (CRC) code is used as the error detection code. In bit scrambling, the FEC encoding circuit 102 generates a pseudo random sequence, an M sequence, or a Gold sequence, for example, and performs an XOR (exclusive OR) operation on the transmission data. In error correction encoding, an LDPC code, a turbo code, or a Reed Solomon code is used, for example.

The modulation circuit 103 modulates data (a bit sequence) output from the FEC encoding circuit 102 to convert the data into data symbols. Examples of a modulation method to be used include BPSK (Binary Phase Shift Keying), QPSK (Quadrature Phase Shift Keying), SQPSK (Spread QPSK), 16QAM (16-ary Quadrature Amplitude Modulation), 64QAM (64-ary QAM), and 64NUC (64-ary Non-Uniform Constellation).

The interleaver 104 changes the sequence of data symbols arranged in a data symbol block (e.g., a code word) including the plurality of data symbols in accordance with a certain rule. The interleaver 104 is described in more detail below.

The OFDM modulation circuit 105 converts a code word interleaved by the interleaver 104 into OFDM signals. More specifically, the OFDM modulation circuit 105 inserts a pilot symbol into the block of rearranged data symbols output from the interleaver 104 and determines a frequency (referred to as a "subcarrier") at which a data symbol and the pilot symbol are to be transmitted. Thereafter, the OFDM modulation circuit 105 allocates the data symbol and pilot symbol to a corresponding subcarrier (referred to as a "subcarrier mapping") and performs IDFT (Inverse Discrete Fourier Transform). Thus, the OFDM modulation circuit 105 generates a time domain signal sequence (referred to as an "OFDM symbol").

In addition, the OFDM modulation circuit 105 copies data in the second half of the OFDM symbol and adds the copy in front of the OFDM symbol (referred to as "CP (Cyclic Prefix) addition"). Furthermore, the OFDM modulation circuit 105 performs amplitude adjustment and filter application (referred to as a "window function") on the vicinity of the beginning and end of the CP-added OFDM symbol. Note that the term "CP" is also referred to as "GI (Guard Interval)".

Note that the communication apparatus 100 may further include a preamble generation circuit (not illustrated) that generates a time domain signal sequence related to a preamble, a header, and a beamforming training sequence in addition to the time domain signal sequence generated by the OFDM modulation circuit 105, a header signal generation circuit (not illustrated), and a beamforming training sequence generation circuit (not illustrated). Note that like the block of data symbols, the preamble, the header, and the beamforming training sequence may be input to the OFDM modulation circuit 105 and may be subjected to subcarrier mapping and IDFT. Thus, an OFDM symbol may be generated.

In addition, the communication apparatus 100 may include a PHY frame generation circuit (not illustrated) downstream of the OFDM modulation circuit 105. The PHY frame generation circuit combines the time domain signal sequence generated by the OFDM modulation circuit 105, a preamble, a header, and a time domain signal sequence related to a beamforming training sequence and generate a PHY frame.

The transmission RF circuit 106 converts the time domain signal sequence output from the OFDM modulation circuit 105 and the PHY frame generation circuit (not illustrated) into an analog signal by using a D/A converter. Thereafter, the transmission RF circuit 106 modulates the analog signal into a radio domain signal (for example, 60 GHz band signal) (referred to as "up-convert") and amplifies the power.

The transmission antenna array 107 includes at least one antenna element and transmits a signal output from the transmission RF circuit 106 in the form of a radio signal. For example, the transmit antenna array 107 is a phased array antenna.

The reception antenna array 111 includes at least one antenna element and receives a radio signal. An example of the reception antenna array 111 is a phased array antenna.

The reception RF circuit 112 amplifies the radio signal received by the receive antenna array 111 (AGC, Automatic Gain Control, automatic gain control is performed) and demodulates the radio domain signal into a baseband signal (referred to as "down-convert"). Thereafter, the reception RF circuit 112 converts the baseband signal into a digital signal by using an A/D converter and inputs the digital signal to the synchronization circuit 113.

The synchronization circuit 113 performs preamble signal detection, symbol timing detection, and carrier frequency offset correction on the signal output from the reception RF circuit 112.

The DFT circuit 114 extracts a plurality of interleaved code words from the OFDM symbol (the OFDM signal). More specifically, the DFT circuit 114 removes a CP from the signal output from the synchronization circuit 113 and extracts reception OFDM symbol data. In addition, the DFT circuit 114 performs DFT on the reception OFDM symbol data and converts the reception OFDM symbol data into a frequency domain reception signal.

The equalization circuit 115 uses a reception pilot symbol signal included in the frequency domain reception signal and channel information (referred to as a "channel estimation matrix") output from channel estimation circuit 119 (described later) to correct the frequency characteristics of the reception data subcarrier signal included in the frequency domain reception signal.

The equalization circuit 115 may perform reception diversity combining, maximum ratio combining, and MIMO (Multi-Input Multi-Output) signal separation processing.

The equalization circuit 115 may employ, for example, a ZF (Zero-Forcing) method, a MMSE (Minimum Mean Square Error) method, an MLD (Maximum Likelihood Detection) method, an MRC (Maximum Ratio Combining) method, or an MMSE-IRC (MMSE Interference Rejection combining) method.

The deinterleaver 116 reorders (deinterleaves) the frequency-corrected reception data subcarrier signals output from the equalization circuit 115. As a reordering rule used by the deinterleaver 116, a rule that is reverse to the reordering rule used by the interleaver 104 may be used. The deinterleaver 116 may perform processing to reorder the data symbols reordered by the interleaver 104 back into their original order. The deinterleaver 116 is described in more detail below.

The demodulation circuit 117 demodulates the signal modulated using, for example, BPSK, QPSK, SQPSK, 16QAM, 64QAM, or 64NUC and converts the signal into a bit data sequence.

The FEC decoding circuit 118 performs error correction decoding (for example, by using an LDPC decoder or a turbo decoder) and descrambling (inverse scrambling) processing on the bit data sequence. The FEC decoding circuit 118 performs error correction decoding and descrambling and outputs the obtained data to the MAC control circuit 101.

The channel estimation circuit 119 calculates a channel estimation matrix by using the received preamble signal and the pilot subcarrier signal.

Note that the communication apparatus 100 may include a header reception circuit (not illustrated) that receives a header signal and performs equalization, demodulation, and FEC decoding.

Operation Performed by Interleaver

Operation Example 1

The operation performed by the interleaver 104 is described below with reference to FIG. 2. In this example, the LDPC code word size (denoted as "$L_{CW}$") is 672 bits, the modulation scheme is 16QAM, the number of bits per symbol (denoted as "$N_{CBPS}$") is 4, and the number of data subcarriers (denoted as "$N_{SD}$") is 336 subcarriers.

The number of data symbols per code word is calculated by $L_{CW}/N_{CBPS}$. In the example illustrated in FIG. 2, the number of data symbols per code word is 168 symbols. That is, in FIG. 2, the number of data subcarriers ($N_{SD}$=336) is a multiple (2 times) of the number of data symbols per code word ($L_{CW}/N_{CBPS}$=168). Accordingly, each time a data symbol corresponding to two code words (a total of 336 symbols) is input, the interleaver 104 rearranges the data and outputs the data for 336 subcarriers (corresponding to one OFDM symbol).

Figure 2:
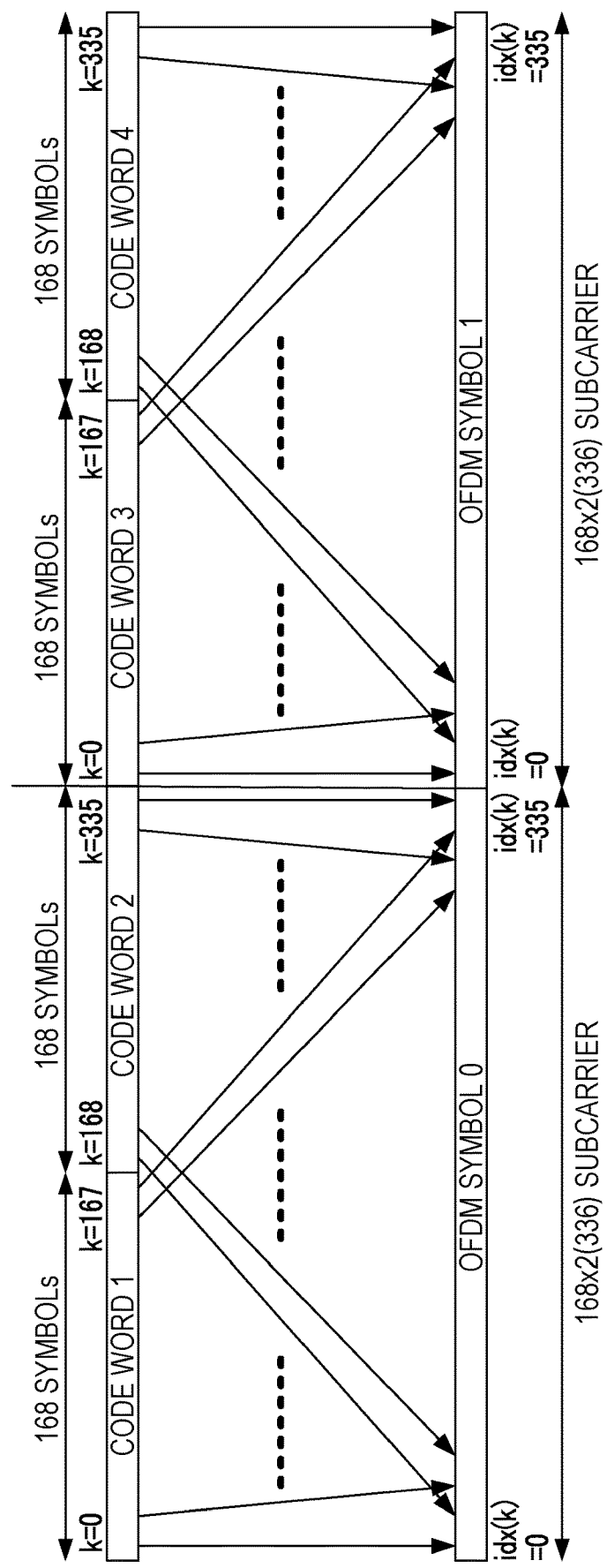
FIG. 2 illustrates an example of the operation performed by an interleaver according to the first embodiment.

In FIG. 2, the interleaver 104 rearranges data symbols as follows. First, the interleaver 104 allocates a first data symbol of a first code word (referred to as "code word 1", the same applies hereinafter) to a first subcarrier (for example, a data subcarrier with the lowest frequency). Subsequently, the interleaver 104 allocates a first data symbol of the second code word (referred to as "code word 2", the same applies hereinafter) to a second subcarrier (for example, a data subcarrier with the second lowest frequency, following the first subcarrier).

Let d(0) to d(167) denote data symbols of code word 1, and let d(168) to d(335) denote data symbols of code word 2. Then, the interleaver 104 allocates data symbol d(idx(k)) to a subcarrier number k. A data symbol idx(k) is calculated by the following Eq. 1:

[Math. 1]

$$idx(k) = (k \bmod 2) \times 168 + \lfloor k/2 \rfloor \quad \text{Eq. 1}$$

In Eq. 1, "mod" in the first term represents a remainder operation, and the second term is a floor function (the second term in Eq. 1 can be replaced with a floor function: floor(x), which obtains the largest integer that does not exceed x).

FIG. 2 illustrates the case where the number of data subcarriers ($N_{SD}$) is twice the number of data symbols per code word ($L_{CW}/N_{CBPS}$). As in FIG. 2, if the number of data subcarriers ($N_{SD}$) is a multiple of the number of data symbols per code word ($L_{CW}/N_{CBPS}$), the interleaver 104 allocates data symbols d(idx(k)) to subcarrier number k. The data symbol idx(k) is calculated by the following Eq. 2:

[Math. 2]

$$idx(k) = (k \bmod (N_{SD}/(L_{CW}/N_{CBPS}))) \times L_{CW}/N_{CBPS} + \lfloor k/(N_{SD}/(L_{CW}/N_{CBPS})) \rfloor, k=0,1,\ldots,N_{SD}-1 \quad \text{Eq. 2}$$

Eq. 2 is replaced by Eq. 3 which uses variables $N_x$ and $N_y$. Note that the variables $N_x$ and $N_y$ are determined by Eq. 4 and Eq. 5, respectively:

[Math. 3]

$$idx(k) = (k \bmod N_x) \times N_y + \lfloor k/N_x \rfloor, k=0,1,\ldots,N_{SD}-1 \quad \text{Eq. 3}$$

[Math. 4]

$$N_x = N_{SD}/(L_{CW}/N_{CBPS}) = N_{SD} \times N_{CBPS}/L_{CW} \quad \text{Eq. 4}$$

[Math. 5]

$$N_y = L_{CW}/N_{CBPS} = N_{SD}/N_x \quad \text{Eq. 5}$$

In addition, FIG. 2 and Eq. 1, Eq. 2, and Eq. 3 describe the interleaver 104 that sequentially takes out one data symbol for each of code words and starts allocating the data symbol at the beginning of the subcarrier (idx(k)=0). However, the interleaver 104 may extract $N_s$ data symbols (referred to as a "data symbol group") for each of the code words and may start allocating the data symbols at the beginning of the subcarrier (idx(k)=0) (that is, the interleaver 104 may process $N_S$ symbols at a time). For example, $N_S$ may be 8 or may be another value.

Note that the interleaver 104 may hold the sequence of data symbols in the data symbol group before and after the interleaving process. Furthermore, the interleaver 104 may change the sequence of data symbols in the data symbol group according to a certain rule before and after the interleaving process.

If the interleaver 104 processes $N_S$ symbols at a time, the interleaver 104 allocates data symbol d(idx(k)) to the subcarrier number k. idx(k) is calculated by the following Eq. 6, Eq. 7, Eq. 8, and Eq. 9:

[Math. 6]

$$idx(k) = idx0(\lfloor k/N_S \rfloor) \times N_S + (k \bmod N_S), k=0,1,\ldots,N_{SD}-1 \quad \text{Eq. 6}$$

[Math. 7]

$$idx0(i) = (i \bmod N_x) \times N_y + \lfloor i/N_x \rfloor, i=0,1,\ldots,N_{SD}/N_S-1 \quad \text{Eq. 7}$$

[Math. 8]

$$N_x = N_{SD}/(L_{CW}/N_{CBPS}) = N_{SD} \times N_{CBPS}/L_{CW} \quad \text{Eq. 8}$$

[Math. 9]

$$N_y = L_{CW}/N_{CBPS}/N_S = N_{SD}/N_S/N_x \quad \text{Eq. 9}$$

The difference between Eq. 7 and Eq. 3 is that the value of $N_y$ used in Eq. 7 is $1/N_S$ of $N_y$ used in Eq. 3 (refer to Eq. 9). When Eq. 6 is used, the interleaver 104 can transfer (e.g., write to a memory) $N_S$ data symbols in one go. In addition, when Eq. 6 is used, the interleaver 104 can calculate one interleave address for every $N_S$ data symbols. Furthermore, when Eq. 6 is used, the values of $N_x$ and $N_y$ are small. Accordingly, Eq. 6 can be easily calculated. As a result, the circuit scale can be reduced, and the processing speed (throughput) of the circuit can be increased.

Eq. 6 may be replaced by Eq. 10 which uses variables i and j. Eq. 11 represents the relationship among i, j and k.

[Math. 10]

$$idx(N_S \times i + j) = idx0(i) \times N_S + j \quad \text{Eq. 10}$$

[Math. 11]

$$i=0,1,\ldots,N_x, j=0,1,\ldots,N_y, k=N_S \times i + j \quad \text{Eq. 11}$$

Operation Example 2

Figure 3:
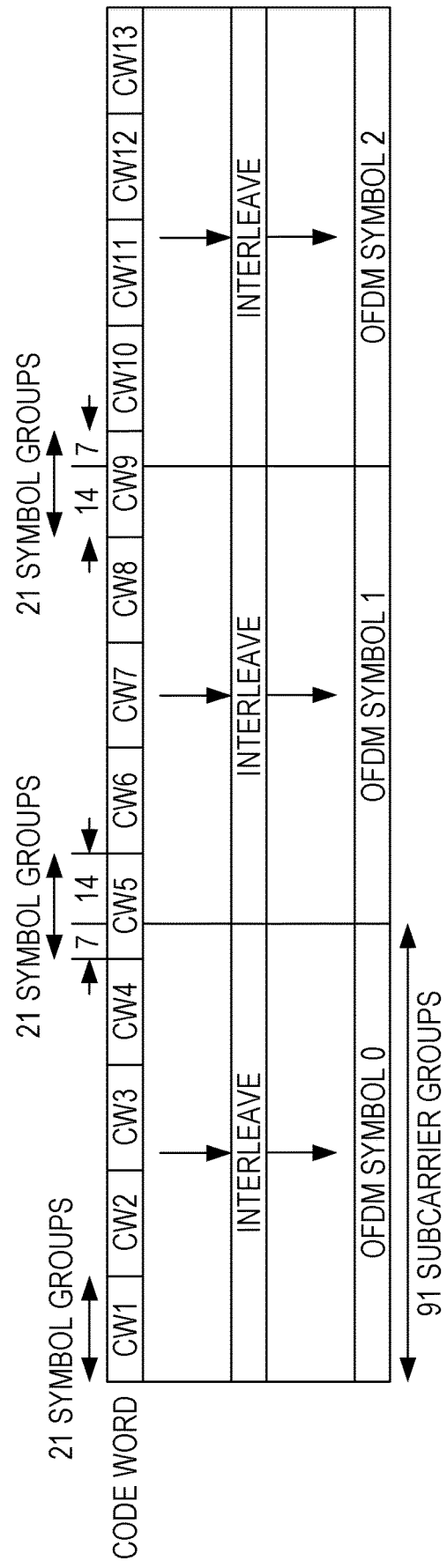
FIG. 3 is a diagram illustrating another example of the operation performed by the interleaver according to the first embodiment.

FIG. 3 illustrates another example illustrating the operation performed by the interleaver 104. In FIG. 3, the LDPC code word size (denoted as $L_{CW}$) is 672 bits, the modulation scheme is 16QAM, the number of bits per symbol (denoted as $N_{CBPS}$) is 4, the number of data subcarriers (denoted as $N_{SD}$) is 728 subcarriers, and the unit of processing ($N_S$) is 8 symbols. Furthermore, CW represents a code word.

In addition, $N_S$ data symbols are referred to as a "data symbol group", and $N_S$ subcarriers are referred to as a "subcarrier group". In FIG. 3, one code word includes 168 (=$L_{CW}/N_{CBPS}$) data symbols. Accordingly, one code word includes 21 (=$L_{CW}/N_{CBPS}/N_S$) data symbol groups. In addition, in FIG. 3, one OFDM symbol includes 728 (=$N_{SD}$) data subcarriers. Accordingly, one OFDM symbol includes 91 (=$N_{SD}/N_S$) subcarrier groups.

Unlike FIG. 2, in FIG. 3, the number of data subcarriers is not a multiple of the number of symbols per code word. In this case, the interleaver 104 calculates $N_x$ by using the following Eq. 12, instead of Eq. 8:

[Math. 12]

$$N_x = \lceil N_{SD}/(L_{CW}/N_{CBPS}) \rceil \quad \text{Eq. 12}$$

The right side of Eq. 12 represents a ceiling function (the right side of Eq. 12 can be also expressed by a ceiling function: ceiling(x), which obtains the smallest integer greater than or equal to x).

Since unlike Eq. 8, a ceiling function is added to Eq. 12, $N_x$ is an integer even when $N_{SD}$ is indivisible by $L_{CW}/N_{CBPS}$.

Figure 4A:
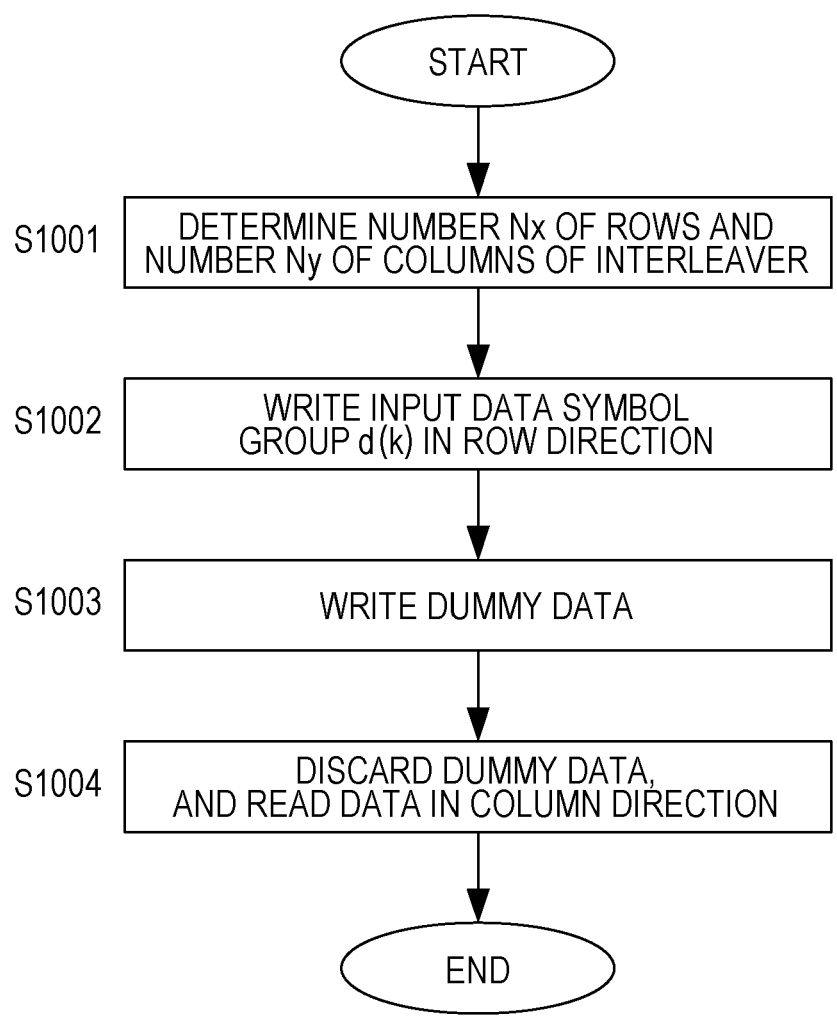
FIG. 4A is a flowchart illustrating an interleaving procedure according to the first embodiment.
Figure 4C:
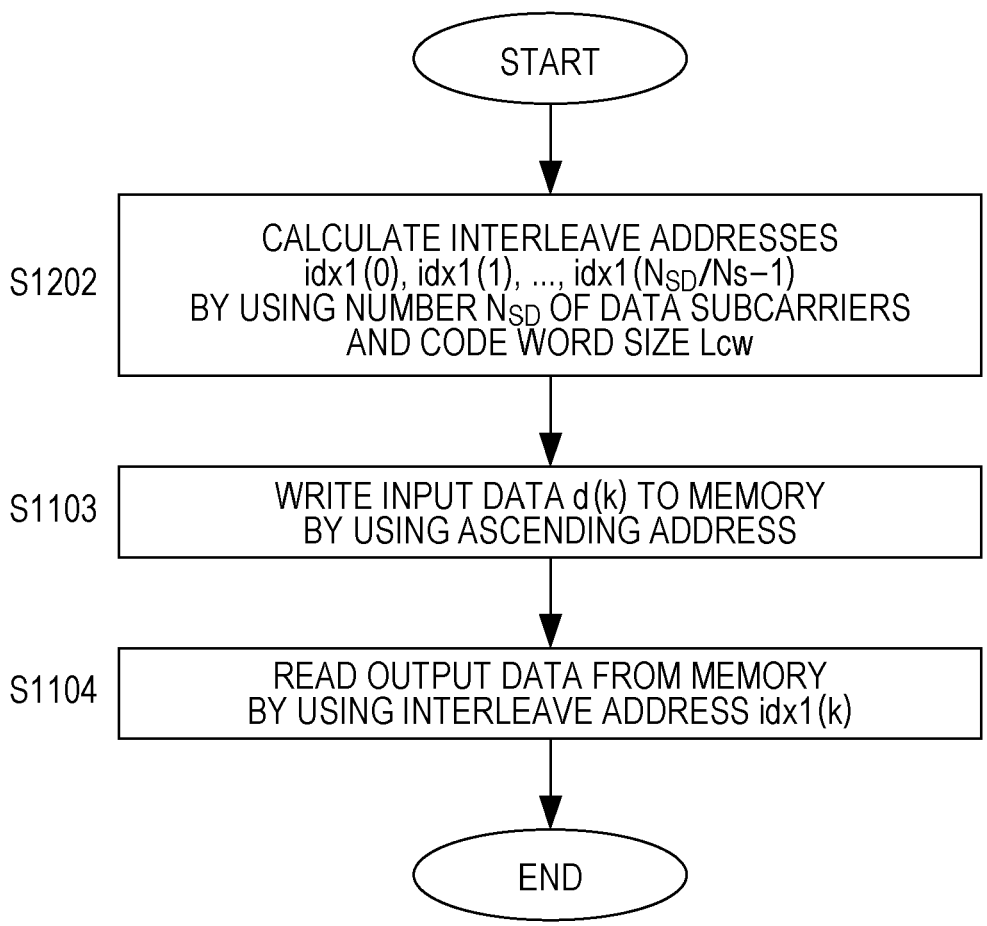
FIG. 4C is a flowchart illustrating an interleaving procedure according to the first embodiment.

FIG. 4A, FIG. 4B, and FIG. 4C are examples of the flowchart illustrating the procedure for interleaving performed by the interleaver 104 according to the present embodiment. The interleaving procedure is schematically described by using a two-dimensional array (described later).

FIG. 4A illustrates a method for implementing a particular procedure using a two-dimensional array. In addition, FIG. 4B illustrates a modification of the method illustrated in FIG. 4A. The method illustrated in FIG. 4B is suitable for implementing a procedure using a one-dimensional memory (for example, a RAM) instead of a two-dimensional array. FIG. 4C illustrates a method for calculating the interleave address in FIG. 4B in advance to reduce the circuit scale.

Figure 5A:
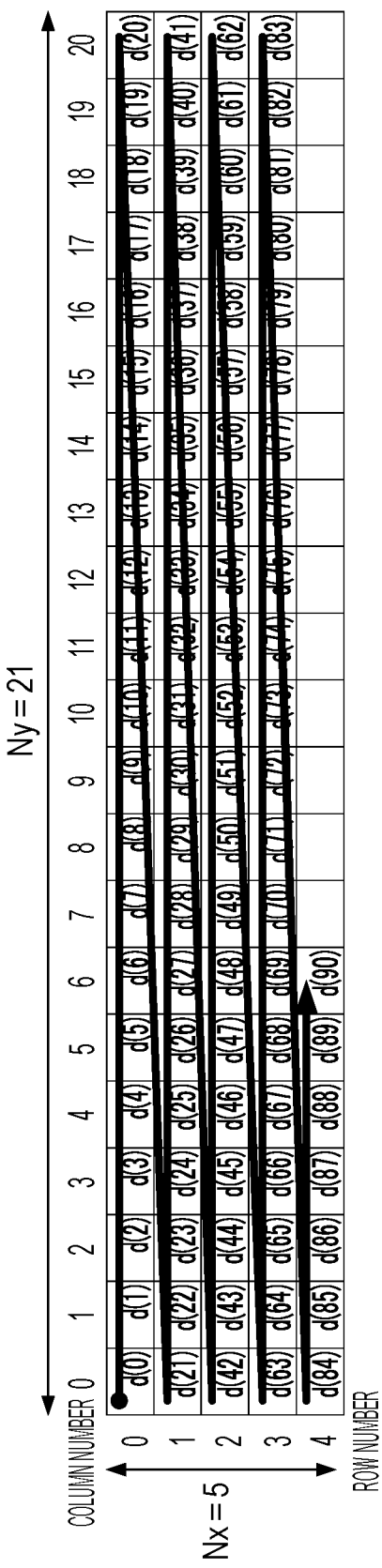
FIG. 5A is a schematic illustration of a write operation performed by the interleaver according to the first embodiment.
Figure 5B:
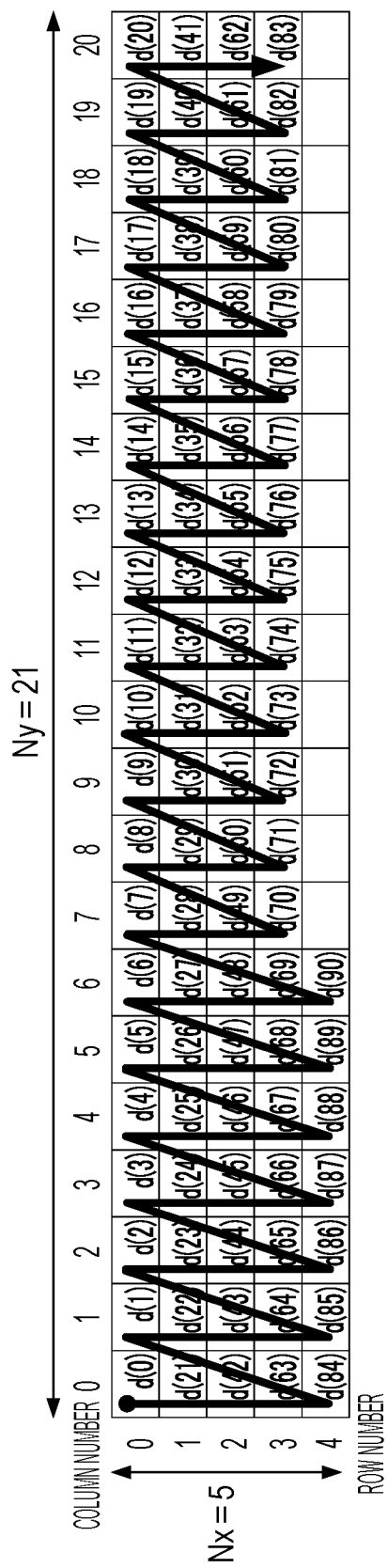
FIG. 5B is a schematic illustration of a read operation performed by the interleaver according to the first embodiment.

FIG. 4A is a flowchart illustrating the procedure for an interleaving operation performed by the interleaver 104 that uses $N_x$ and $N_y$ calculated by using Eq. 12 and Eq. 9. FIGS. 5A and 5B are schematic illustrations of the operation performed by the interleaver 104 illustrated in FIG. 4A.

Note that in FIGS. 5A and 5B, d(k) represents the kth data symbol group (k is an integer greater than or equal to 0 and less than or equal to $L_{SD}/N_S-1$). When the h-th data symbol is represented as c(h) (h is an integer greater than or equal to 0 and less than or equal to $L_{SD}/N_S-1$), a sequence of data symbols represented by d(k) includes {c(k×$N_S$), c(k×$N_S$+1), c(k×$N_S$+2), ..., c(k×$N_S$+$N_S$-2), c(k×$N_S$+$N_S$-1)}.

In step S1001 illustrated in FIG. 4A, the interleaver 104 calculates (determines) the values of $N_x$ and $N_y$ by using Eq. 12 and Eq. 9. FIGS. 5A and 5B illustrate the operation performed by the interleaver 104 illustrated in FIG. 4A and using a two-dimensional array of $N_x$ rows and $N_y$ columns. Therefore, $N_x$ is called the "number of rows" in the two-dimensional array, and $N_y$ is called the "number of columns" in the two-dimensional array. The interleaver 104 may implement a two dimensional array by using a memory or a register array. That is, the interleaver 104 has a memory size of $N_x \times N_y$.

In step S1002, the interleaver 104 writes data symbol group d(k) into the two-dimensional array in the row direction of the two-dimensional array (refer to FIG. 5A). The interleaver 104 writes Ny data symbol groups d(0) to d(Ny−1) to the row of the row number 0 of the two-dimensional array and writes Ny data symbol groups d(Ny) to d(2Ny−1) to the row of the row number 1 of the two-dimensional array. In the same manner, the interleaver 104 writes data symbols to each of the other rows. The interleaver 104 writes data symbol groups d((Nx−1)×Ny) through d(NSD/NS−1) to the row of the row number Nx−1 (the last row, the row number 4 in FIG. 5A). At this time, the number of the data symbol groups is less than Ny.

In step S1003, the interleaver 104 writes dummy data to the remaining elements of the last row. For example, when the data symbol is an 8-bit binary number, a negative minimum value, such as 1000_0000 (−128 in decimal), may be used as dummy data. Note that the interleaver 104 may leave the remaining elements in the last row empty, instead of writing the dummy data.

In step S1004, the interleaver 104 discards the dummy data and reads out the data symbol group d(k) in the column direction of the two-dimensional array. In FIG. 5B, the sequence of data symbol groups read by interleaver 104 is, for example, {d(0), d(21), d(42), d(63), d(84), d(1), d(22), d(43), d(64), d(85), d(2), ..., d(81), d(19), d(40), d(61), d(82), d(20), d(41), d(62), d(83)}.

FIG. 4B is a flowchart illustrating another procedure for an interleaving operation performed by the interleaver 104 in FIG. 3. In FIG. 4B, a procedure that differs from in FIG. 4A is used. However, a similar data symbol sequence is output. Note that in FIG. 4B, the same operations as in FIG. 4A are denoted by the same reference numerals.

In step S1001 illustrated in FIG. 4B, as in step S1001 illustrated in FIG. 4A, the interleaver 104 calculates (determines) the number of rows $N_x$ and the number of columns $N_y$ by using Eq. 12 and Eq. 9.

In step S1101, the interleaver 104 calculates a block interleave address idx0(i) (i is an integer greater than or equal to 0 and less than or equal to $N_x \times N_y - 1$) by using the following Eq. 13A:

[Math. 13]

$$idx0(i) = (i \bmod N_x) \times N_y + \lfloor i/N_x \rfloor, i=0,1,\ldots,N_x \times N_y - 1 \quad \text{Eq. 13A}$$

Eq. 13A is a calculus equation similar to Eq. 7. However, the range of the value of index i is different. The value of index i is greater than or equal to 0 and less than or equal to $N_x \times N_y - 1$, instead of a value greater than or equal to 0 and less than or equal to $N_{SD}/N_S - 1$.

In step S1102, the interleaver 104 removes, from the sequence of block interleaving addresses {idx0(0), idx0(1), ..., idx0($N_x \times N_y - 2$), idx0($N_x \times N_y - 1$)} calculated in step S1101, values each greater than or equal to the number of data symbol groups ($N_{SD}/N_S$) (that is, the block interleave address idx0(i) greater than or equal to the index i=$N_{SD}/N_S$). Thus, the interleaver 104 generates the sequence of interleave addresses {idx1(0), idx1(1), ..., idx1($N_{SD}/N_S-2$), idx1($N_{SD}/N_S-1$)}.

In step S1103, the interleaver 104 writes the data symbol group d(k) to a memory (not illustrated) by using the ascending address. The interleaver 104 writes the data symbol group d(k) to the memory at address k.

In step S1104, the interleaver 104 reads a data symbol group from the memory by using the interleave address idx1(k) generated in step S1102. For example, the interleaver 104 sets the read address to the value of idx1(0), reads the data symbol group from the memory, and sets the data symbol group as the first data of the subcarrier group. That is, the data symbol group (d(idx1(k)) stored in the memory at the address idx1(k) is set at the position of the subcarrier group number k.

In FIG. 4B, the sequence of data symbol groups read by the interleaver 104 is, for example, {d(idx1(0)), d(idx1(1)), d(idx1(2)), ..., d(idx1(k)), ..., d(idx1($N_{SD}/N_S-2$)), d(idx1($N_{SD}/N_S-1$))}.

FIG. 4C is a flowchart illustrating another procedure for the interleaving operation performed by the interleaver 104 in FIG. 3. In FIG. 4C, a procedure that differs from the procedure in FIGS. 4A and 4B is employed. However, a similar data symbol sequence is output. Note that in FIG. 4C, the same operations as in FIG. 4B are denoted by the same reference numerals.

In step S1202, the interleaver 104 calculates an interleave address idx1(k) from the number of data subcarriers $N_{SD}$ and the code word size $L_{CW}$. The interleaver 104 may calculate the interleave address idx1(k) by using a procedure the same as in steps S1001 to S1102 illustrated in FIG. 4B.

In addition, the interleaver 104 may calculate the interleave address idx1(k) in advance for each of combinations of the number of data subcarriers $N_{SD}$ and the code word size $L_{CW}$ and store the interleave addresses idx1(k) in the form of a table (hereinafter referred to as an "address table"). The address table may be stored in, for example, a ROM (Read Only Memory), a RAM (Random Access Memory), or a register.

FIG. 5C is a table denoting an example of the address table. The address table illustrated in FIG. 5C is used when the number of data symbol groups $N_{SD}/N_S$ is 91 and the code word size $L_{CW}$ is 672.

According to the address table illustrated in FIG. 5C, as an example, the value of idx1(k) is 0 when the value of k is 0, and the value of idx1(k) is 21 when the value of k is 1.

In FIG. 4C, steps S1103 and S1104 are the same as those in FIG. 4B.

In FIG. 4C, the sequence of data symbol groups read by the interleaver 104 is, for example, {d(idx1(0)), d(idx1(1)), d(idx1(2)), . . . , d(idx1($N_{SD}/N_S$−2)), d(idx1($N_{SD}/N_S$−1))}. Here, according to the address table illustrated in FIG. 5C, since the values of idx1(0) to idx1($N_{SD}/N_S$−1) are determined, the sequence of data symbol groups read by the interleaver 104 is {d(0), d(21), d(42), . . . , d(62), d(83))}, for example. That is, the sequence of data symbol groups is similar to the sequence of data symbol groups obtained through the procedure illustrated in FIG. 4A.

FIG. 6A illustrates the relationship between the two-dimensional array (write and read) illustrated in FIGS. 5A and 5B and the code word (CW) in the case where the data symbol groups corresponding to the OFDM symbol number 0 (OFDM symbol 0) illustrated in FIG. 3 are interleaved.

In FIG. 6A, data symbol groups of code word 1 (CW1) are set in row 0 of the two-dimensional array. In the same manner, data symbol groups of code word j+1 (j is an integer greater than or equal to 0 and less than or equal to $N_x$−1) is set in a row number j of the two-dimensional array. In some cases, for the last row (the row number $N_x$−1), the entire row is not filled with the data symbol groups. Some of the data symbol groups of the code word $N_x$ (code word 5 (CW5) in FIG. 6A) may be included in the last row of OFDM symbol 0, and the remaining data symbol groups of code word 5 (CW5) may be included in the top row of the next OFDM symbol 1. The data allocation method for OFDM symbol 1 is described below (refer to FIG. 7A).

In FIG. 6A, the data symbol groups of different code words are set in different rows. Consequently, when the interleaver 104 reads out the data in the column direction (refer to FIG. 5B, step S1004 in FIG. 4A, and step S1104 in FIG. 4B and FIG. 4C), two consecutive data symbol groups are data symbol groups included in different code words.

Therefore, for example, if degradation of the signal quality occurs in a continuous frequency bands (a certain frequency band narrower than the transmission band) due to multipath propagation in the communication path, data symbol groups with degraded quality are dispersed into a plurality of code words. As a result, the quality among code words can be made the same, and degradation of the packet error rate can be prevented. That is, since the interleaver 104 can prevent degradation of the quality of a data symbol group included in a specific code word, the error rate after error correction can be improved.

In addition, according to the allocation illustrated in FIG. 6A and the address table illustrated in FIG. 5C, the ordinal positions (k) of the data symbol groups of code word 1 after readout are 0, 5, 10, 15, 20, 25, 30, 35, 39, 43, 47, 51, 55, 59, 63, 67, 71, 75, 79, 83, and 87. Note that "k=0" corresponds to a low-frequency data subcarrier, and "k=90" corresponds to a high-frequency data subcarrier.

Figure 6B:
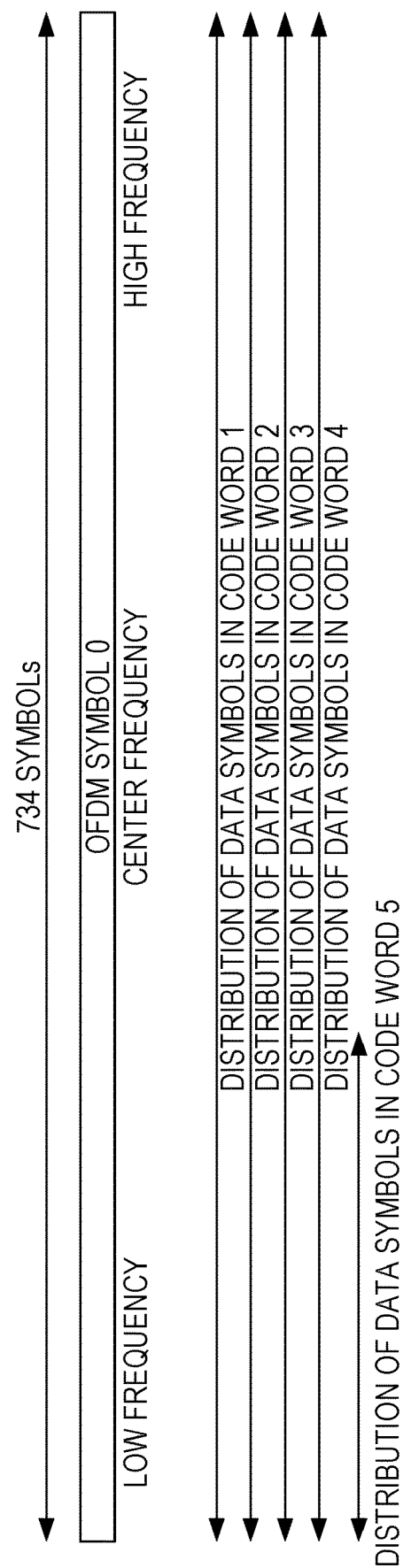
FIG. 6B is a diagram illustrating the distribution of data symbols in each of code words in OFDM symbol 0 according to the first embodiment.

FIG. 6B is a diagram illustrating the distribution of data symbols in each of the code words in the frequency domain of OFDM symbol number 0 (OFDM symbol 0). In the case of the allocation illustrated in FIG. 6A, the interleaver 104 can widely distribute data symbols of code word 1, code word 2, code word 3, and code word 4 among the low-frequency to high-frequency data subcarriers.

As described above, the interleaver 104 can widely distribute data symbol groups included in each of the code words among low-frequency to high-frequency data subcarrier. In this manner, for example, when there is a difference in reception quality among frequencies due to multipath propagation in the communication path, degradation of the quality that occurs in the data symbol groups included in a specific code word can be prevented. As a result, the error rate after error correction can be improved.

Figure 7A:
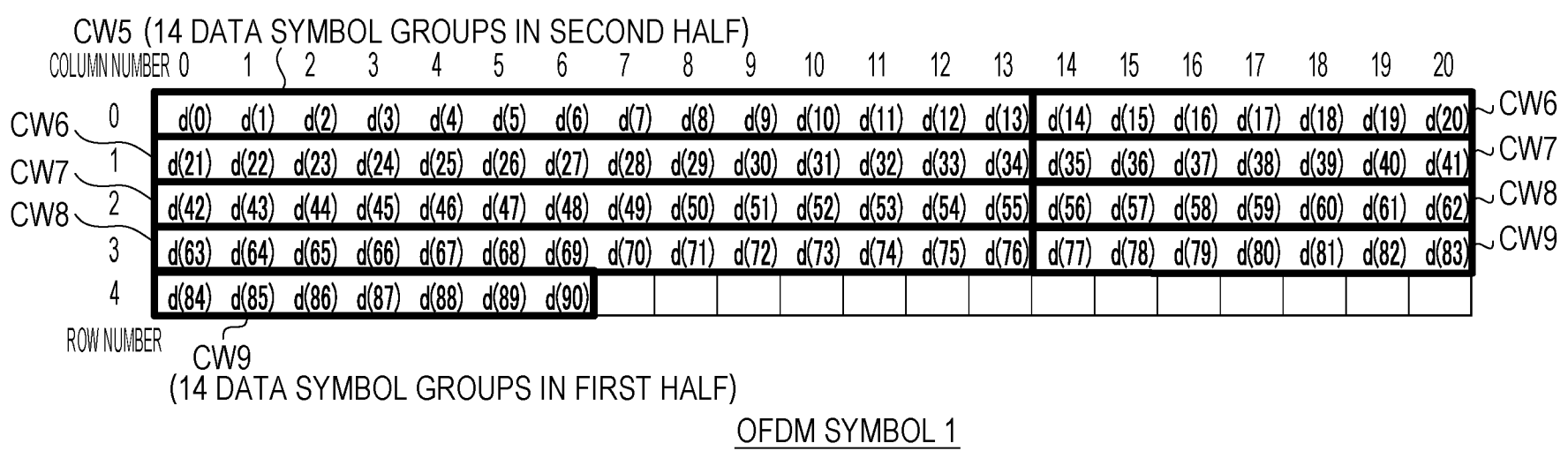

Subsequently, FIG. 7A illustrates the relationship between the two-dimensional array (write and read) illustrated in FIGS. 5A and 5B and a code word (CW) in the case where the data symbol groups corresponding to the OFDM symbol number 1 (OFDM symbol 1) illustrated in FIG. 3 are interleaved.

In FIG. 7A, the interleaver 104 sets, in row number 0, the remaining data symbol groups of code word 5 (CW5) which are not included in OFDM symbol 0. If the number of the data symbol groups of CW5 set in row number 0 is smaller than the size of row number 0 (the number of columns $N_y$), the interleaver 104 sequentially sets the symbol groups of CW6, starting from the first one, in the remaining elements of row number 0 (from d(14) to d(20) in FIG. 7A). The interleaver 104 writes the remaining data symbol groups of CW6 not written to row number 0 into row number 1, starting from the beginning of the row.

In the same manner, the interleaver 104 starts writing the data symbol groups of each of the code words to a row at a middle point (for example, the column with column number 14, that is, d(14)) and continues to write the data symbol groups to the next row until a column number (for example, 13) immediately preceding the column number of the write start column is reached. In FIG. 7A, the interleaver 104 writes 14 data symbol groups in the first half of the code word (for example, CW9) into the row immediately preceding the last row and the last row and writes the remaining 7 data symbol groups in the second half of the code word into the next OFDM symbol (for example, OFDM symbol 2).

Figure 7B:
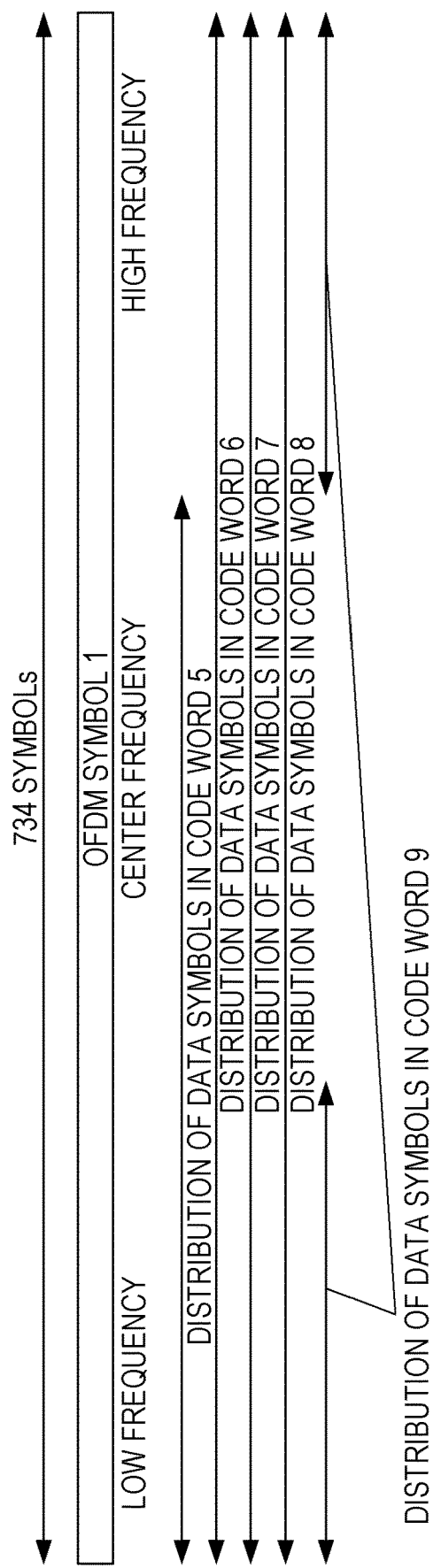
FIG. 7B is a diagram illustrating the distribution of data symbols in each of code words in OFDM symbol 1 according to the first embodiment.

FIG. 7B is a diagram illustrating a distribution of data symbols of each of code words in OFDM symbol 1 in the frequency domain. Since the interleaver 104 starts reading from d(0) in FIG. 7A, the interleaver 104 can widely distribute data symbols of code word 6, code word 7, and code word 8 among low-frequency to high-frequency data subcarriers and allocate the data symbols.

As described above, the interleaver 104 can widely distribute the data symbol groups included in each of the code words among low-frequency to high-frequency data subcarriers. In this manner, when, for example, there is a difference in reception quality among frequencies due to multipath propagation in the communication path, degradation of the quality that occurs in the data symbol groups included in a specific code word can be prevented. As a result, the error rate after error correction can be improved.

Subsequently, FIG. 8A illustrates the relationship between the two-dimensional array (write and read) illustrated in FIGS. 5A and 5B and the code word (CW) in the case where the data symbol groups corresponding to the OFDM symbol number 2 (OFDM symbol 2) illustrated in FIG. 3 are interleaved.

As in FIG. 7A, in FIG. 8A, the interleaver 104 starts writing the remaining 7 data symbol groups in the second half of the last code word (CW9) included in the previous OFDM symbol (OFDM symbol 1) and sequentially writes the code words. Thus, the interleaver 104 can widely distribute data symbols included in each of the code words among low-frequency to high-frequency data subcarriers and allocate the data symbols.

Note that in FIG. 7A (OFDM symbol 1), the first data symbol group of each of the code words is set in column number 14. This is because the number of remaining data symbol groups of the last code word (CW5) in the previous OFDM symbol (OFDM symbol 0) is 14. In addition, in FIG. 8A (OFDM symbol 2), the first data symbol group of each of the code words is set in column number 7. This is because the number of remaining data symbol groups of the last code word (CW9) in the previous OFDM symbol (OFDM symbol 1) is 7. Furthermore, in FIG. 6A (OFDM symbol 0), the first data symbol group of each of the code words is set in column number 0. This is because the number of remaining data symbol groups of the last code word in the previous OFDM symbol (not illustrated) is 0.

Figure 8B:
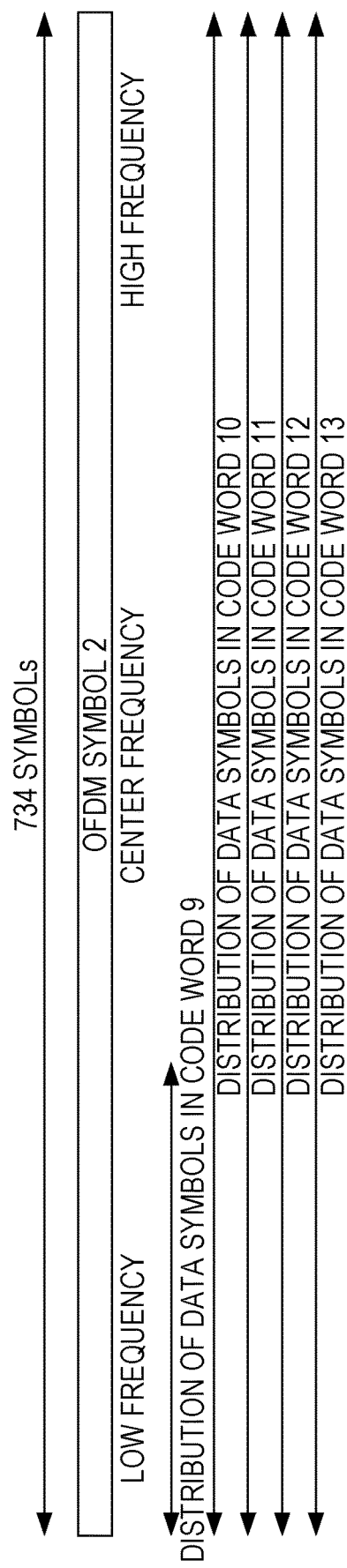
FIG. 8B is a diagram illustrating a distribution of data symbols in each of code words in OFDM symbol 2 according to the first embodiment.

FIG. 8B is a diagram illustrating a distribution of data symbols of each of code words in OFDM symbol 2 in the frequency domain. Since the interleaver 104 starts reading from d(0) in FIG. 8A, the interleaver 104 can widely distribute the data symbols of code word 10, code word 11, code word 12, and code word 13 among the low-frequency to high-frequency data subcarriers and allocate the data symbols.

As described above, although the column number of a column in which the first data symbol group of each of the code words varies according to OFDM symbol, the interleaver 104 can widely distribute the data symbol groups included in each of the code words among the low-frequency to high-frequency data subcarriers and allocate the data symbols, since the interleaver 104 writes the data symbol groups of each of the code words cyclically with respect to the column number (that is, when the write position reaches the last position, the write position returns to the first column and the write operation continues). In this manner, when, for example, there is a difference in reception quality among frequencies due to multipath propagation in the communication path, degradation of the quality that occurs in the data symbol groups included in a specific code word can be prevented. As a result, the error rate after error correction can be improved.

Operation Example 3

Figure 9B:
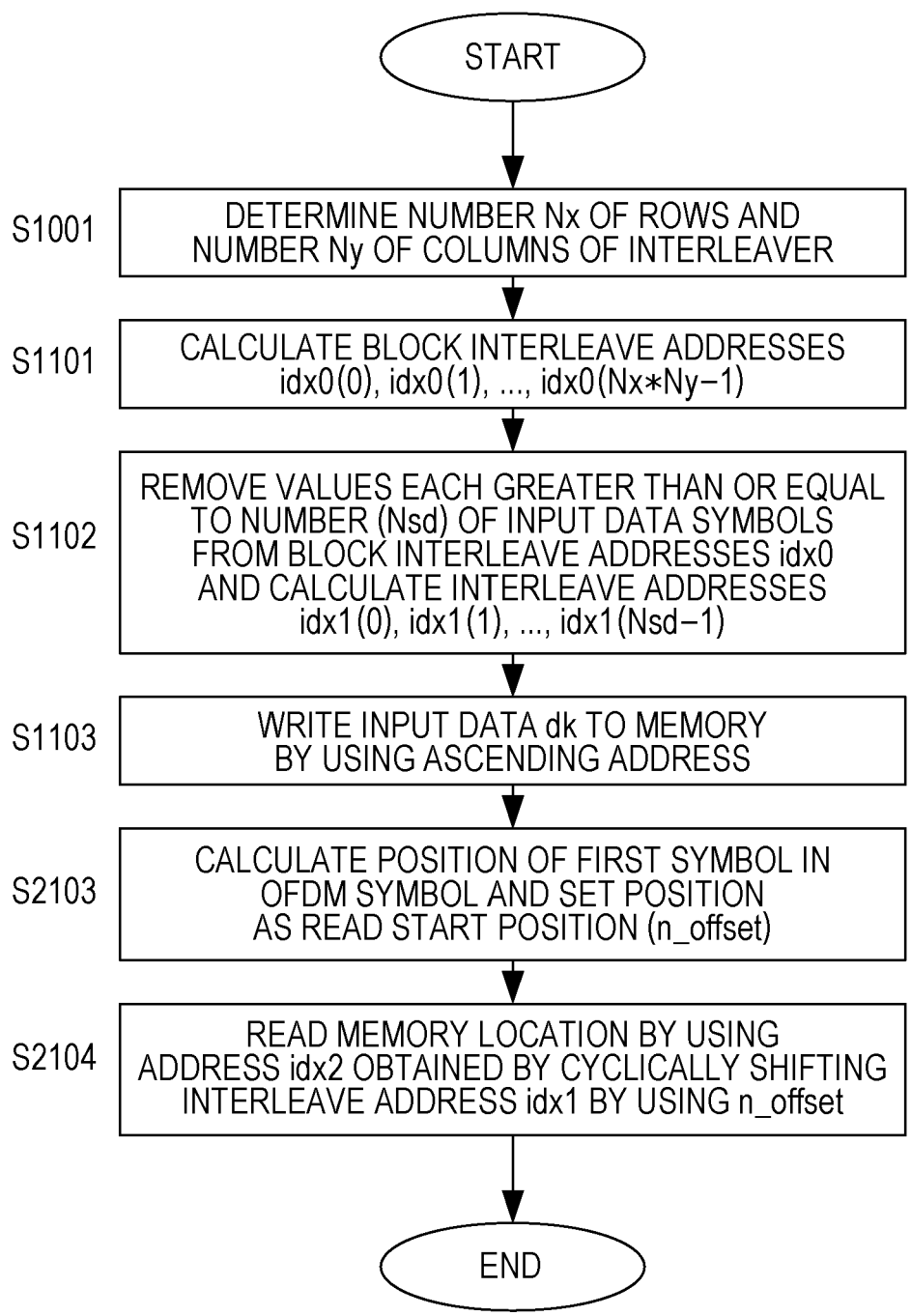
FIG. 9B is a flowchart illustrating another interleaving procedure according to the first embodiment.
Figure 9C:
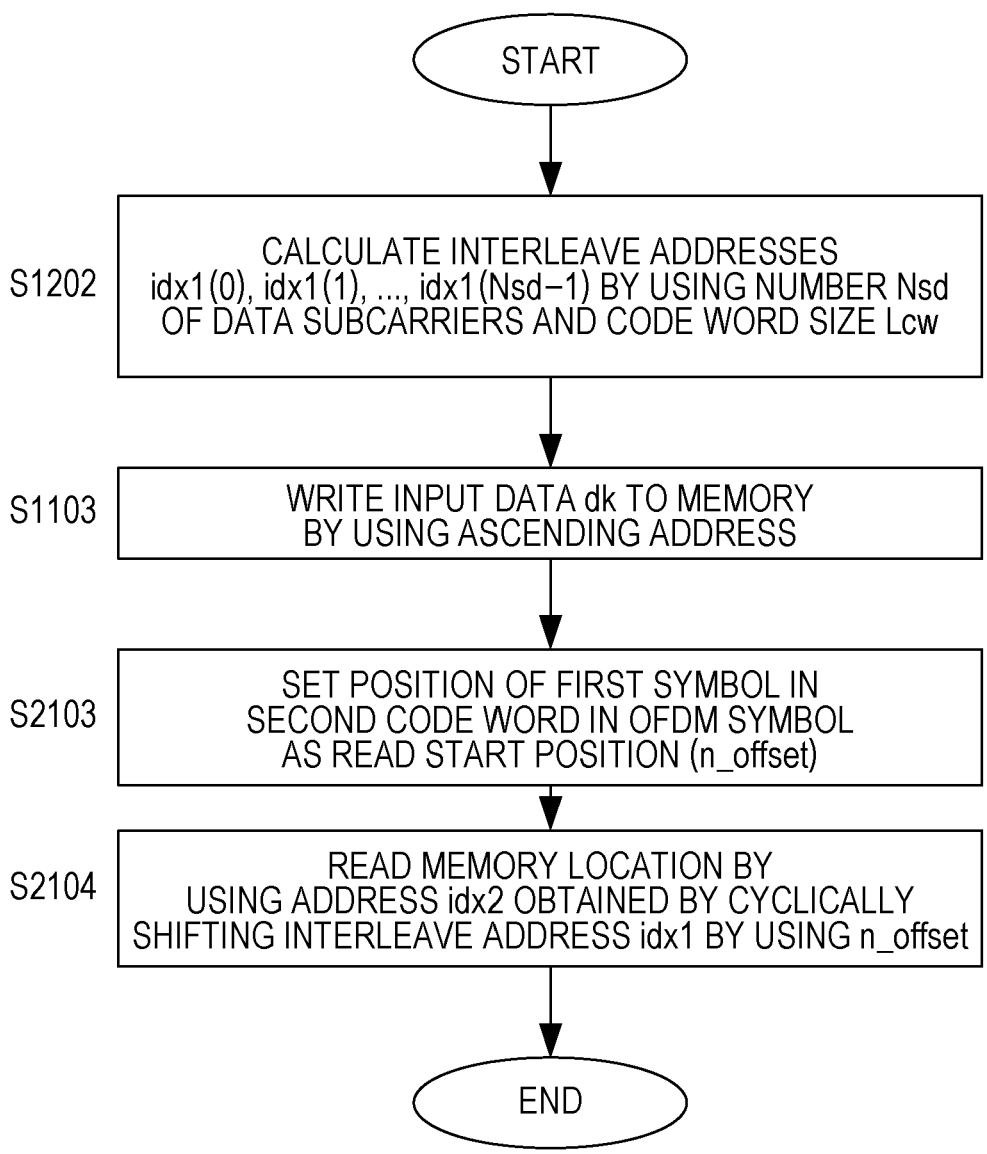
FIG. 9C is a flowchart illustrating another interleaving procedure according to the first embodiment.

FIGS. 9A, 9B, and 9C are flowcharts illustrating another procedure by which the interleaver 104 performs interleaving. In FIG. 9A, FIG. 9B, and FIG. 9C, the same processing steps as in FIG. 4A, FIG. 4B, and FIG. 4C are denoted by the same reference numerals, and description of the processing steps are not repeated. The difference between FIG. 9A, FIG. 9B, and FIG. 9C and FIG. 4A, FIG. 4B, and FIG. 4C is that the read start position is changed according to the OFDM symbol.

In step S2003 illustrated in FIG. 9A, the interleaver 104 calculates the position of the first symbol of a code word and sets the position as the read start position.

For example, when interleaver 104 interleaves OFDM symbol 0, the position of the first symbol of code word 1 is a position identified by row number 0 and column number 0 (the position of d(0) in FIG. 6A). Accordingly, row number 0 and column number 0 are set as the read start position. That is, for OFDM symbol 0, the interleaver 104 sets the same read start position as in FIG. 5B.

In addition, for example, when interleaver 104 interleaves OFDM symbol 1, the position of the first symbol of code word 6 is a position identified by row number 0 and column number 14 (the position of d(14) in FIG. 7A). The interleaver 104 sets row number 0 and column number 14 as the read start position. That is, for OFDM symbol 1, the interleaver 104 sets a read start position that differs from that in FIG. 5B.

In this case, the first symbol of code word 5 is included in OFDM symbol 0 (FIG. 6A) and is not included in OFDM symbol 1 (FIG. 7A). Therefore, when interleaving OFDM symbol 1, the interleaver 104 calculates the position of the first symbol of cord word 6 (the position of d(14) in FIG. 7A) instead of code word 5 (for example, the position of d(0) in FIG. 7A) and sets the position as the read start position.

Figure 10A:
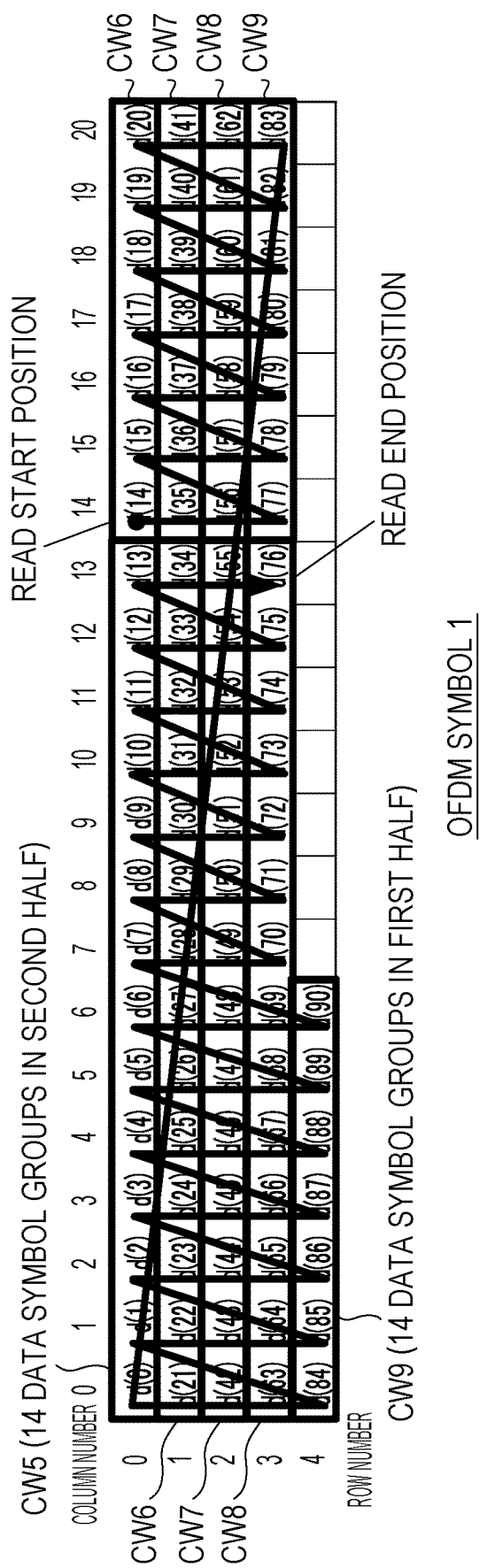
FIG. 10A is a schematic illustration of a read operation performed by the interleaver for OFDM symbol 1 according to the first embodiment.

That is, as illustrated in FIG. 10A, in the first to Nth code words (code word 5 to code word 9 in FIG. 10A) included in OFDM symbol 1, if the number of data symbols included in code word 5 is less than the number of data symbols included in code word 6, the interleaver 104 starts writing the code words starting from code word 5 in ascending order and starts reading the code words starting from code word 6. Note that as illustrated in FIG. 10A, in OFDM symbol 1, the number of data symbols (21 symbols) included in code word 6 including at least the read start position is the same as $N_y$ (that is, the number of columns) of the $N_x \times N_y$ memory size of the interleaver 104.

In addition, when interleaving OFDM symbol 1, the interleaver 104 may calculate the position of the first symbol of code word 6 and set the position as the read start position so that the first data in each of the code words (for example, d(14), d(35), d(56), and d(77)) is read out first.

In other words, for each of the OFDM symbols, the interleaver 104 may select a code word that includes the first data symbol and that is input first and set the read start position.

In this manner, the data symbols in each of the code words included in the OFDM symbol are read out in the same order as written. That is, before and after the interleaving operation, the sequence of data symbols in each of the code words is maintained. As a result, the processing upstream and downstream of the processing performed by each of the interleaver 104 and the deinterleaver 116 can be facilitated and, thus, the circuit scale can be reduced.

For example, the equalization circuit 115 upstream of the deinterleaver 116 may perform equalization processing according to the order of subcarriers. In this case, for each of the code words included in the output of the deinterleaver 116, the first data symbol in the code word is output first, and each of the data symbols is output in accordance with the ordinal position in the code word. Thus, the demodulation circuit 117 and the FEC decoding circuit 118 downstream of the deinterleaver 116 can easily divide the code word. For example, it is easy to divide a cord word by code word number, hold data symbols and demodulated data in another memory, and perform LDPC decoding for each of the code words. As a result, the circuit scale and the processing delay can be reduced.

In addition, for example, when interleaver 104 interleaves OFDM symbol 2, the position of the first symbol of code word 10 is identified by row number 0 and column number 7 (the position of d(7) in FIG. 8A). Accordingly, the interleaver 104 sets row number 0 and column number 7 as the read start position. That is, for OFDM symbol 2, the interleaver 104 sets a read start position that differs from that in FIG. 5B.

In step S2004 illustrated in FIG. 9A, the interleaver 104 sets the read start position set in step S2003 as a start point. Thereafter, the interleaver 104 discards dummy data and reads out data in the column direction.

FIG. 10A is a schematic illustration of a readout process performed when the interleaver 104 interleaves the OFDM symbol 1, which is an example of the process performed in S2004.

In FIG. 10A, the interleaver 104 starts reading at the read start position set in step S2003 (the position of d(14)) and continues to perform reading in the column direction. When the read position reaches the last row of the last column (the position of d(83) (except for dummy data)), the interleaver 104 changes the read position to row number 0 and column number 0 and continues to perform reading in the column direction.

The interleaver 104 determines, as the read end position, the position immediately before the position at which the read position of the interleaver 104 returns to the read start position (the position of d(76)). If the read position reaches the read end position, the interleaver 104 completes the readout process in step S2004.

Figure 10B:
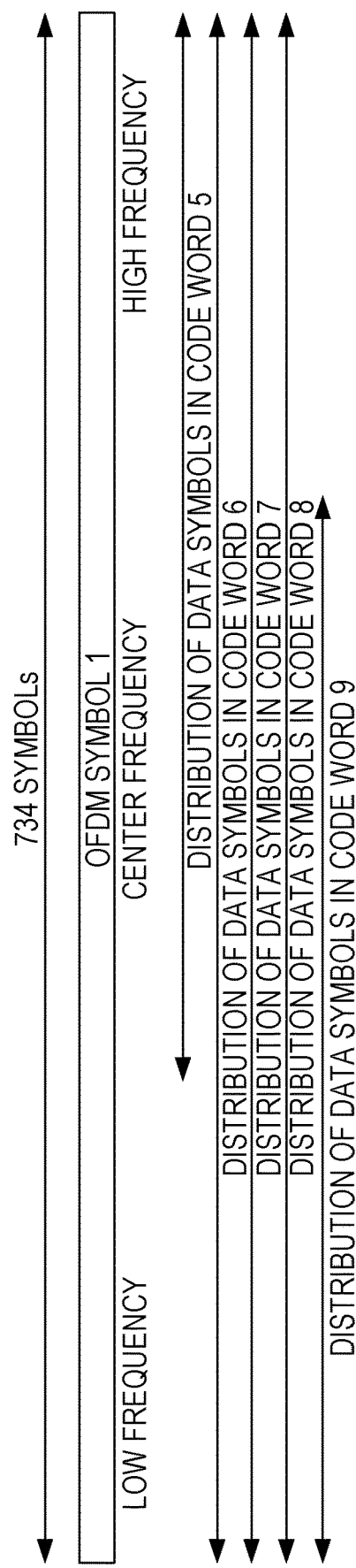
FIG. 10B is a diagram illustrating a distribution of data symbols in each of code words in OFDM symbol 1 according to the first embodiment.

FIG. 10B is a diagram illustrating a distribution of data symbols of each of code words included in OFDM symbol 1 in the frequency domain when the interleaver 104 performs interleaving according to the procedure illustrated in FIG. 9A.

As in FIG. 7B, in FIG. 10B, the interleaver 104 can widely distribute data symbols of code word 6, code word 7, and code word 8 among low-frequency to high-frequency data subcarriers and allocate the data symbols.

In addition, unlike FIG. 7B, in FIG. 10B, the data symbols of code word 5 (14 data symbol groups in the second half) are distributed among high-frequency subcarriers, and the data symbols of code word 9 (14 data symbol group in the first half) are distributed among low-frequency subcarriers.

That is, when using the procedures illustrated in FIG. 9A, FIG. 9B, and FIG. 9C, the interleaver 104 sets, in the OFDM symbol 0, 7 symbol groups in the first half of code word 5 and allocates the symbol groups to the low-frequency subcarriers, as illustrated in FIG. 6B. In addition, the interleaver 104 sets, in the OFDM symbol 1, 14 symbol groups in the second half of code word 5 and allocates the symbol groups to the high-frequency subcarriers, as illustrated in FIG. 10B.

Thus, the data symbol group of code word 5 in OFDM symbol 0 is allocated to the low-frequency subcarrier, and the data symbol group of code word 5 in OFDM symbol 1 is allocated to the high-frequency subcarrier. That is, unlike the other code words, the data symbol groups of code word 5 are allocated across a plurality of OFDM symbols. However, like the other code words, the data symbol groups are widely distributed among low-frequency to high-frequency data subcarriers in the frequency domain and are allocated.

Note that instead of changing the read start position in accordance with the OFDM symbol number in step S2003 as illustrated in FIG. 10A, the interleaver 104 may change the data write start position in accordance with the OFDM symbol number in step S1002.

FIG. 11A is a diagram illustrating a procedure by which the interleaver 104 changes the data write start position in accordance with the OFDM symbol number and performs a write operation.

In FIG. 11A, the interleaver 104 writes the data symbol groups in the row direction as in FIG. 5A. At this time, the interleaver 104 sets the column number at which the write operation is to be started to 7. As a result, in FIG. 11A, the first data symbol groups in CW6, CW7, CW8 and CW9 are all set in the column number 0.

Note that in FIG. 11A, the interleaver 104 has determined the write start column number such that the first symbol in CW6 is set in the column number 0. However, the interleaver 104 may write dummy data before CW5 in row number 0 (from column number 0 to column number 6) so that the first symbol in CW6 is set in column number 0.

Figure 11B:
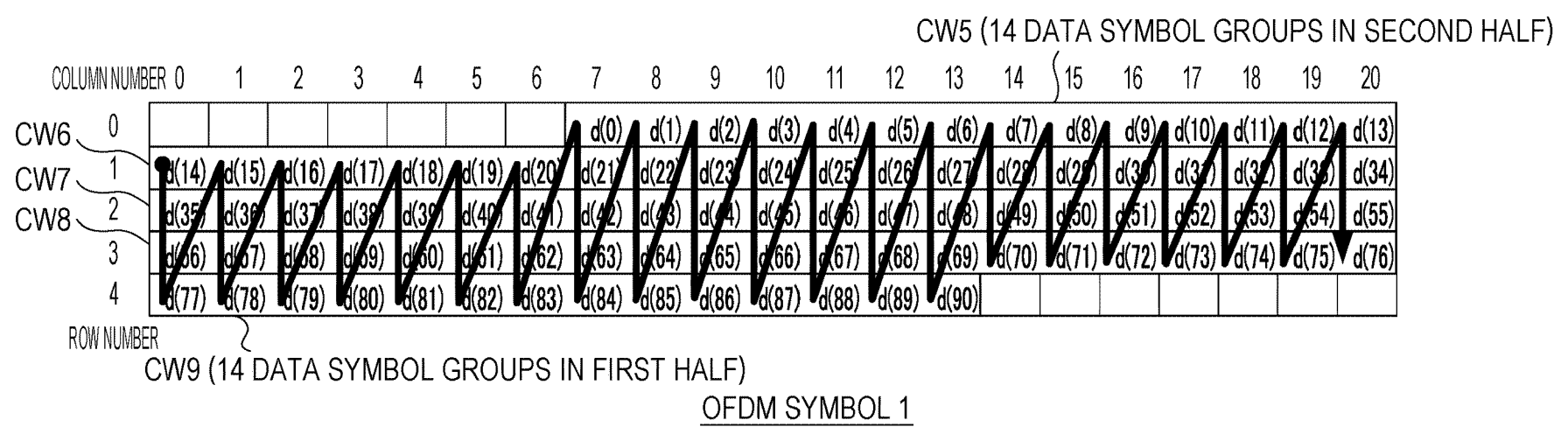

FIG. 11B is a diagram illustrating a method for reading out data symbol groups after the interleaver 104 performs a write operation by using the method illustrated in FIG. 11A. The interleaver 104 skips reading an element to which data has not been written in FIG. 11A (or an element to which dummy data has been written) and performs a read operation in the column direction. That is, in FIG. 11B, the interleaver 104 defines row number 1 and column number 0 (the position of d(14)) as the read start position and reads data symbol groups in the column direction.

The sequence of data symbol groups output from the interleaver 104 using the method illustrated in FIGS. 11A and 11B is the same as the sequence output using the method illustrated in FIG. 10A. Thus, the effects obtained by the method illustrated in FIGS. 11A and 11B are the same as those obtained by the method illustrated in FIG. 10A. According to the present embodiment, the method described below may be similarly modified as illustrated in FIG. 11A and FIG. 11B. Since the effects are the same, description of the modification is not repeated.

Figure 12:
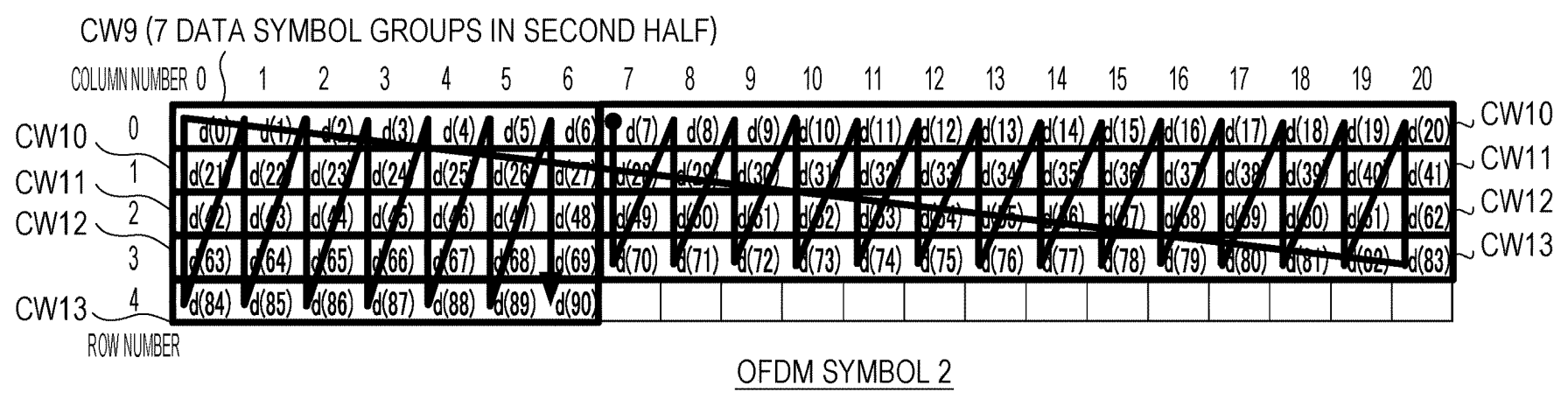

FIG. 12 is a diagram illustrating a readout process when the interleaver 104 interleaves OFDM symbol 2, which is an example of the process performed in S2004.

As illustrated in FIG. 12, the interleaver 104 starts the read operation from the read start position (the position of d(7)) set in step S2003 and continues the read operation in the column direction as in FIG. 10A.

As illustrated in FIG. 12, in terms of the first to Nth code words (code word 9 to code word 13 in FIG. 12) included in OFDM symbol 2, the number of data symbols included in code word 9 is less than the number of data symbols included in code word 10. In this case, the interleaver 104 writes the code words starting from code word 9, in ascending order and reads the code words, starting from code word 10.

Figure 13:
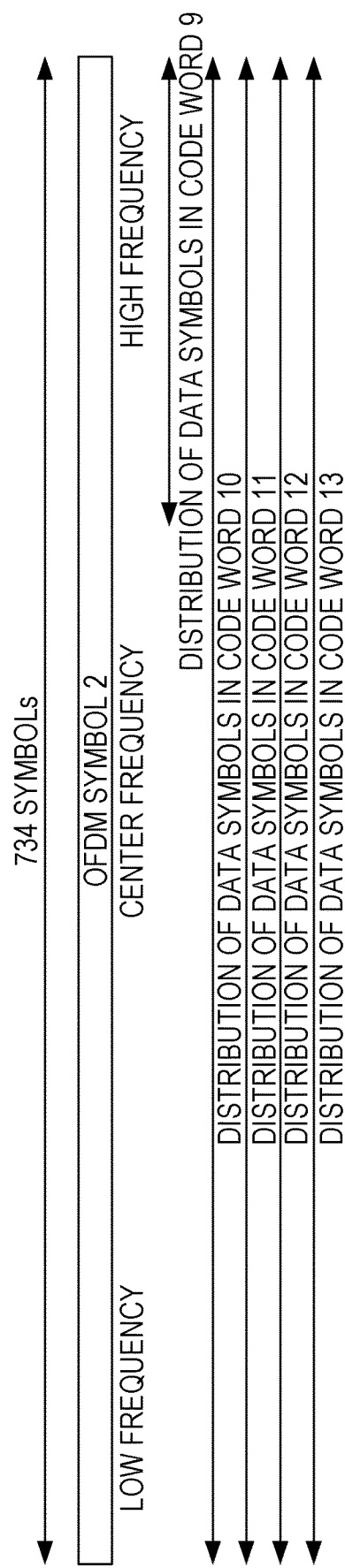
FIG. 13 illustrates a distribution of data symbols in each of code words in OFDM symbol 2 according to the first embodiment.

FIG. 13 is a diagram illustrating a distribution of data symbols of each of code words included in OFDM symbol 2 in the frequency domain when the interleaver 104 performs interleaving according to the procedure illustrated in FIG. 9A.

As in FIG. 8B, in FIG. 13, the interleaver 104 can widely distribute the data symbols of code word 10, code word 11, code word 12, and code word 13 among low-frequency to high-frequency data subcarriers and allocate the data symbols.

In addition, unlike FIG. 7B, in FIG. 13, data symbols of the code word 9 are distributed among the high-frequency subcarriers.

When using the procedure illustrated in FIGS. 9A, 9B, and 9C, the interleaver 104 sets, in the OFDM symbol 2, 14 data symbol groups in the first half of code word 9. Then, as illustrated in FIG. 10B, the interleaver 104 allocates the data symbol groups to the low-frequency subcarriers. The interleaver 104 sets, in the OFDM symbol 3, 7 data symbol groups in the second half of code word 9. Then, as illustrated in FIG. 13, the interleaver 104 allocates the data symbol groups to the high-frequency subcarriers.

Therefore, the data symbol groups of code word 9 are allocated to the low-frequency subcarriers in OFDM symbol 0, and the data symbol groups of code word 9 are allocated to the high-frequency subcarrier in OFDM symbol 1. That is, unlike the other code words, the data symbol groups of code word 9 are allocated across a plurality of OFDM symbols. However, like the other code words, the data symbol groups are widely distributed among low-frequency to high-frequency data subcarriers in the frequency domain and are allocated.

Note that the readout process performed when the interleaver 104 interleaves OFDM symbol 0 by using the process illustrated in step S2004 is the same as the process illustrated in step S1004 in FIG. 4A (refer to FIG. 5B).

FIG. 9B is a flowchart illustrating another procedure by which the interleaver 104 performs interleaving in FIG. 3. In FIG. 9B, a procedure that differs from in FIG. 9A is used. However, a similar data symbol sequence is output. In FIG. 9B, the processes the same as those illustrated in FIG. 4B are denoted by the same reference numerals, and description of the processes is not repeated.

In step S1001, the interleaver 104 may calculate $N_x$ and $N_y$ by using the following Eq. 13B and Eq. 13C instead of using Eq. 12 and Eq. 9:

[Math. 14]

$$N_y = \lceil L_{CW}/N_{CBPS}/N_S \rceil \quad \text{Eq. 13B}$$

[Math. 15]

$$N_x = \left\lceil \frac{\lceil N_{SD}/N_S \rceil}{N_y} \right\rceil \quad \text{Eq. 13C}$$

If $N_x$ and $N_y$ calculated by using Eq. 12 and Eq. 9 are not integers (described later), the interleaver 104 may calculate $N_x$ and $N_y$ by using Eq. 13B and Eq. 13C.

In step S2103 illustrated in FIG. 9B, the interleaver 104 calculates the position of the first symbol in the OFDM symbol and sets the position as the read start position (n_offset), as in step S2003 (FIG. 9A).

A method for calculating the value of n_offset is described in detail below. The interleaver 104 calculates the value of $k^{(q)}_{offset}$ using the following Eq. 14:

[Math. 16]

$$k^{(q)}_{offset} = \left\lceil \frac{qN_{SD} \times N_{CBPS}}{L_{CW}} \right\rceil \times \frac{L_{CW}}{N_{CBPS}} - qN_{SD} \quad \text{Eq. 14}$$

In terms of OFDM symbol number (q) (q is an integer greater than or equal to 0 and, for example, OFDM symbol 0 corresponds to q=0), $k^{(q)}_{offset}$ represents, among the symbols in the last code word included in the previous OFDM symbol (OFDM symbol q−1), the number of symbols that are not included in the previous OFDM symbol and are included in the current OFDM symbol (OFDM symbol q).

For example, for OFDM symbol 0 (q=0) illustrated in FIG. 6A, $k^{(0)}_{offset}$ can be expressed by the following Eq. 15:

[Math. 17]

$$k^{(0)}_{offset}=0 \quad \text{Eq. 15}$$

Furthermore, for OFDM symbol 1 (q=1) illustrated in FIG. 7A, $k^{(1)}_{offset}$ can be expressed by the following Eq. 16:

[Math. 18]

$$k^{(1)}_{offset}=14 \times N_S=112 \quad \text{Eq. 16}$$

Still furthermore, for the OFDM symbol 2 (q=2) illustrated in FIG. 8A, $k^{(2)}_{offset}$ can be expressed by the following Eq. 17:

[Math. 19]

$$k^{(2)}_{offset}=7 \times N_S=56 \quad \text{Eq. 17}$$

Note that the interleaver 104 may calculate the value of $k^{(q)}_{offset}$ by using the following Eq. 18 instead of using Eq. 14:

[Math. 20]

$$k^{(q)}_{offset}=(k^{(q-1)}_{offset}-N_{SD}) \bmod (L_{CW}/N_{CBPS}), k^{(0)}_{offset}=0 \quad \text{Eq. 18}$$

Eq. 18 is a recurrence equation. Since the number of multiplications and divisions is less than that in Eq. 14, the interleaver 104 can reduce the amount of calculation and, thus, reduce the circuit size and power consumption thereof.

Subsequently, the interleaver 104 calculates the value of NL by using the following Eq. 19:

[Math. 21]

$$N_L=N_y-\lfloor k^{(1)}_{offset}/N_S \rfloor \quad \text{Eq. 19}$$

In Eq. 19, $N_L$ represents the number of data symbol groups included in the last row of the two-dimensional array. For example, in FIG. 6A, the value of $N_L$ is 7 because the last row includes seven data symbol groups d(84) to d(90). In Eq. 19, the length of the last row (corresponding to $N_L$) for OFDM symbol 0 in FIG. 6A is a value obtained by subtracting the number of symbol groups of code word 5 (corresponding to floor($k^{(1)}_{offset}/N_S$)) included in the row number 0 of OFDM symbol 1 (q=1) in FIG. 7A from the row length ($N_y$). In this manner, the value of $N_L$ is calculated.

The interleaver 104 calculates the value of the read start position (n_offset) by using Eq. 20A (note that since the value of n_offset depends on the OFDM symbol number (q), the value is also expressed as $n^{(q)}_{offset}$ or n_offset(q)):

[Math. 22]

$$n^{(q)}_{offset} = \begin{cases} \lfloor k^{(q)}_{offset}/N_S \rfloor \times N_x & \text{if } \lfloor k^{(q)}_{offset}/N_S \rfloor \leq N_L \\ \lfloor k^{(q)}_{offset}/N_S \rfloor \times (N_x-1) + N_L & \text{if } \lfloor k^{(q)}_{offset}/N_S \rfloor > N_L \end{cases} \quad \text{Eq. 20A}$$

The value of n_offset(q) represents the number of data symbol groups included in a column preceding the column including the read start position in the two-dimensional array. For example, in FIG. 10A, the number of data symbol groups included in the column (the column including d(0) to d(13)) preceding the column including the read start position (the column including d(14)) is 63. Accordingly, the value of n_offset(1) is 63.

In addition, one of a first equation and a second equation in Eq. 20A is selected in accordance with whether the value of floor($k^{(q)}_{offset}/N_S$) is less than or equal to $N_L$ or is greater than $N_L$. The first equation (selected if the value of floor($k^{(q)}_{offset}/N_S$) is less than or equal to $N_L$) is used when as illustrated in FIG. 10B and FIG. 12, the column including the read start position is the row that does not include any one of data symbol groups in the last row (in FIG. 10B and FIG. 12, the column which does not contain any one of d(84) to d(90)).

The second equation (selected if the value of floor($k^{(q)}_{offset}/N_S$) is greater than $N_L$) is used when the column including the read start position is a column that includes, in the last row, any one of data symbol groups (in FIGS. 10B and 12, a column including any one of d(84) to d(90)) (not illustrated).

The method has been described above in which the interleaver 104 calculates the read start position by using Eq. 14 to Eq. 20A in Step S2103.

While the method for use of the interleaver 104 that calculates the read start position has been described above with reference to FIG. 9A, the row number 0, which is the read start position calculated in step S2003, is defined as $j^{(q)}_{offset}$ and, then, the value of $j^{(q)}_{offset}$ may be calculated by using the following Eq. 20B:

[Math. 23]

$$j^{(q)}_{offset} = \left\lceil \frac{k^{(q)}_{offset}}{N_S} \right\rceil \quad \text{Eq. 20B}$$

By using the values of $k^{(0)}_{offset}$, $k^{(1)}_{offset}$, and $k^{(2)}_{offset}$ calculated by using Eq. 15, Eq. 16, and Eq. 17, the values of $j^{(0)}_{offset}$, $j^{(1)}_{offset}$, and $j^{(2)}_{offset}$ are calculated as 0, 14, and 7, respectively. These values indicate that the read start positions in FIG. 6A (OFDM symbol 0), FIG. 10A (OFDM symbol 1), and FIG. 12 (OFDM symbol 2) are column numbers 0, 14, and 7, respectively.

In step S2104 illustrated in FIG. 9B, the interleaver 104 reads a memory location by using the address idx2 obtained by cyclically shifting the interleave address idx1 by n_offset (q). The address idx2 is calculated by using the following Eq. 21:

[Math. 24]

$$idx2(n,q)=idx1((n+n^{(q)}_{offset})\bmod \lfloor N_{SD}/N_S \rfloor) \quad \text{Eq. 21}$$

That is, the interleaver 104 reads code word 6 including the read start position by using the address obtained by shifting the interleave address generated in accordance with the interleave size by the number of data symbols included in the code word included in the previous OFDM symbol (for example, code word 5 in FIG. 10A).

FIG. 9C is a flowchart illustrating another procedure by which the interleaver 104 performs interleaving in FIG. 3. In FIG. 9C, a procedure that differs from the procedure in FIGS. 9A and 9B is used. However, a similar data symbol sequence is output. In FIG. 9C, the processes the same as those illustrated in FIGS. 9B and 4C are denoted by the same reference numerals, and description of the processes is not repeated.

In the same manner as in FIG. 4C in which the address calculation in FIG. 4B is replaced with address table lookup, in FIG. 9C, the address calculation in FIG. 4B (steps S1001, S1101, and S1102) may be replaced with address table lookup (refer to the description of step S1202 in FIG. 4C).

In FIG. 9C, the procedure for reading the data symbol groups is the same as that illustrated in FIG. 9B (steps S2103 and S2104).

Note that in step S2104 illustrated in FIG. 9C, the interleaver 104 may calculate the value of idx2 by using the idx1 address table (for example, FIG. 5C) instead of performing calculation using Eq. 21. For example, in FIG. 10A, when n is 87 and n_offset(1) is 63, the value of idx2(87, 1) is calculated as 13 by using the following Eq. 22:

[Math. 25]

$$idx2(87, 1) = idx1((87 + 63)\bmod \lfloor 728/8 \rfloor) = idx1(59) = 13 \quad \text{Eq. 22}$$

This indicates that the symbol block group d(13) is read in the 87th read operation in FIG. 10A. In this manner, the interleaver 104 defines data that is read the nth read operation for the OFDM symbol number q as d(idx2(n, q)).

FIG. 14 is a table denoting an example of the value of idx2(n, 1) in OFDM symbol 1 (q=1).

As described above, when using the procedures illustrated in FIG. 4A, FIG. 4B, and FIG. 4C, the interleaver 104 sets, in OFDM symbol 0, the data symbol groups in the first half of code word 5 and allocates the data symbol groups to the low-frequency subcarriers, as illustrated in FIG. 6B. In addition, the interleaver 104 sets, in OFDM symbol 1, the data symbol groups in the second half of code word 5 and allocates the data symbol groups to the low-frequency subcarriers, as illustrated in FIG. 6B.

Accordingly, since the data symbol groups of the code word 5 are allocated to low-frequency subcarriers in both OFDM symbol 0 and OFDM symbol 1, a non-uniform distribution occurs. Thus, if, for example, the degradation of the signal quality of a low-frequency subcarrier is larger than that of a high-frequency subcarrier, the error rate of code word 5 increases, as compared with another code word.

In contrast, when using the procedures illustrated in FIG. 9A, FIG. 9B, and FIG. 9C, the interleaver 104 can set, in OFDM symbol 0, data symbol groups in the first half of code word 5 and allocate the data symbol groups to the low-frequency subcarriers, as illustrated in FIG. 6B. In addition, the interleaver 104 can set, in OFDM symbol 1, the data symbol groups in the second half in the code word 5 and allocate the data symbol groups to the high-frequency subcarriers, as illustrated in FIG. 10B.

Therefore, the data symbol groups of code word 5 are allocated to the low-frequency subcarriers in OFDM symbol 0 and are allocated to the high-frequency subcarriers in OFDM symbol 1. Unlike the other code words, the data symbol groups are allocated across a plurality of OFDM symbols. However, like the other code words, the data symbol groups are allocated so as to be widely distributed in the frequency domain.

In this manner, the communication apparatus 100 can equalize the error rate for each of the code words even when the number of data subcarriers is not a multiple of the number of symbols per code word and, thus, reduce the packet error rate. As a result, the data throughput can be improved.

This is effective for, for example, millimeter wave high-speed communication (including the 11ad standard and 11ay standard) in which channel fluctuation between OFDM symbols is small due to a short OFDM symbol length (for example, 291 nanoseconds).

For example, when degradation of the signal quality of low-frequency subcarriers is larger than that of high-frequency subcarriers, the influence of the quality degradation is large on the data symbol groups of code word 5 distributed in the low-frequency region of OFDM symbol 0. However, the influence of the quality degradation is small on the data symbol groups of code word 5 distributed in the high-frequency subcarriers of OFDM symbol 1. Accordingly, the FEC decoding circuit 118 of the reception apparatus combines the data symbol groups of code word 5 of OFDM symbol 0 and the data symbol groups of code word 5 of OFDM symbol 1 and performs error correction decoding. In this manner, the influence of the quality degradation of signals in the low-frequency subcarriers can be reduced and, thus, the error rate can be reduced.

Figure 15:
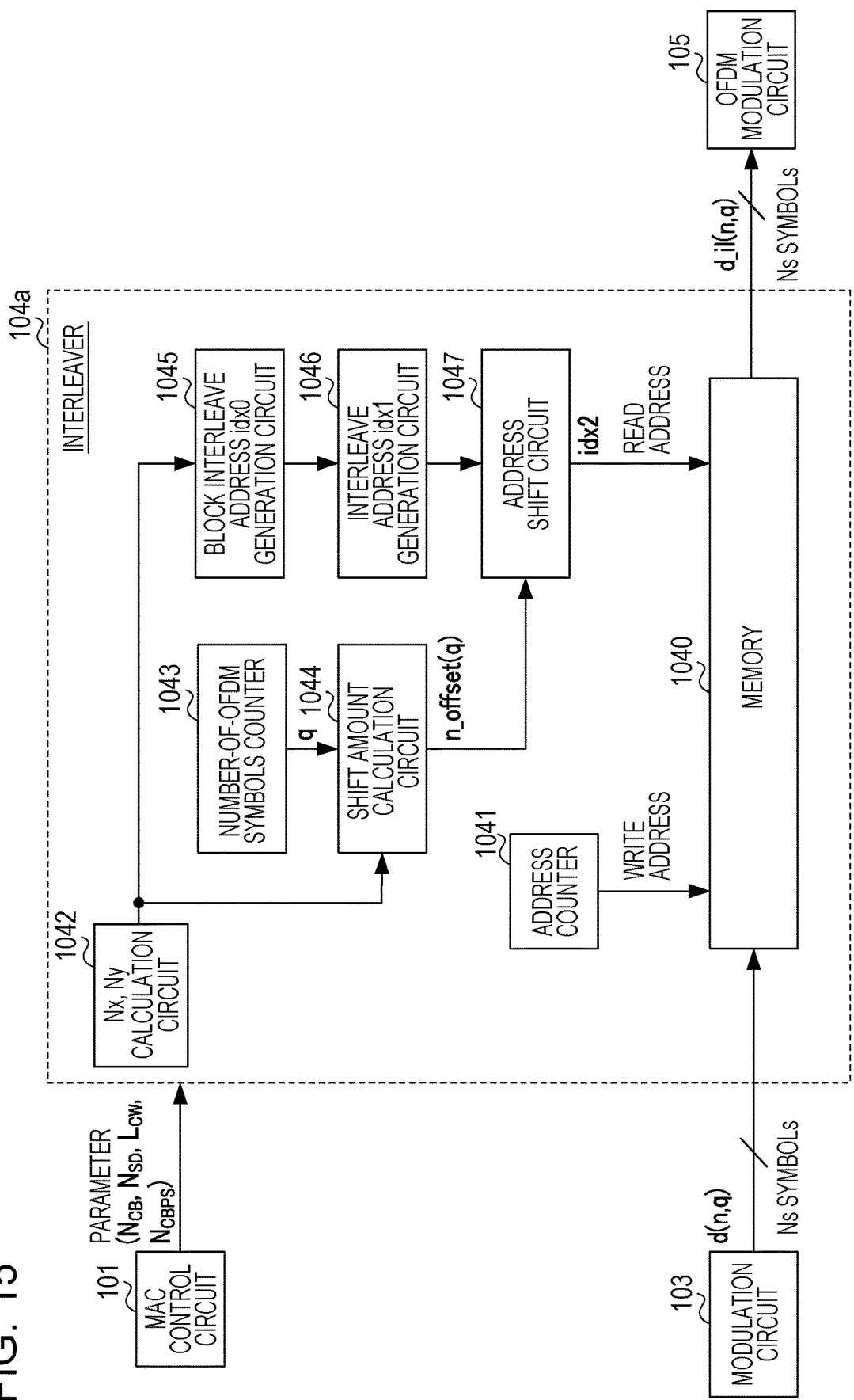
FIG. 15 is a block diagram illustrating an example of the configuration of the interleaver according to the first embodiment.

FIG. 15 is a diagram illustrating an example of the configuration of the interleaver 104 (an interleaver 104a). The interleaver 104a performs interleaving on the basis of the procedure illustrated in FIG. 9B.

The interleaver 104a includes a memory 1040, an address counter 1041, an $N_x$, $N_y$ calculation circuit 1042, a number-of-OFDM symbols counter 1043, a shift amount calculation circuit 1044, a block interleave address idx0 generation circuit 1045, an interleave address idx1 generation circuit 1046, and an address shift circuit 1047.

The MAC control circuit 101 inputs, for example, parameters of the number of channel bonding ($N_{CB}$), the number of data subcarriers ($N_{SD}$), an LDPC code word size ($L_{CW}$), and the number of bits per symbol ($N_{CBPS}$) to the interleaver 104a.

The modulation circuit 103 inputs data symbols subjected to data modulation (for example, 16QAM) to the interleaver 104a for each of data symbol groups (for each of $N_S$ symbols).

The memory 1040 of the interleaver 104a is configured by, for example, a RAM or a register array.

The address counter 1041 of the interleaver 104a generates an address for writing the data of a data symbol group to the memory 1040 by using, for example, ascending order addresses. For example, the address counter 1041 generates an address so as to write the data symbol group d(n, q) to the address n (corresponding to step S1103 in FIG. 9B).

The $N_x$, $N_y$ calculation circuit 1042 of the interleaver 104a calculates the number of rows $N_x$ and the number of columns $N_y$ of a two-dimensional array by using Eq. 13B and Eq. 13C and inputs the number of rows $N_x$ and the number of columns $N_y$ to the shift amount calculation circuit 1044 and the block interleave address idx0 generation circuit 1045 (corresponding to step S1001 in FIG. 9B).

The number-of-OFDM symbols counter 1043 of the interleaver 104a determines the value of the OFDM symbol number (q) in accordance with the number of symbols (not illustrated) input from the modulation circuit 103 and inputs the value to the shift amount calculation circuit 1044.

The shift amount calculation circuit 1044 of the interleaver 104a calculates the value of n_offset(q) by using Eq. 14, Eq. 19, and Eq. 20A (corresponding to step S2103 in FIG. 9B).

The block interleave address idx0 generation circuit 1045 of the interleaver 104a calculates idx0(i) by using Eq. 13A (corresponding to step S1101 in FIG. 9B).

The interleave address idx1 generation circuit 1046 of the interleaver 104a calculates idx1(n) by using the procedure for step 1102 illustrated in FIG. 9B.

The address shift circuit 1047 of the interleaver 104a calculates idx2(n, q) by using Eq. 21 (corresponding to step S2104 in FIG. 9B). The interleaver 104a reads the data symbol group from the memory 1040 by using idx2(n, q) generated by the address shift circuit 1047 as a read address and outputs the data symbol group to the OFDM modulation circuit 105.

Note that the deinterleaver 116 may be configured by using, in the interleaver 104a, the output of the address shift circuit 1047 (idx2(n, q)) as a write address and using the output of the address counter 1041 as a read address.

Figure 16:
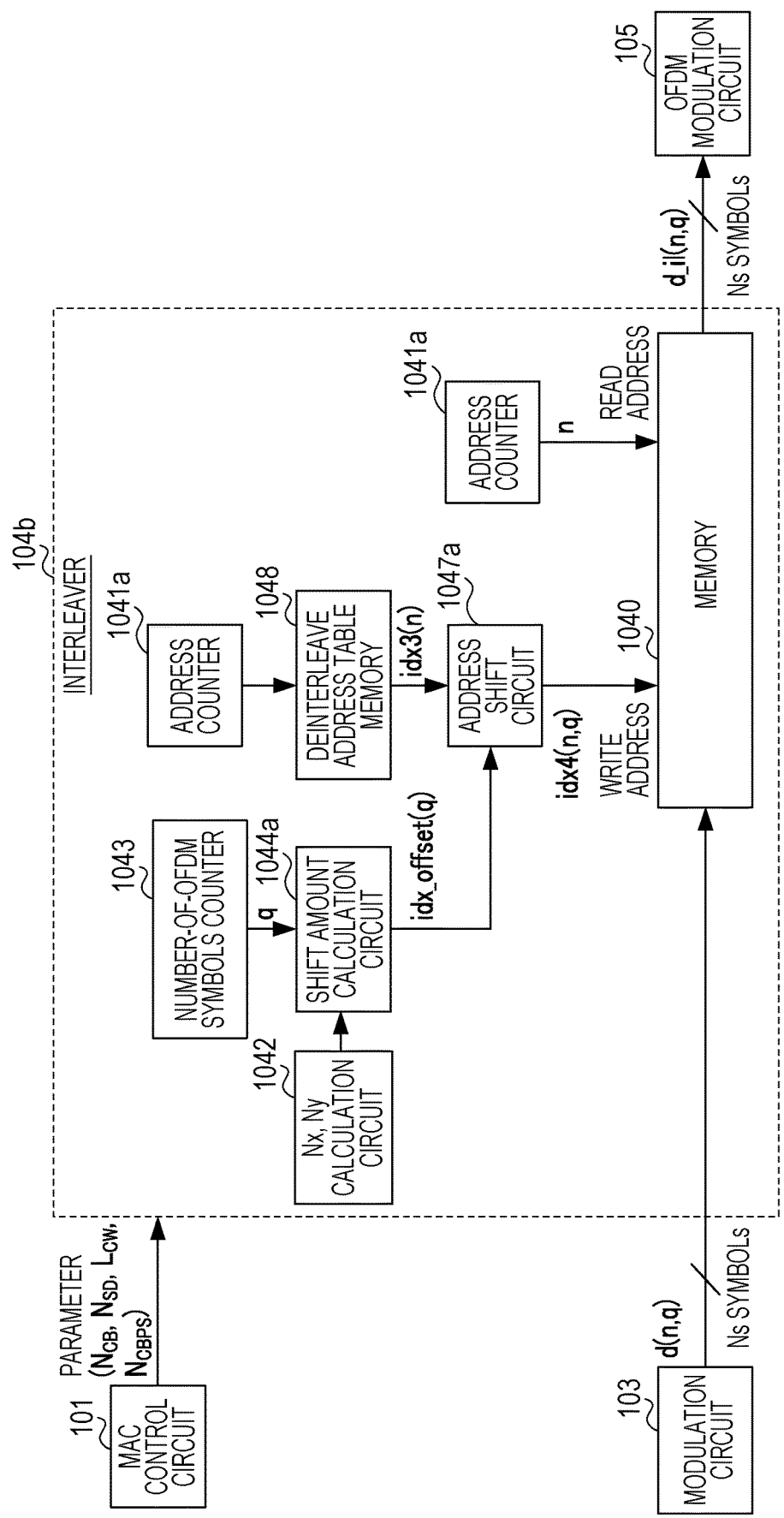
FIG. 16 is a block diagram illustrating another example of the configuration of the interleaver according to the first embodiment.

FIG. 16 is a diagram illustrating another example of the configuration of the interleaver 104 (an interleaver 104b). In FIG. 16, the same constituent elements as in FIG. 15 are denoted by the same reference numerals, and descriptions of the constituent elements are not repeated. The interleaver 104a illustrated in FIG. 15 performs interleaving processing by using the data symbol group number (n) as a write address and using an address according to the interleaving method as a read address. In contrast, the interleaver 104b illustrated in FIG. 16 performs interleaving processing by using an address according to the interleaving method as a write address and using a data symbol group number (n) as a read address.

The interleaver 104b illustrated in FIG. 16 has a configuration that differs from that of the interleave 104a illustrated in FIG. 15. However, the interleaver 104b can obtain the same interleaving result. As described below, a deinterleave address table memory 1048 only need to sequentially generate an interleave address corresponding to the input of a data symbol group from the modulation circuit 103, and the address shift circuit 1047a performs only addition and modulo processing. As a result, the circuit configuration is simplified, and the power consumption can be reduced.

An address counter 1041a generates a data symbol group number (n) in accordance with the output of the modulation circuit 103.

The deinterleave address memory 1048 calculates the deinterleave address idx3(n) such that idx3(n) satisfies the following Eq. 23:

[Math. 2]

$$n = idx1(idx3(n)) \qquad \text{Eq. 23}$$

Note that idx3(n) that satisfies Eq. 23 also satisfies the following Eq. 24:

[Math. 27]

$$n = idx3(idx1(n)) \qquad \text{Eq. 24}$$

From Eq. 23 and Eq. 24, idx3(n, q) is the reverse lookup address of idx1(n, q).

The deinterleave address memory 1048 may calculate idx3(n) by storing an address table for calculating idx3(n) in, for example, a ROM or a RAM.

The address shift circuit 1047a calculates an interleave address idx4(n, q) having an adjusted readout initial value by using the following Eq. 25:

[Math. 28]

$$idx4(n,q) = (idx3(n) - n^{(q)}{}_{offset}) \bmod \lfloor N_{SD}/N_S \rfloor \qquad \text{Eq. 25}$$

The interleaver 104 corresponds to advancing the read position by n_offset(q) in FIG. 10A, and Eq. 25 means that the write position is delayed by n_offset(q). Both provide the same effect.

The interleave address idx4(n, q) generated by the address shift circuit 1047a satisfies the following Eq. 26 and Eq. 27:

[Math. 29]

$$n = idx2(idx4(n,q),q) \qquad \text{Eq. 26}$$

[Math. 30]

$$n = idx4(idx2(n,q),q) \quad \text{Eq. 27}$$

where idx4(n, q) is the reverse lookup address of idx2(n, q).

FIG. 17 illustrates an example of the values of idx3(n) and idx4(n, 1) corresponding to the example of the value of idx1(n) illustrated in FIG. 14. In FIG. 14, for example, the value of idx1(4) is 84. The value of idx3(84) corresponding to this value is 4. In addition, in FIG. 14, for example, the value of idx2(6, 1) is 57. The value of idx4(57, 1) corresponding to this value is 6.

The address counter 1041a generates a data symbol group number (n). The address counter 1041a generates, for example, ascending addresses (n=0, 1, . . . , floor($N_{SD}/N_S$)–1).

The interleaver 104b writes the data symbol group to the memory by using the address (idx4(n, q)) generated by the address shift circuit 1047a and reads the data symbol group from the memory by using the address generated by the address counter 1041a. In this manner, the interleaver 104b performs interleaving.

The correspondence between the interleaver 104b illustrated in FIG. 16 and FIG. 10A is described below. The interleaver 104b achieves interleaving by controlling the write position at which a data symbol group is to be written in accordance with the interleaving procedure (FIGS. 9A, 9B, and 9C) in consideration of the reading order, for example, data 0 to be read first is at address 0, data 1 to be read next is at address 1, and so on.

For example, in FIG. 10A, to read data symbol group d(14) first, the interleaver 104b writes d(14) to address 0. That is, the interleaver 104b calculates the write address so that idx4(14, 1)=0.

Figure 18:
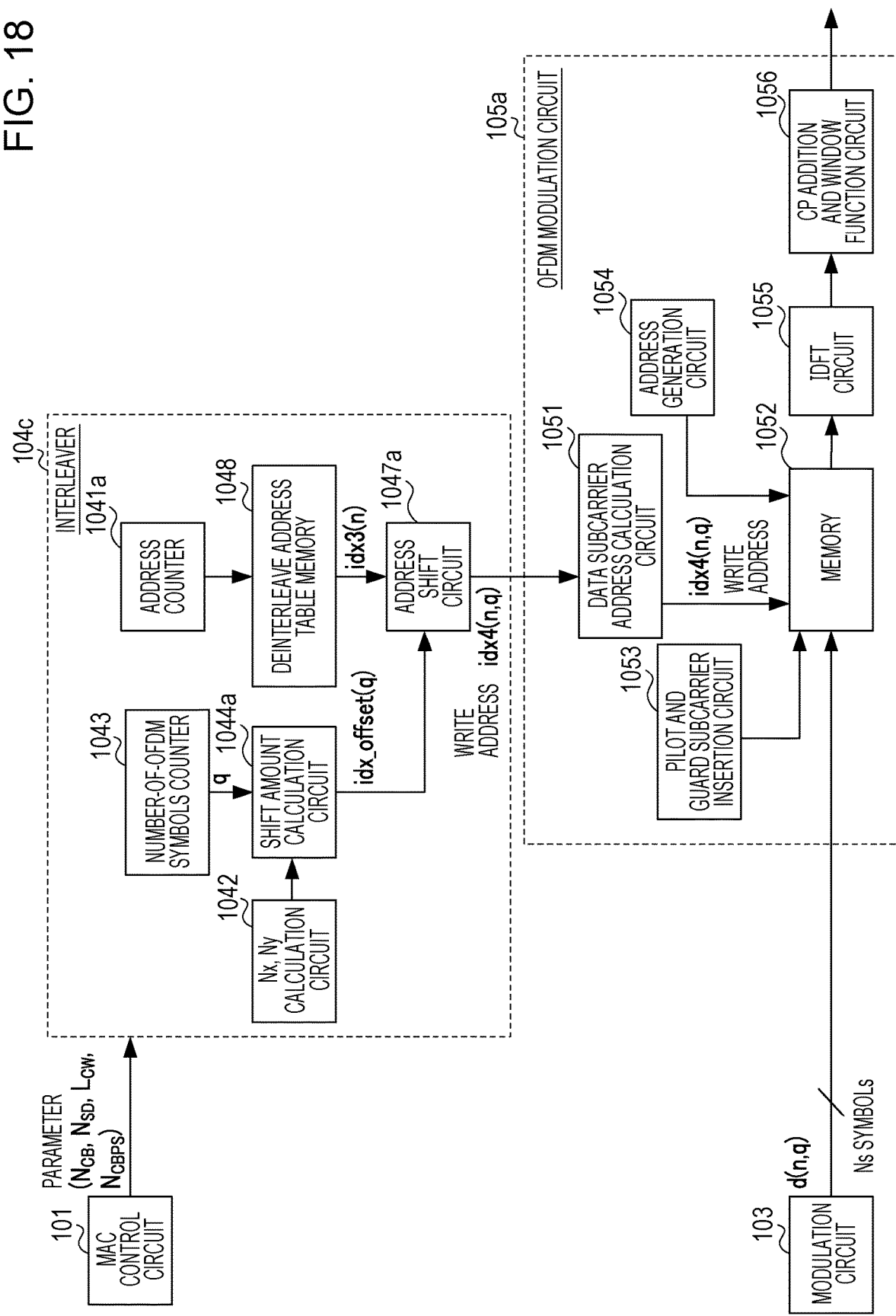
FIG. 18 is a block diagram illustrating another example of the configuration of the interleaver according to the first embodiment.

FIG. 18 is a diagram illustrating another example of the configuration of the interleaver 104 (an interleaver 104c). FIG. 18 includes an example of the configuration of the OFDM modulation circuit 105 (an OFDM modulation circuit 105a). In FIG. 18, the same constituent elements as in FIG. 15 and FIG. 16 are denoted by the same reference numerals, and descriptions of the same constituent elements are not repeated.

Unlike the interleaver 104b, the interleaver 104c inputs the address idx4(n, q) calculated by the address shift circuit 1047a to the OFDM modulation circuit 105a. In addition, the interleaver 104c need not include the memory 1040 and the address counter 1041a.

In addition, the modulation circuit 103 may input the data symbol group to the OFDM modulation circuit 105a instead of inputting the data symbol group to the interleaver 104c. The communication apparatus 100 uses the write address calculated by the interleaver 104c. In this manner, the OFDM modulation circuit 105a substantially performs interleaving processing.

The OFDM modulation circuit 105a includes a data subcarrier address calculation circuit 1051, a memory 1052, a pilot and guard subcarrier insertion circuit 1053, an address generation circuit 1054, an IDFT circuit 1055, and a CP addition and window function circuit 1056.

The data subcarrier address calculation circuit 1051 of the OFDM modulation circuit 105a calculates the subcarrier number (k) in accordance with the data subcarrier order (r) after interleaving. The term "data subcarrier order (r)" after interleaving means, for example, the order in which data is read out in FIG. 5B, FIG. 10A, and FIG. 12.

For example, in FIG. 10A, the data subcarrier orders of data symbols included in data symbol group d(14) are 0 to $N_S$–1, and the data subcarrier orders of the data symbols included in data symbol group d(35) are $N_S$ to $2N_S$–1. The interleaver 104c determines the data subcarrier orders of the data symbol group d(n) to be idx4(n, q)×$N_S$ to idx4(n, q)×$N_S$+$N_S$–1.

FIG. 19 illustrates an example of the correspondence (referred to as "subcarrier mapping") between the data subcarrier order (r) and the subcarrier number (k). The value of the subcarrier mapping may vary in accordance with the number of channel bonding ($N_{CB}$), the number of DFT points ($N_{DFT}$), the number of data subcarriers ($N_{SD}$), and the channel number (ch). FIG. 19 illustrates an example in the case where $N_{CB}$=2, $N_{DFT}$=1024, $N_{SD}$=728, and the channel number=9.

The value of subcarrier number k is greater than or equal to –$N_{DFT}$/2 and less than or equal to $N_{DFT}$/2–1 (in the example illustrated in FIG. 19, greater than or equal to –512 and less than or equal to 511). In FIG. 19, a subcarrier with k less than –383 or k greater than 383 is referred to as a "guard band" or "guard subcarrier". The value of a guard subcarrier symbol is defined as 0. In FIG. 19, a subcarrier with a value k of –1, 0, or 1 is referred to as a "DC subcarrier". The symbol value of the DC subcarrier is defined as 0.

In addition, the subcarrier that is other than a guard subcarrier and a DC subcarrier and that does not appear in FIG. 19 is referred to as a "pilot subcarrier". The subcarrier numbers k of pilot subcarriers are, for example, {–372, –350, –328, –306, –284, –262, –240, –218, –196, –174, –152, –130, –108, –86, –64, –42, –20, –3, 7, 24, 46, 68, 90, 112, 134, 156, 178, 200, 222, 244, 266, 288, 310, 332, 354, 376}.

The data subcarrier address calculation circuit 1051 writes a data symbol c(h, q) to the memory 1052 in accordance with the subcarrier number (k) calculated from the data subcarrier order (r). As used herein, c(h, q) represents the h-th data symbol (h is an integer greater than or equal to 0 and less than NSD) for the OFDM symbol number q. The number n of the data symbol group d(n, q) including the data symbol c(h, q) is calculated by the following Eq. 28:

[Math. 31]

$$n = \lfloor h/N_S \rfloor \quad \text{Eq. 28}$$

The data subcarrier address calculation circuit 1051 writes, for example, the data of subcarrier k to the address k+$N_{DFT}$/2 of the memory 1052.

In the communication apparatus 100, the interleaver 104c calculates interleave address idx4(n, q) related to data symbol group d(k, q) including data symbol c(h, q). The OFDM modulation circuit 105a calculates the subcarrier number k on the basis of the data orders (idx4(n, q)×$N_S$ to idx4(n, q)×$N_S$+$N_S$–1) of the data symbols included in the data symbol group d(k, q) and writes the data symbol to the address corresponding to the subcarrier number in the memory 1052.

The pilot and guard subcarrier insertion circuit 1053 calculates the positions of the guard subcarrier and DC subcarrier and writes 0s to the memory 1052 as the values of the symbols. In addition, the pilot and guard subcarrier insertion circuit 1053 calculates the subcarrier number of the pilot subcarrier and writes a predetermined pilot symbol value to the memory 1052.

The address generation circuit 1054 generates an address for reading subcarrier data (which may include a data subcarrier, a DC subcarrier, a pilot subcarrier, and a guard subcarrier) from the memory 1052 in order for the IDFT circuit 1055 to perform IDFT. The address generation circuit 1054 may generate an ascending address or a bit-reversed address in accordance with the circuit configuration of the IDFT circuit 1055.

The IDFT circuit 1055 performs inverse discrete Fourier transform on the subcarrier data read out from the address generated by the address generation circuit 1054 and converts the subcarrier data into a time domain signal. The CP addition and window function circuit 1056 adds a CP to the time domain signal and applies the window function.

As described above, unlike the interleaver 104b illustrated in FIG. 16, the interleaver 104c illustrated in FIG. 18 does not require the memory 1040. As a result, the circuit scale and the power consumption can be reduced and, thus, processing delay can be reduced.

Operation Example 4

Figure 20:
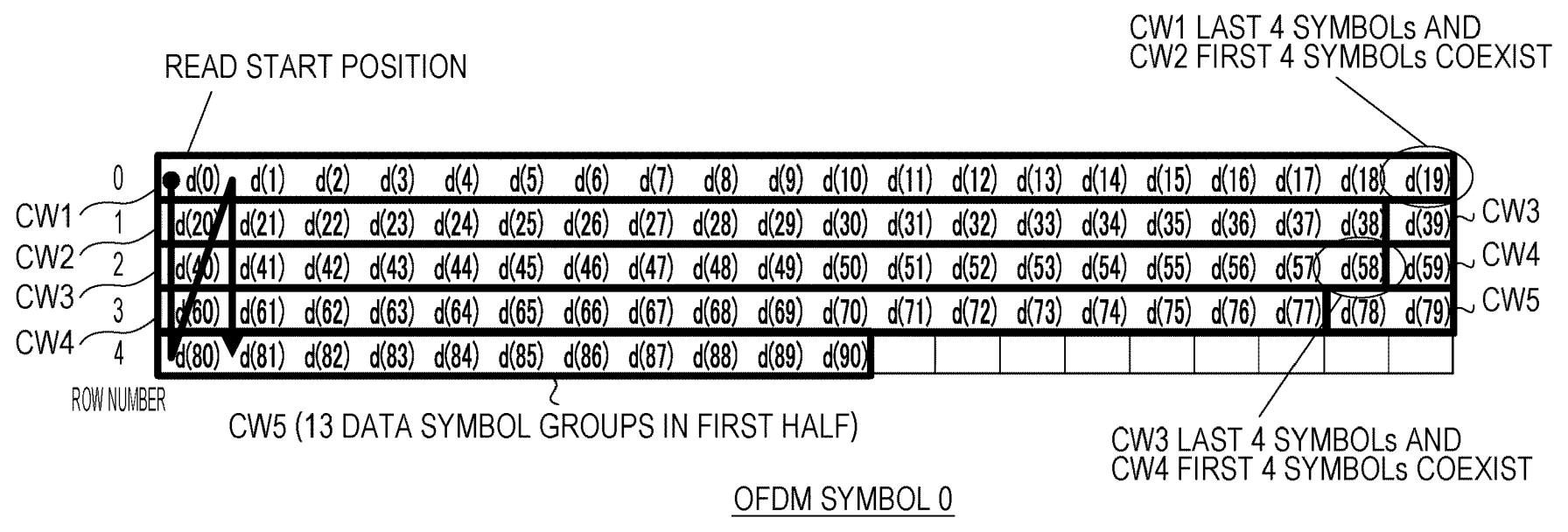
Figure 21:
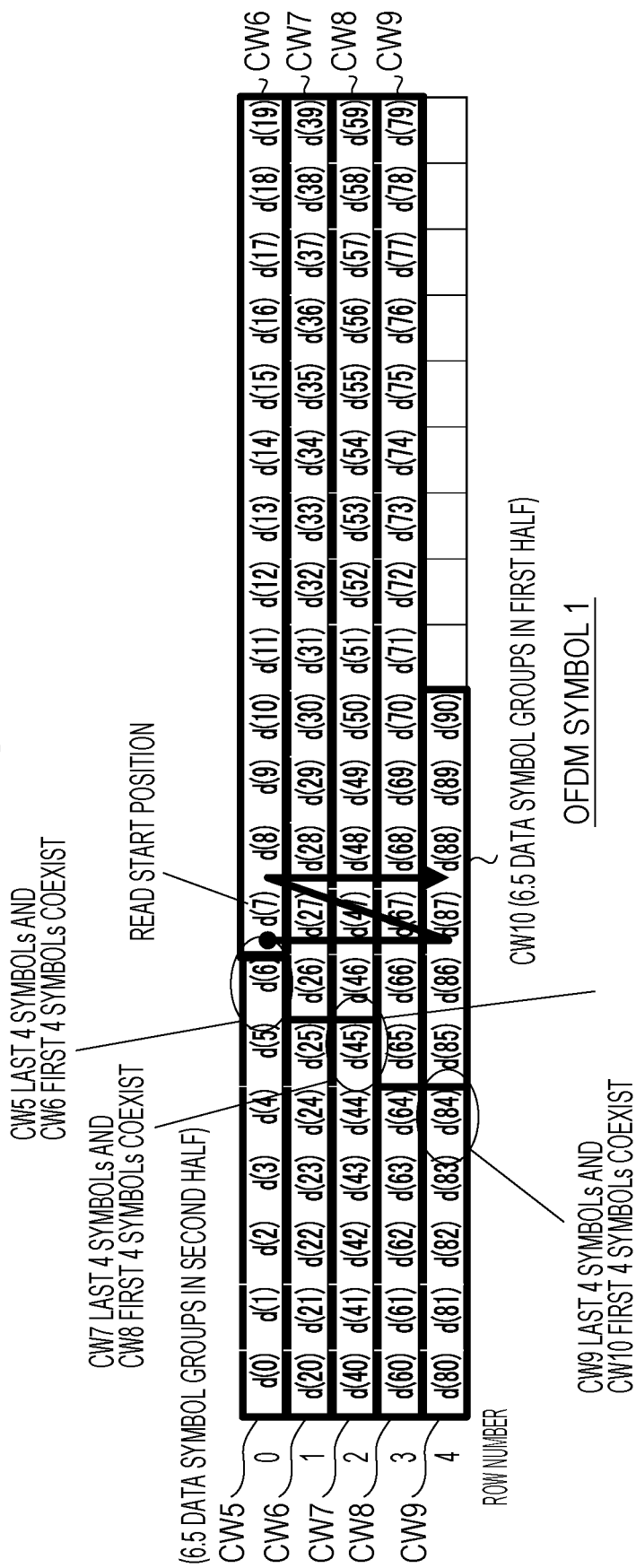
FIG. 21 is a schematic illustration of another example of the operation performed by the interleaver for OFDM symbol 1 according to the first embodiment.

FIG. 20 and FIG. 21 are diagrams illustrating another example by which the interleaver 104 performs interleaving. Referring to FIG. 20 and FIG. 21, the case is described below where data symbols of a plurality of code words coexist in the data symbol group because the number of symbols per code word ($L_{CW}/N_{CBPS}$) is not a multiple of the number of symbols per data symbol group ($N_S$). While the case where the interleaver 104 uses the procedure illustrated in FIG. 9A is described below, the same effect can be obtained even when the procedures in FIG. 9B and FIG. 9C is used.

FIG. 20 illustrates an example in which the interleaver 104 interleaves OFDM symbol 0 (q=0) when NSD is 728, LCW is 624, and NCBPS is 4. As in FIG. 5A, the interleaver 104 performs writing on a row-by-row basis. However, in FIG. 20, the arrow indicating the writing order is not illustrated. In addition, as in FIGS. 5B, 10A, and 12, the interleaver 104 performs writing on a column-by-column basis. In FIG. 20, an arrow indicating the reading order for only first two columns is illustrated to clarify the read positions. However, an arrow indicating the reading order for the remaining column numbers is not illustrated.

In step S1001, the interleaver 104 calculates the values of $N_x$ and $N_y$ by using Eq. 13B and Eq. 13C. In one example, $N_y$ is 20, and $N_x$ is 5.

In FIG. 20, the number of data symbol groups per code word ($L_{CW}/N_{CBPS}/N_S$) is 19.5, which differs from the value of $N_y$ calculated by the interleaver 104 (=20). According to Eq. 13B, the value of $N_y$ is a value obtained by rounding up (applying ceiling to) the number of data symbol groups per code word ($L_{CW}/N_{CBPS}/N_S$). Therefore, the last 4 symbols in code word 1 and the first 4 symbols in code word 2 coexist in the symbol (d(19)) in the last column of the row number 0. That is, a shift occurs in the correspondence between a row of the two-dimensional array and a code word. In row number 0, 4 symbols that are not included in code word 1 are included. That is, the amount of shift is 4 symbols.

In addition, the shift amount is accumulated for each of the rows, and the shift amount for row number 1 is 8 symbols. That is, the shift amount corresponds to one data symbol group. Therefore, the columns in row number 1 other than the last column (d(39)) (columns d(20) to d(38)) include the data symbol group of code word 2, while the last column in row number 1 (d(39)) includes a data symbol group of code word 3.

Furthermore, the shift amount of row number 2 is 12 symbols. That is, the shift amount corresponds to 1.5 data symbol groups. Therefore, the columns (d(40) to d(57)) other than the last two columns (d(58) and d(59)) of the row number 1 include the data symbol groups of code word 3, d(58) includes a mixture of data symbols of code word 3 and code word 4, and the last column (d(59)) includes data symbol groups of code word 4.

FIG. 21 illustrates an example in which the interleaver 104 interleaves OFDM symbol 1 (q=1) when using the same parameters as in FIG. 20 (for example, $N_{SD}$=728, $L_{CW}$=624, and $N_{CBPS}$=4). Like FIG. 20, in FIG. 21, an arrow indicating the reading order for only first two columns including the read start position is illustrated. However, an arrow relating to the writing order and an arrow relating to the reading order for the remaining columns are not illustrated.

If, in each of the row numbers in FIG. 21, a data symbol group of a code word of the column including the read start position (d(7)) is included in a column preceding the column including the read start position, the number of the data symbols is considered as the amount of shift.

For example, in FIG. 21, since the read start position in row number 0 is d(7), code word 6 is read from the first data symbol group. In contrast, code word 7 is read from the second data symbol group d(27).

For this reason, since, in code word 6, 4 symbols (the first 4 symbols) of CW6 are included in the column (the column including d(6)) preceding the column including the read start position (d(7)), the amount of shift is 4 symbols. Since, in code word 7, 8 symbols of CW7 are included in a column (a column including d(26)) preceding the column including a read start position (d(27)), the amount of shift is 8 symbols. Since, in code word 8, 4 symbols and 8 symbols of CW8 are included in the columns (d(45), d(46)) preceding the column including the read start position (the column including d(47)), respectively, the amount of shift is 12 symbols. Since, in code word 9, 8 symbols and 8 symbols of CW9 are included in the columns (d(65), d(66)) preceding the column including the read start position (the column including d(67)), respectively, the amount of shift is 16 symbols. Since, in code word 10, 4 symbols, 8 symbols, and 8 symbols of CW10 are included in the columns (d(84), d(85), d(86)) preceding the column including the read start position (the column including d(87)), respectively, the amount of shift is 20 symbols.

Figure 22:
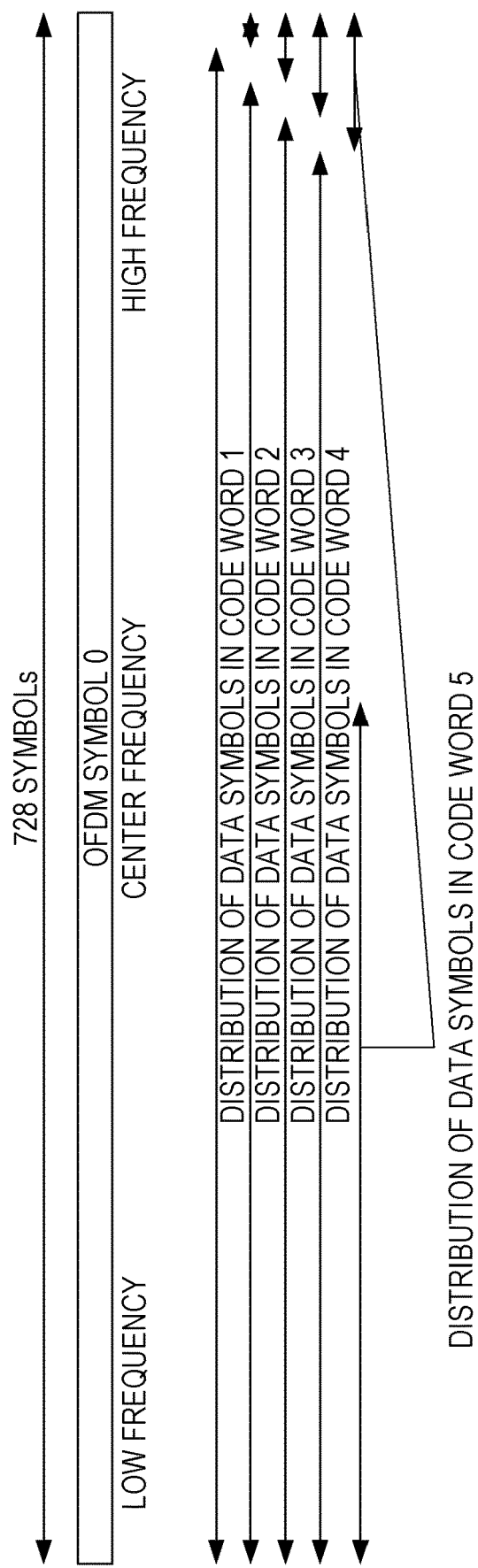
FIG. 22 illustrates a distribution of data symbols of each of code words in OFDM symbol 0 according to the first embodiment.
Figure 23:
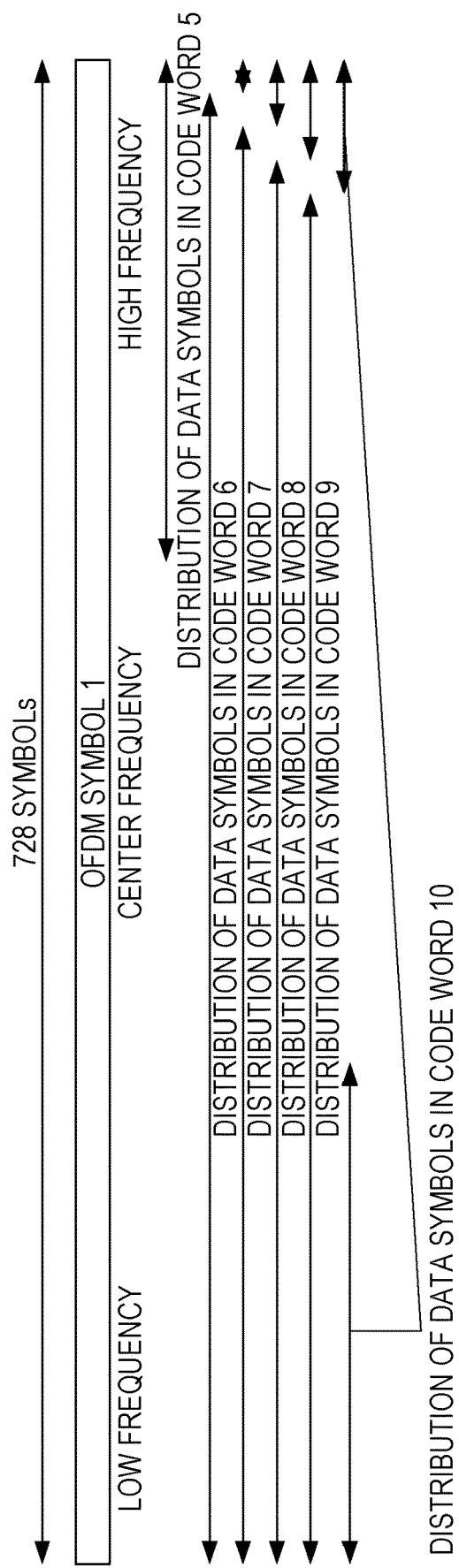
FIG. 23 illustrates a distribution of data symbols of each of code words in OFDM symbol 1 according to the first embodiment.

FIGS. 22 and 23 are diagrams illustrating distributions of the data symbols of code words in the frequency domain when the interleaver 104 interleaves OFDM symbols 0 and 1 illustrated in FIGS. 20 and 21, respectively.

In step S1001 illustrated in FIGS. 9A and 9B, the interleaver 104 determines the number of columns $N_y$ on the basis of the number of symbols per code word. For this reason, code words 1, 2, 3, 4, 6, 7, 8, and 9 are widely distributed among the low-frequency to high-frequency subcarriers of the OFDM symbols and are allocated.

In step S2003 illustrated in FIG. 9A and step S2103 illustrated in FIG. 9B, the interleaver 104 determines the read start position in accordance with the number of data subcarriers ($N_{SD}$) of the OFDM symbol and the number of symbols per code word ($L_{CW}/N_{CBPS}$). For this reason, when a code word is divided into a plurality of OFDM symbols and is allocated, frequency overlapping in the code word can be reduced, and the code word can be widely distributed among the low-frequency to high-frequency subcarriers of the OFDM symbols and be allocated.

In FIG. 22 and FIG. 23, in the high-frequency subcarriers, overlapping of the distribution of the data symbols of code word 5 occurs in accordance with the amount of shift. However, the interleaver 104 determines a readout initial value such that the amount of shift does not accumulate for each of the OFDM symbols (refer to, for example, Eq. 14, Eq. 19, and Eq. 20A). As a result, the amount of shift can be set to a value smaller than the number of subcarriers of the OFDM symbol. In this manner, performance degradation due to overlapping of the data symbol distribution can be reduced.

In addition, in FIG. 22 and FIG. 23, the interleaver 104 allocates the data symbols in each of the code words to the subcarriers of the OFDM symbol while maintaining the ordinal positions of the data symbols in the code word except for the head portion according to the amount of shift.

In this manner, when the communication apparatus 100 receives FIG. 22 and FIG. 23, the deinterleaver 116 can easily output data while maintaining the ordinal positions of the data symbols of each of the code words. Accordingly, the circuit configuration of each of the demodulation circuit 117 and the FEC decoding circuit 118 located downstream of the deinterleaver 116 can be simplified. In addition, since the communication apparatus 100 can easily perform parallel processing for each of the code words, the data throughput can be increased.

Operation Example 5

Figure 24:
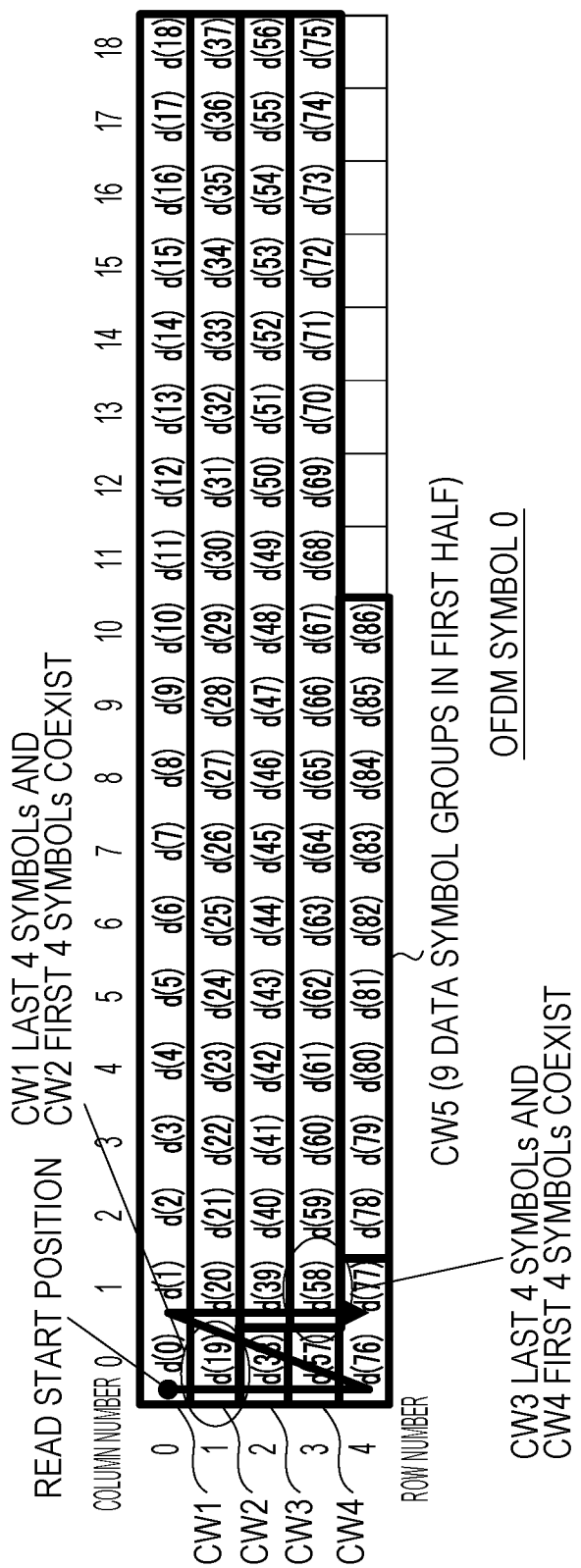
FIG. 24 is a schematic illustration of another example of the operation performed by the interleaver for OFDM symbol 0 according to the first embodiment.
Figure 25:
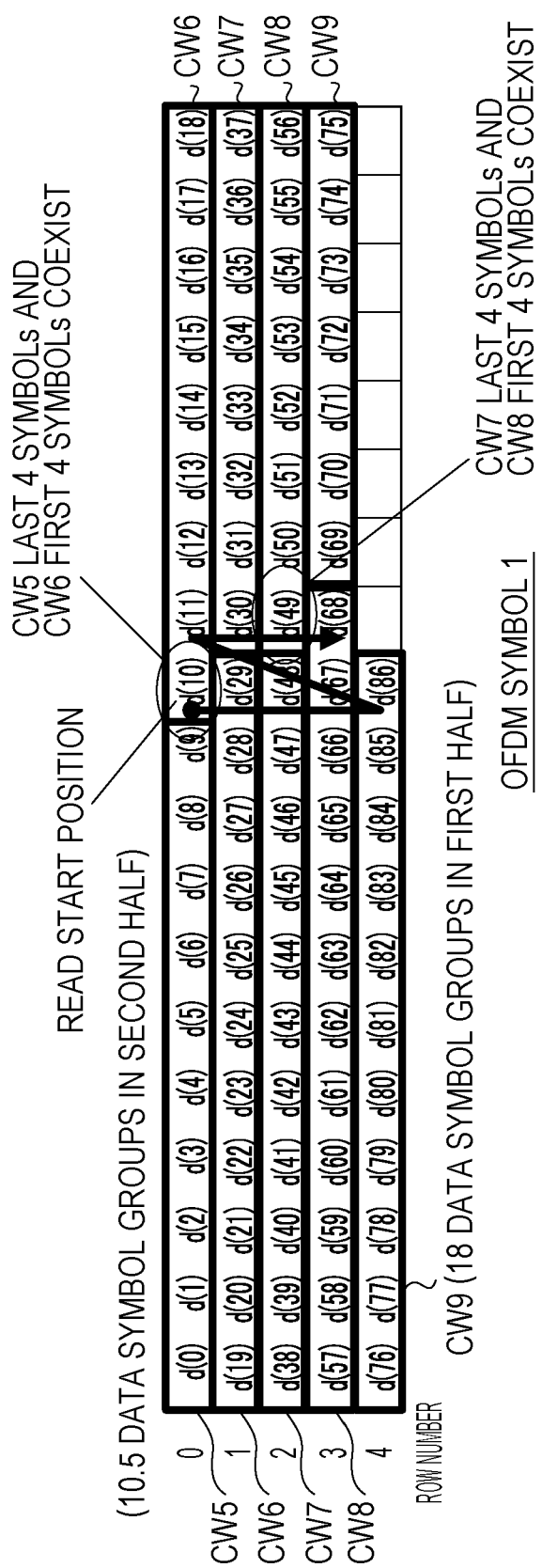
FIG. 25 is a schematic illustration of another example of the operation performed by the interleaver for OFDM symbol 1 according to the first embodiment.

FIG. 24 and FIG. 25 are diagrams illustrating another example in which the interleaver 104 performs interleaving. As in FIG. 20 and FIG. 21, in FIG. 24 and FIG. 25, since the number of symbols per code word ($L_{CW}/N_{CBPS}$) is not a multiple of the number of symbols per data symbol group ($N_S$), the data symbols of a plurality of code words coexist in a data symbol group. Such a case is described below. Description is given below with reference to the interleaver 104 using the procedure in FIG. 9A. However, the same effects can be provided even in the case where the interleaver 104 uses FIG. 9B and FIG. 9C.

FIG. 24 illustrates an example in which the interleaver 104 performs interleaving on OFDM symbol 0 (q=0) when $N_{SD}$=728, $L_{CW}$=624, and $N_{CBPS}$=4. The interleaver 104 performs row-by-row writing as illustrated in FIG. 5A. Note that an arrow indicating the writing order is not illustrated in FIG. 20. In addition, the interleaver 104 performs row-by-row writing in the same manner as in FIGS. 5B, 10A, and 12. In FIG. 20, the arrow indicating the reading order is illustrated for only the first two columns to indicate the read positions but not for the remaining columns.

In step S1001, the interleaver 104 calculates the values of $N_x$ and $N_y$ by using the following Eq. 29 and Eq. 30:

[Math. 32]

$$N_y = \lfloor L_{CW} / N_{CBPS} / N_S \rfloor \qquad \text{Eq. 29}$$

[Math. 33]

$$N_x = \left\lceil \frac{\lceil N_{SD} / N_S \rceil}{N_y} \right\rceil \qquad \text{Eq. 30}$$

Unlike Eq. 13B, Eq. 29 uses the floor function instead of using the ceiling function. Eq. 30 is the same as Eq. 13C. However, Eq. 30 uses the value of $N_y$ calculated by Eq. 29. In one example, $N_y$ is 19, and $N_x$ is 5.

In FIG. 24, the number of data symbol groups per code word ($L_{CW}/N_{CBPS}/N_S$) is 19.5, which differs from the value of $N_y$ (=19) calculated by the interleaver 104. According to Eq. 29, the value of $N_y$ is a value obtained by rounding down (applying floor to) the number of data symbol groups per code word ($L_{CW}/N_{CBPS}/N_S$). Therefore, the last 4 symbols of code word 1 and the first 4 symbols of code word 2 coexist in the symbol (d(19)) of row number 1 and column number 0. That is, a shift in the correspondence between a row and a code word occurs in the column at the read start position.

FIG. 25 illustrates an example in which the interleaver 104 interleaves the OFDM symbol 1 (q=1) when using the same parameters as in FIG. 24 (for example, $N_{SD}$=728, $L_{CW}$=624, and $N_{CBPS}$=4). As in FIG. 24, an arrow indicating the reading order of two columns including the read start position is illustrated, and an arrow relating to writing and an arrow relating to reading of the remaining columns are not illustrated.

Unlike FIG. 21, in FIG. 25, the interleaver 104 determines the position of the data symbol group including at least one data symbols of CW6 as a read start position (for example, the position of d(10)). That is, in FIG. 21, if a data symbol group (for example, d(6) in FIG. 21) includes a data symbol of another CW (for example, CW5), the interleaver 104 does not select the data symbol group as a read start position. In contrast, in FIG. 25, even when a data symbol group includes a data symbol of another CW (for example, CW5), the interleaver 104 selects the data symbol group as a read start position if the data symbol group includes a data symbol of CW6.

When performing the readout illustrated in FIG. 25, the interleaver 104 uses the following Eq. 31 instead of using Eq. 14 in step S2103 illustrated in FIG. 9B:

[Math. 34]

$$k_{offset}^{(q)} = \left\lfloor \frac{qN_{SD} \times N_{CBPS}}{L_{CW}} \right\rfloor \times \frac{L_{CW}}{N_{CBPS}} - qN_{SD} \qquad \text{Eq. 31}$$

The interleaver 104 uses the ceiling function in Eq. 14, while the interleaver 104 uses the floor function in Eq. 31.

Figure 26:
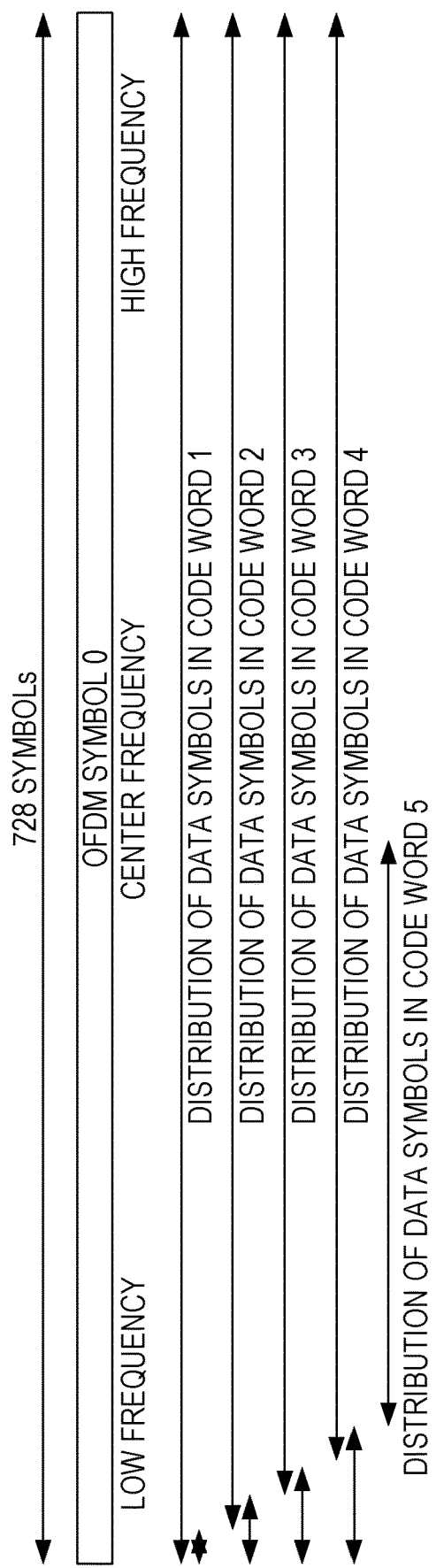
FIG. 26 illustrates a distribution of data symbols of each of code words in OFDM symbol 0 according to the first embodiment.
Figure 27:
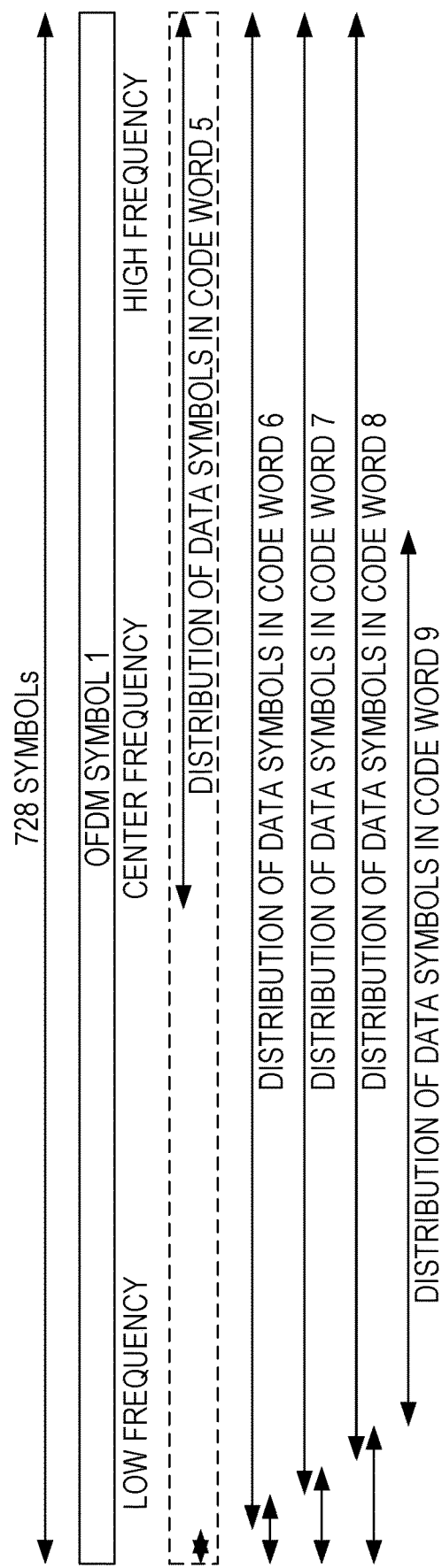
FIG. 27 illustrates a distribution of data symbols of each of code words in OFDM symbol 1 according to the first embodiment.

FIG. 26 and FIG. 27 are diagrams illustrating distributions of data symbols of code words in the frequency domain when the interleaver 104 interleaves OFDM symbols 0 and 1 illustrated in FIGS. 24 and 25, respectively.

In step S1001 illustrated in FIGS. 9A and 9B, the interleaver 104 determines the number of columns $N_y$ on the basis of the number of symbols per code word. Thus, code words 1, 2, 3, 4, 6, 7, and 8 are widely distributed among the low-frequency to high-frequency subcarriers of the OFDM symbol and are allocated.

In step S2003 illustrated in FIG. 9A and step S2103 illustrated in FIG. 9B, the interleaver 104 determines the read start position in accordance with the number of data subcarriers ($N_{SD}$) of the OFDM symbol and the number of symbols per code word ($L_{CW}/N_{CBPS}$). As a result, when a code word is divided and allocated into a plurality of OFDM symbols, frequency overlapping in the code word is reduced. Thus, the code word can be widely distributed among the low-frequency to high-frequency subcarriers of the OFDM symbols and are allocated.

Note that in FIG. 26 and FIG. 27, in the subcarriers of some of the frequencies, overlapping of the distribution of data symbols of code word 5 occurs in accordance with the amount of shift. However, the interleaver 104 determines the readout initial value so that the shift amount is not accumulated for each of the OFDM symbols (refer to, for example, Eq. 31, Eq. 19, and Eq. 20A). Therefore, the amount of shift can be set to a value smaller than the number of subcarriers of the OFDM symbol and, thus, performance degradation due to overlapping of the data symbol distribution can be reduced.

In addition, in FIG. 26 and FIG. 27, the interleaver 104 allocates the data symbol groups in each of the code words to the subcarriers of the OFDM symbol while maintaining the ordinal positions of the data symbol groups in the code word except for the last portion of the code word.

For example, in FIG. 25, for code word 6, the last portion (d(29)) of code word 6 is read prior to d(11) to d(28), and for code word 7, the last portion (d(48)) of code word 7 is read prior to d(30) to d(47). Thus, in FIG. 27, for code word 6, the ordinal positions of the data symbol groups corresponding to d(11) to d(28) are maintained. For the code word 7, the ordinal positions of the data symbol groups corresponding to d(30) to d(47) are maintained.

In this manner, when the communication apparatus 100 receives FIG. 26 and FIG. 27, the deinterleaver 116 can easily output data while maintaining the ordinal positions of the data symbols of each of the code words. Accordingly, the circuit configuration of each of the demodulation circuit 117 and the FEC decoding circuit 118 located downstream of the deinterleaver 116 can be simplified. In addition, since the communication apparatus 100 can easily perform parallel processing for each of the code words, the data throughput can be increased.

Operation Example 6

Figure 28:
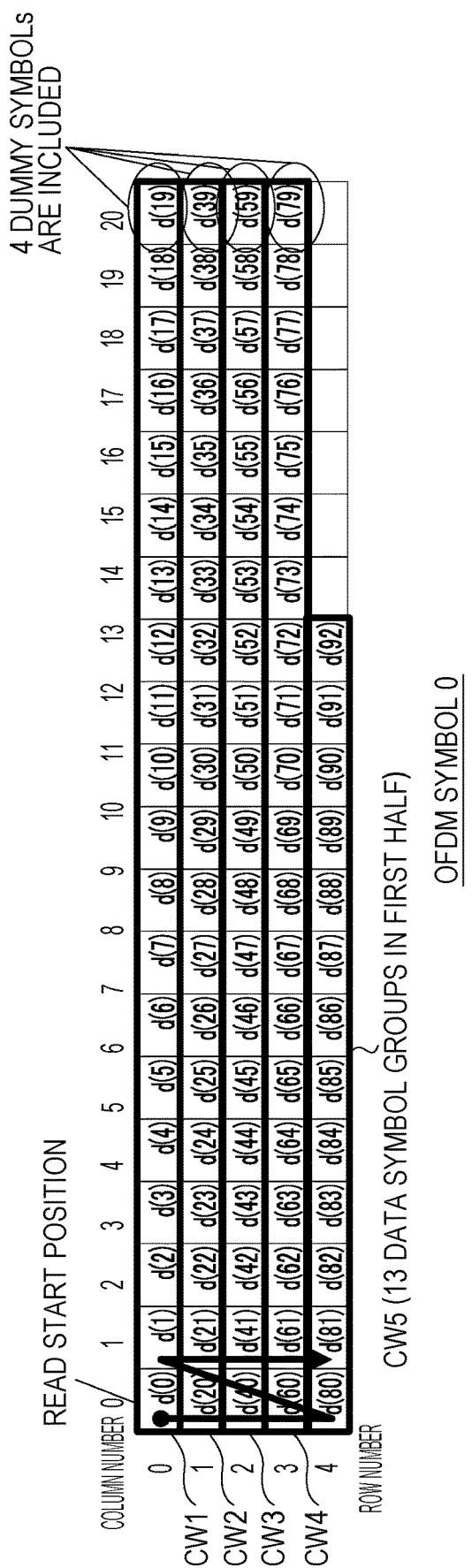
FIG. 28 is a schematic illustration of another example of the operation performed by the interleaver for OFDM symbol 0 according to the first embodiment.
Figure 29:
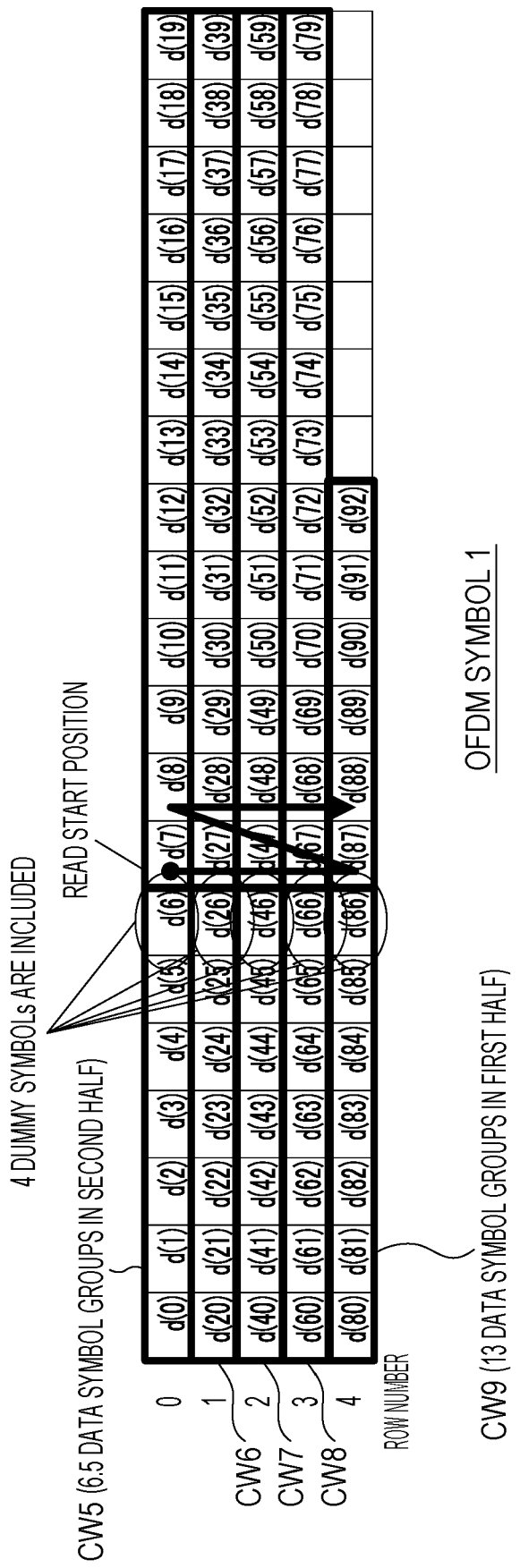
FIG. 29 is a schematic illustration of another example of the operation performed by the interleaver for OFDM symbol 1 according to the first embodiment.

FIG. 28 and FIG. 29 are diagrams illustrating another example in which the interleaver 104 performs interleaving. The case where as in FIG. 20 and FIG. 21, the number of symbols per code word ($L_{CW}/N_{CBPS}$) is not a multiple of the number of symbols per data symbol group ($N_S$) is described with reference to FIG. 28 and FIG. 29. Description is given below with reference to the interleaver 104 using the procedure in FIG. 9A. However, the same effects can be provided even in the case where the interleaver 104 uses FIG. 9B and FIG. 9C.

FIG. 28 illustrates an example in which the interleaver 104 performs interleaving on OFDM symbol 0 (q=0) when $N_{SD}$=728, $L_{CW}$=624, and $N_{CBPS}$=4. As in FIG. 21, in FIG. 28, an arrow indicating the writing order is not illustrated, and an arrow indicating the reading order is illustrated for only the first two columns to indicate the read positions but not for the remaining columns.

In step S1001, the interleaver 104 calculates the number of columns $N_y$ by using Eq. 13B. In addition, the interleaver 104 calculates the number of padding symbols $N_{yd}$ by using the following Eq. 32:

[Math. 35]

$$N_{yd}=N_y N_S - L_{CW}/N_{CBPS} \qquad \text{Eq. 32}$$

In step S1002, the interleaver 104 writes the data symbol groups in the row direction. Note that at the last column, the interleaver 104 adds and writes a padding symbol in the row direction. For example, if $N_S$ is 8 and $N_{yd}$ is 4, then the interleaver 104 may set, in the data symbol group in the last column (for example, d(19), d(39), d(59), d(79)), $N_S - N_{yd}$ data symbols (for example, 4 data symbols) and set, in the remaining 4 symbols, vacant spaces, dummy symbols, or padding symbols, for example.

In this manner, the first data symbol group of each of the code words is allocated to column number 0.

FIG. 29 illustrates an example in which the interleaver 104 interleaves OFDM symbol 1 (q=1) when using the same parameters (for example, $N_{SD}$=728, $L_{CW}$=624, $N_{CBPS}$=4) as in FIG. 24. As in FIG. 28, an arrow indicating the reading order of two columns including the read start position is illustrated, and an arrow relating to writing and an arrow relating to reading of the remaining columns are not illustrated.

In step S1002, the interleaver 104 writes data symbol groups in the row direction. The interleaver 104 adds and writes padding symbols into the data symbol groups (for example, d(6), d(26), d(46), d(66), d(86)) in the column preceding the column including the read start position (the last column if the read start position is in the first column). In this manner, the first data symbol group of each of the code words is allocated to the column including the read start position.

In FIG. 28 and FIG. 29, the interleaver 104 calculates the read start position by using the following Eq. 33 instead of using Eq. 14:

[Math. 36]

$$k_{offset}^{(q)} = \left\lceil \frac{q(N_{SD}+(N_x-1)\times N_{yd})\times N_{CBPS}}{L_{Cw}} \right\rceil \times \frac{L_{CW}}{N_{CBPS}} - q(N_{SD}+(N_x-1)\times N_{yd}) \qquad \text{Eq. 33}$$

In FIG. 28 and FIG. 29, the interleaver 104 may use the following Eq. 34, which is a modification of Eq. 18, instead of using Eq. 33:

[Math. 37]

$$k_{offset}^{(q)}=(k_{offset}^{(q-1)}-(N_{SD}+(N_k-1)\times N_{yd})) \bmod (L_{CW}/N_{CBPS}+N_{yd}), k_{offset}^{(0)}=0 \qquad \text{Eq. 34}$$

Eq. 34 is an equation in which $L_{CW}/N_{CBPS}$ (corresponding to the number of symbols per code word) in Eq. 18 is replaced by $L_{CW}/N_{CBPS}+N_{yd}$ (corresponding to the number of symbols per code word including dummy symbols).

Since the total number of dummy symbols included in the OFDM symbol is $(N_x-1)\times N_{yd}$, Eq. 33 is an equation in which $N_{SD}$ in Eq. 14 is replaced with $N_{SD} (N_x-1)\times N_{yd}$.

Like the method illustrated in FIG. 10A and FIG. 11A, according to the method illustrated in FIG. 28 and FIG. 29, the interleaver 104 can widely distribute the data symbols of each of the code words among the low-frequency to high-frequency subcarriers of the OFDM symbol. Thus, the communication quality can be improved.

In addition, like the method illustrated in FIG. 10A and FIG. 11A, according to the method illustrated in FIG. 28 and FIG. 29, the interleaver 104 allocates the data symbols of each of the code word to the subcarriers while maintain the ordinal positions of the data symbols in the code word. As a result, when the communication apparatus 100 receives a packet, the configuration of the processing (for example, the demodulation circuit 117 and the FEC decoding circuit 118) downstream of the deinterleaver 116 can be simplified, and parallel processing can be easily performed. Thus, the circuit scale can be reduced, and the data throughput can be improved.

Modification of First Embodiment

Figure 30:
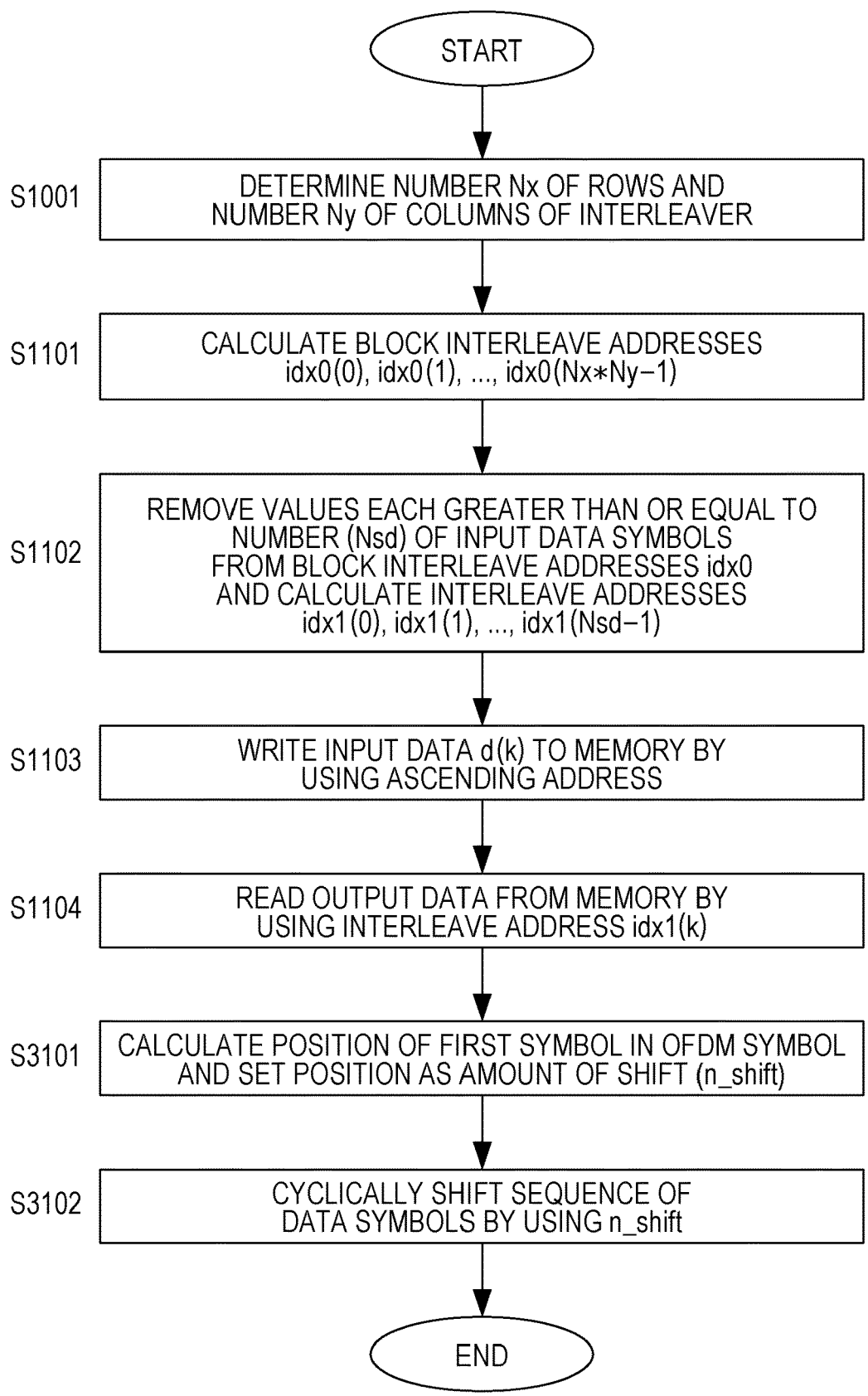
FIG. 30 is a flowchart illustrating an interleaving procedure according to a modification of the first embodiment.

FIG. 30 is a flowchart illustrating an interleaving method that the interleaver 104 of the communication apparatus 100 uses and that differs from the method illustrated in FIG. 9A, FIG. 9B, and FIG. 9C. According to the procedure illustrated in FIG. 9B, the interleaver 104 calculates the readout address by adding an offset ($n_{offset}^{(q)}$) to the interleave address (idx1(n)). In contrast, according to the procedure illustrated in FIG. 30, the interleaver 104 performs interleaving in which as in FIG. 4B, an offset is not added. The interleaver 104 performs cyclic shift on the data subjected to interleaving in accordance with the offset value ($n_{offset}^{(q)}$).

Adding an offset at the time of address calculation as illustrated in FIG. 9B corresponds to performing cyclic shift on data in accordance with the offset value. Therefore, in the interleaver 104 of the communication apparatus 100, the order in which the data symbols are output is the same regardless of which of the methods illustrated in FIG. 9A, FIG. 9B, FIG. 9C, and FIG. 30 is employed.

As in step S1001 illustrated in FIG. 9B, in step S1001 illustrated in FIG. 30, the interleaver 104 calculates the number of columns ($N_y$) and the number of rows ($N_x$) of the interleaver by using Eq. 9 and Eq. 12. Note that if the size ($N_S$) of the data symbol group is 1, the interleaver 104 may use, instead of using Eq. 9 and Eq. 12, the following Eq. 35 and Eq. 36:

[Math. 38]
$$N_y = L_{CW}/N_{CBPS} \qquad \text{Eq. 35}$$

[Math. 39]
$$N_x = \left\lceil \frac{N_{SD}}{N_y} \right\rceil \qquad \text{Eq. 36}$$

As in step S1101 illustrated in FIG. 4B, in step S1101 illustrated in FIG. 30, the interleaver 104 calculates a block interleave address idx0 by using Eq. 13A.

Instead of using Eq. 13A, the interleaver 104 may use the following Eq. 37:

[Math. 40]
$$idx0(j \times N_x - i) = N_y \times i + j, i=0,1,\ldots,N_x-1, j=0, 1,\ldots,N_y-1 \qquad \text{Eq. 37}$$

As in step S1102 illustrated in FIG. 4B, in step S1102 illustrated in FIG. 30, the interleaver 104 removes a value greater than or equal to the number of input data symbols ($N_{SD}$) from the block interleave addresses idx0 and calculates interleave addresses idx1(0), idx1(1), idx1($N_{SD}$-1).

As in step S1103 illustrated in FIG. 4B, in step S1103 illustrated in FIG. 30, the interleaver 104 writes the input data d(k) to the memory by using the ascending address.

As in step S1104 illustrated in FIG. 4B, in step S1104 illustrated in FIG. 30, the interleaver 104 reads the input data d(k) from the memory by using idx1(n).

As in step S2103 illustrated in FIG. 9B, in step S3101 illustrated in FIG. 30, the interleaver 104 calculates the value of $k_{offset}^{(q)}$ by using Eq. 14, calculates the value of $N_L$ by using Eq. 19, and calculates the value of $n_{offset}^{(q)}$ as the amount of shift (n_shift) by using Eq. 20A.

Note that if the size ($N_S$) of the data symbol group is 1, the interleaver 104 may calculate the value of NL by using the following Eq. 38 instead of using Eq. 19:

[Math. 41]
$$N_L = N_{SD} \bmod N_y \qquad \text{Eq. 38}$$

In addition, if the size ($N_S$) of the data symbol group is 1, the interleaver 104 may calculate the value of $n_{offset}^{(q)}$ by using the following Eq. 39 instead of using Eq. 20A:

[Math. 42]
$$n_{offset}^{(q)} = \begin{cases} k_{offset}^{(q)} \times N_x & \text{if } k_{offset}^{(q)} \leq N_L \\ k_{offset}^{(q)} \times (N_x - 1) + N_L & \text{if } k_{offset}^{(q)} > N_L \end{cases} \qquad \text{Eq. 39}$$

Furthermore, the interleaver 104 may calculate the value of $n_{offset}^{(q)}$ by using the following Eq. 40 instead of using Eq. 20A:

[Math. 43]
$$n_{offset}^{(q)} = idx^{-1}\left(\left\lfloor \frac{k_{offset}^{(q)}}{N_S} \right\rfloor\right) + (k_{offset}^{(q)} \bmod N_S) \qquad \text{Eq. 40}$$

In Eq. 40, $idx^{-1}(k)$ represents the inverse function of idx(k) and satisfies the following Eq. 41:

[Math. 44]
$$k = idx(idx^{-1}(k)) = idx^{-1}(idx(k)) \qquad \text{Eq. 41}$$

In addition, if the size ($N_S$) of the data symbol group is 1, the interleaver 104 may calculate the value of $n_{offset}^{(q)}$ by using the following Eq. 42 instead of using Eq. 40:

[Math. 45]
$$n_{offset}^{(q)} = idx^{-1}(k_{offset}^{(q)}) \qquad \text{Eq. 42}$$

The meaning of Eq. 40 and Eq. 42 is described with reference to FIG. 10A. floor(koffset(q)/NS) represents a column number (for example, 14) of the read start position. The data symbol group of row number 0 and column number (floor(koffset(q)/NS) is data symbol group d(floor(koffset (q)/NS)) that is written in the floor(koffset(q)/NS)th write operation in step S1103. Since the interleaver 104 reads data symbol d(k) in the idx−1(k)th read operation, data symbol group d(floor(koffset(q)/NS)) is read in the idx 1(floor (koffset(q)/NS))th read operation. That is, Eq. 40 and Eq. 42 are obtained.

In step S3102 illustrated in FIG. 30, the interleaver 104 cyclically shifts the array of data symbol groups read in step S1104 by n_shift (=$n_{offset}^{(q)}$) data symbol groups in the left direction (a direction toward index 0).

Figure 31:
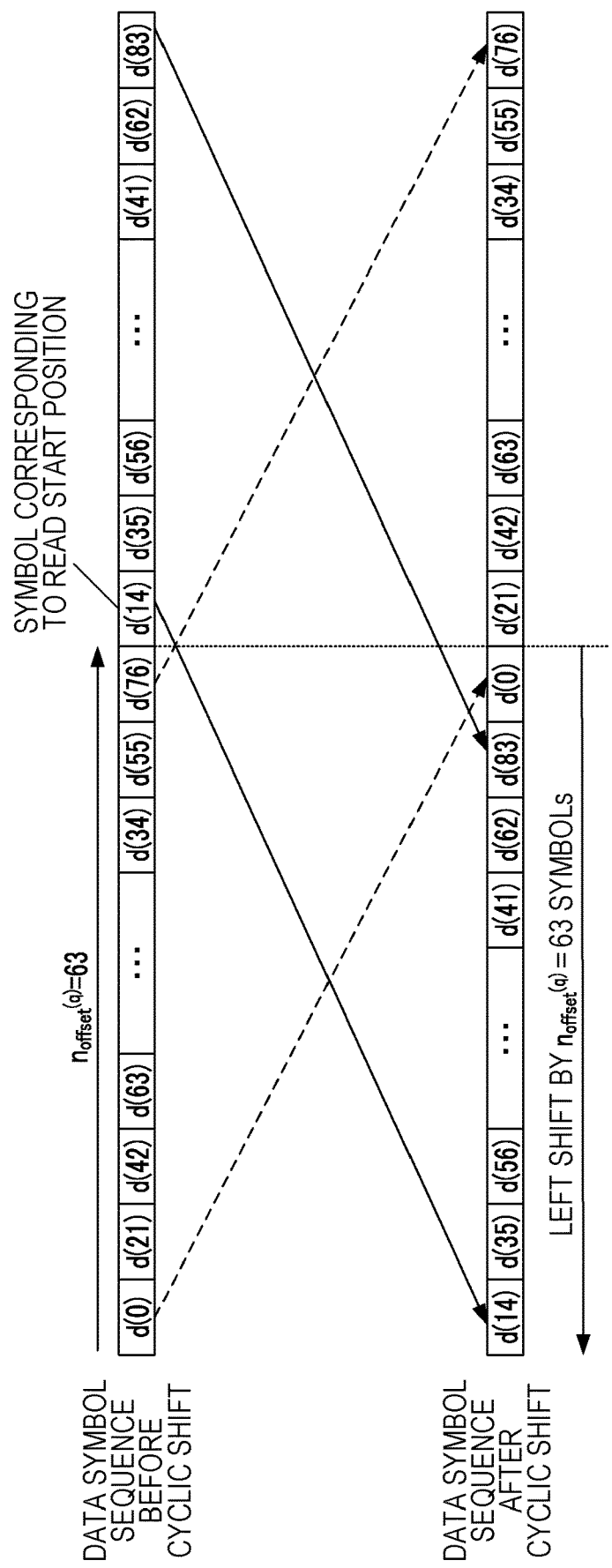
FIG. 31 illustrates an example of a cyclic shift according to a modification of the first embodiment.

FIG. 31 is a diagram illustrating an example of the cyclic shift performed in step S3102. Like, for example, the readout result in FIG. 5B, in the data symbol sequence before cyclic shift is performed, d(0) (that is, d(idx(0))) is the first symbol. When the interleaver 104 performs cyclic shift, a symbol corresponding to the read start position (for example, d(14), that is, d(idx($n_{offset}^{(q)}$))) moves to the beginning of the data symbol sequence.

The value of $n_{offset}^{(q)}$ corresponds to the read start position in FIGS. 10A and FIG. 11A. In steps S1001 to S1104 illustrated in FIG. 30, adjustment of the read start position (corresponding to step 2104 illustrated in FIG. 9B) is not performed, as in the procedure illustrated in FIG. 4B. In this case, the data symbol group corresponding to the read start position in FIG. 10A and FIG. 11A is read in the ($n_{offset}^{(q)}$+1)th read operation in step S1104.

In step S3102, the interleaver 104 can place the data symbol group corresponding to the read start position at the beginning of the output of the interleaver by performing cyclic shift by $n_{offset}^{(q)}$ symbols. As a result, the interleave result that is the same as in the procedure illustrated in FIG. 9B can be obtained.

The procedure illustrated in FIG. 30 is described below with reference to mathematical equations. A data symbol sequence ($d_{in}^{(q)}$) input to the interleaver 104 for OFDM symbol number q (q is a non-negative integer) is expressed by the following Eq. 43:

[Math. 46]

$$d_{in}^{(q)} = \{d_0^{(q)}, d_1^{(q)}, \ldots, d_{N_{SD}-1}^{(q)}\} \quad \text{Eq. 43}$$

The output data symbol sequence ($d_{interleave}^{(q)}$) in step S1104 is obtained by using the following Eq. 44:

[Math. 47]

$$\begin{aligned}
d_{interleave}^{(q)} &= \{di_0^{(q)}, di_1^{(q)}, \ldots, di_{N_{SD}-1}^{(q)}\} \\
&= \{d_{idx(0)}^{(q)}, d_{idx(1)}^{(q)}, \ldots, d_{idx(N_{SD}-1)}^{(q)}\}
\end{aligned} \quad \text{Eq. 44}$$

In Eq. 43, idx(n) is obtained by using the following Eq. 45:

[Math. 48]

$$idx(i \times N_S + j) = idx1(i) \times N_S + j \quad \text{Eq. 45}$$

The output data symbol sequence ($d_{out}^{(q)}$) in step S3102 is obtained by using the following Eq. 46:

[Math. 49]

$$\begin{aligned}
d_{out}^{(g)} &= \left\{ di_{mod(0+n_{offset}^{(q)})}^{(q)}, di_{mod(1+n_{offset}^{(q)})}^{(q)}, \ldots, di_{mod(N_{SD}-1+n_{offset}^{(q)})}^{(q)} \right\} \\
&= \left\{ di_{mod(idx(0)+k_{offset}^{(q)})}^{(q)}, di_{mod(idx(1)+k_{offset}^{(q)})}^{(q)}, \ldots, di_{mod(idx(N_{SD}-1)+k_{offset}^{(q)})}^{(q)} \right\} \\
&= \left\{ d_{idx(mod(0+n_{offset}^{(q)}))}^{(q)}, d_{idx(mod(1+n_{offset}^{(q)}))}^{(q)}, \ldots, d_{idx(mod(N_{SD}-1+n_{offset}^{(q)}))}^{(q)} \right\}
\end{aligned} \quad \text{Eq.46}$$

In Eq. 46, mod(x) represents x mod $N_{SD}$.

In Eq. 46, the first row corresponds to the case where the output data symbol sequence ($d_{interleave}^{(q)}$) in step S1104 is shifted by $n_{offset}^{(q)}$ symbols, as described in step S3102 in FIG. 30. In Eq. 46, the second line is obtained by substituting Eq. 42 and Eq. 44 into the first line. In addition, in Eq. 46, the third line corresponds to the case where the procedure illustrated in FIG. 9B is used, that is, the case where an offset is added at the time of address (idx) calculation.

The interleaver 104 may generate an output data sequence by using any one of the first, second, and third lines of Eq. 46.

Note that in step S3102 illustrated in FIG. 30, the interleaver 104 may reverse the order of the data symbol sequence instead of cyclically shifting the data symbol sequence. The following Eq. 47 is an example of an equation for calculating the output data symbol sequence ($d_{out}^{(q)}$):

[Math. 50]

$$d_{out}^{(q)} = \{di_{N_{SD}-1}^{(q)}, di_{N_{SD}-2}^{(q)}, \ldots, di_0^{(q)}\} \quad \text{Eq. 47}$$

Figure 32:
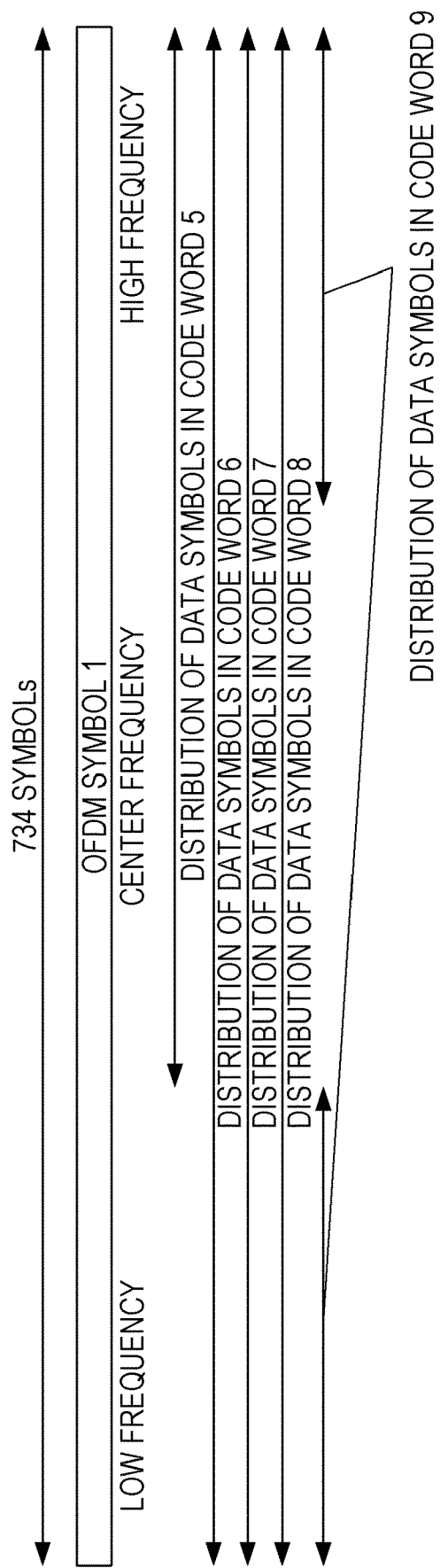
FIG. 32 is a diagram illustrating a distribution of data symbols of each of code words in OFDM symbol 1 according to a modification of the first embodiment.

FIG. 32 is a diagram illustrating the distribution of data symbols in each of the code words in the frequency domain when the interleaver 104 performs interleaving by using Eq. 47. By using Eq. 47, the distribution of data symbols is reversed horizontally as compared with FIG. 7B, and the distribution of data symbols of code word 5 is allocated to the high-frequency side. For this reason, overlapping with the data symbol distribution of code word 5 in the previous OFDM symbol (OFDM symbol 0) (FIG. 6B) is reduced and, thus, the communication quality in a multipath environment can be improved.

As described above, according to the modification of the first embodiment, the interleaver 104 cyclically shifts the data read from the memory and allocates the first data symbol group in a code word to a first subcarrier. For this reason, the overlapping of the frequency distributions of data symbols of code words allocated across a plurality of OFDM symbols is reduced, and the communication quality in a multipath environment can be improved.

Second Embodiment

Figure 33:
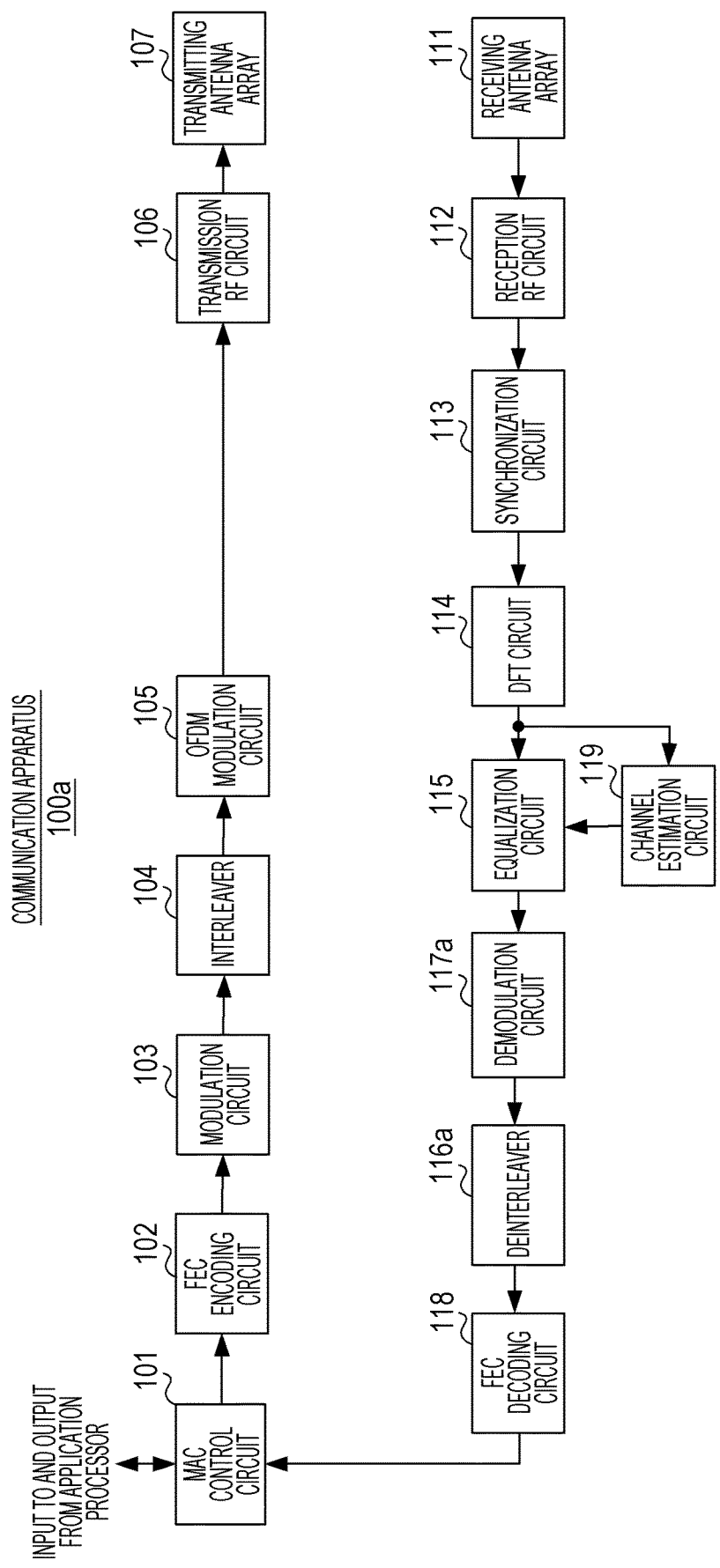
FIG. 33 is a block diagram illustrating an example of the configuration of a communication apparatus according to a second embodiment.

FIG. 33 is a block diagram illustrating the configuration of a communication apparatus 100a according to the second embodiment. As compared with the communication apparatus 100 according to the first embodiment, the order of a demodulation circuit 117a and a deinterleaver 116a is reversed. That is, in the communication apparatus 100a, the output of the equalization circuit 115 is connected to the demodulation circuit 117a, and the output of the demodulation circuit 117a is connected to the deinterleaver 116a. The output of the deinterleaver 116a is output to the FEC decoding circuit 118.

The deinterleaver 116a illustrated in FIG. 33 is a circuit that deinterleaves data interleaved according to the procedure illustrated in FIGS. 4A, 4B, 4C, 9A, 9B, 9C, or 30, for example.

The demodulation circuit 117a outputs $N_{CBPS}$ pieces of likelihood information (for example, LLR, Log Likelihood Ratio) for each of input data symbols. For example, the demodulation circuit 117a generates a sequence e(n× $N_{CBPS}$), e(n×$N_{CBPS}$+1), e(n×$N_{CBPS}$+$N_{CBPS}$−1) of $N_{CBPS}$ LLRs from the data symbol d(n).

The deinterleaver 116a regards $N_{CBPS}$ LLRs as one data symbol and performs deinterleaving. For example, the deinterleaver 116a reorders a sequence of $N_{SD}$×$N_{CBPS}$ LLRs, that is, e(idx(0+$n_{offset}^{(q)}$)), e(idx(0+$n_{offset}^{(q)}$)+1), ..., e(idx(0+$n_{offset}^{(q)}$)+$N_{CBPS}$−1), e(idx(1+$n_{offset}^{(q)}$)), e(idx(1+$n_{offset}^{(q)}$)+1), ..., e(idx(1+$n_{offset}^{(q)}$)+$N_{CBPS}$−1), e(idx($N_{SD}$−1+$n_{offset}^{(q)}$)), e(idx($N_{SD}$−1+$n_{offset}^{(q)}$)+1), ..., e(idx($N_{SD}$−1+$n_{offset}^{(q)+N}$$_{CBPS}$−1)) and outputs e(0), e(1), ..., e($N_{SD}$× $N_{CBPS}$−1). Note that "mod" is not written above, and idx ((x+k) mod $N_{SD}$) is simply denoted as "idx(x+k)".

Alternatively, when the above description is given by using the inverse function $idx^{-1}(k)$ of idx(k), the deinterleaver 116a reorders the LLR sequence e(0), e(1), ..., e(i×$N_{CBPS}$+j), e($N_{SD}$×$N_{CBPS}$−1) and moves the (i×$N_{CBPS}$+ j)th LLR (e(i×$N_{CBPS}$+j)) to the (idx$^{-1}$(mod(i+$k_{offset}^{(q)}$, $N_{SD}$))×$N_{CBPS}$+j)th position. Thereafter, the deinterleaver 116a outputs the LLR sequence.

Figure 34:
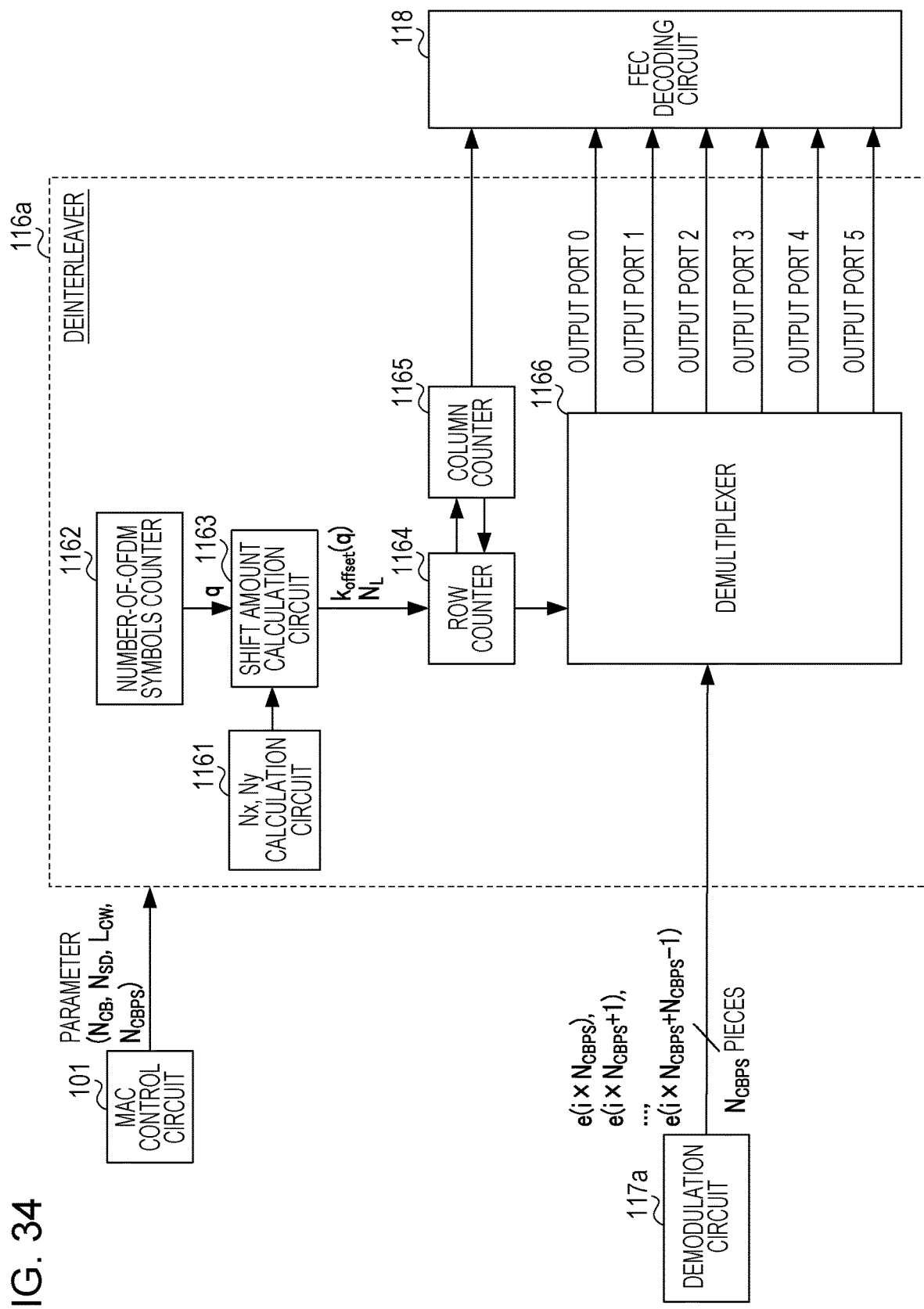
FIG. 34 is a block diagram illustrating an example of the configuration of a deinterleaver according to the second embodiment.

FIG. 34 is a diagram illustrating an example of the circuit configuration of the deinterleaver 116a. The deinterleaver 116a includes an $N_x$, $N_y$ calculation circuit 1161, a number-of-OFDM symbols counter 1162, a shift amount calculation circuit 1163, a row counter 1164, a column counter 1165, and a demultiplexer 1166.

The $N_x$, $N_y$ calculation circuit 1161 calculates the number of rows $N_x$ and the number of columns $N_y$ of the two-dimensional array by using Eq. 9 and Eq. 12, Eq. 13B and Eq. 13C, and Eq. 35 and Eq. 36 and inputs $N_x$ and $N_y$ to the shift amount calculation circuit 1163 (corresponding to step S1001 illustrated in FIG. 30).

The number-of-OFDM symbols counter 1162 determines the value of the OFDM symbol number (q) in accordance with the number of LLRs input from the demodulation circuit 117a and inputs the determined value to the shift amount calculation circuit 1163.

The shift amount calculation circuit 1163 calculates the value of $N_L$ by using Eq. 19 and Eq. 38 and calculates the value of the amount of shift (n_shift=$n_{offset}^{(q)}$) by using Eq. 20A, Eq. 40, and Eq. 42 (corresponding to step S3101 illustrated in FIG. 30).

The row counter 1164 and the column counter 1165 calculate the row number and the column number in an interleaver matrix corresponding to an LLR input from the demodulation circuit 117a. For example, FIG. 10A illustrates the output order for the interleaver and illustrates the input order for the deinterleaver. For example, if d(14) is input to the deinterleaver 116a at time 0, the row number at time 0 is 0, and the column number is 14. In addition, for example, if d(35) is input to the deinterleaver 116a at time 1, the row number at time 1 is 1 and the column number is 14.

Figure 35:
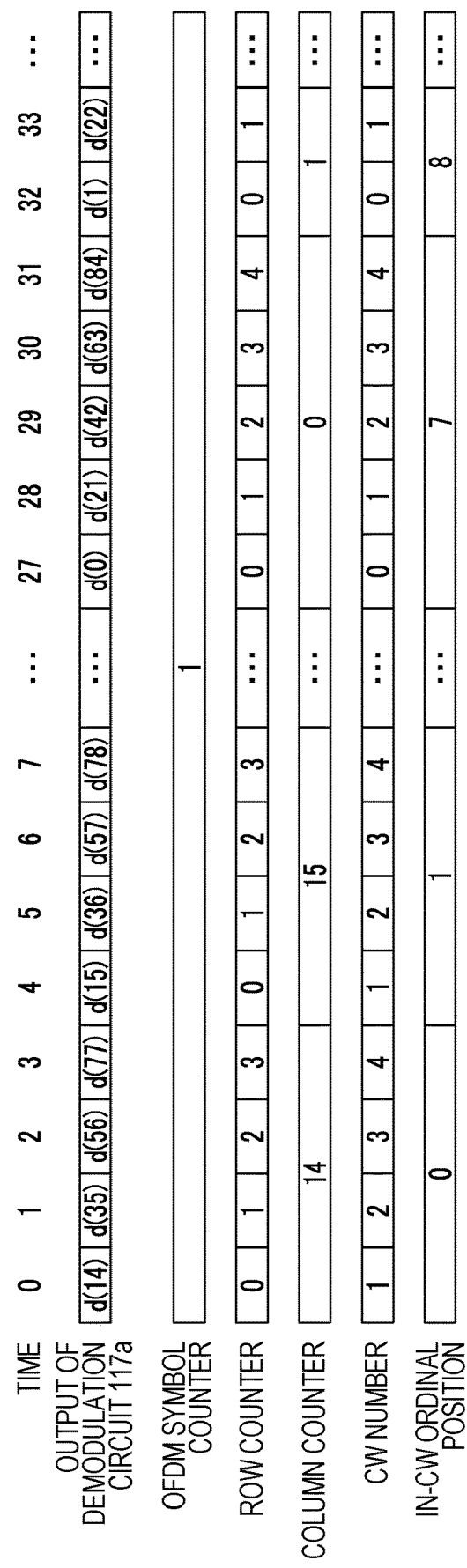
FIG. 35 illustrates an example of the operations performed by a row counter and a column counter according to the second embodiment.

FIG. 35 illustrates an example of the operation performed by the row counter 1164 and the column counter 1165. The case where the value (q) of the OFDM symbol counter is 1 is described below as an example.

If the data symbol groups input from the demodulation circuit 117a are d(14), d(35), d(56) and d(77) at times 0, 1, 2, and 3, respectively, the column number is 14 by referring to FIG. 10A. In addition, the row numbers are 0, 1, 2, and 3 at times 0, 1, 2, and 3, respectively.

The row counter 1164 outputs a code word number (a CW number) corresponding to the data symbol group input from the demodulation circuit 117a. For example, since the OFDM symbol when q is 1 includes code words 5, 6, 7, 8, and 9, CW numbers 0, 1, 2, 3, 4 may be associated with code words 5, 6, 7, 8, and 9, respectively. For example, as illustrated in FIG. 7A, since the data symbol group d(14) is data of code word 6, the row counter 1164 outputs the CW number 1 at time 0.

When the value of the column counter exceeds floor($k_{offset}^{(q)}/N_S$), the CW number is a value obtained by adding 1 to the value of the row counter. In addition, if the value of the column counter is less than or equal to floor($k_{offset}^{(q)}/N_S$), the CW number is equal to the value of the row counter.

In this manner, the row counter 1164 of the deinterleaver 116a can easily identify the CW number from the value of the row counter, the value of the column counter, and the value of $k_{offset}^{(q)}$. This effect is obtained from the interleaver 104 of the communication apparatus 100 that determines the number of columns ($N_y$) on the basis of the code word size ($L_{CW}$), adds an offset ($n_{offset}^{(q)}$) to the interleave address, and performs interleaving so that the first data symbol group of code word 6 is allocated to the beginning of a subcarrier.

In addition, the column counter 1165 calculates the ordinal position in code word (the in-CW ordinal position) corresponding to the data symbol group input from the demodulation circuit 117a. For example, since the data symbol group d(14) is the first data in code word 6, the in-CW ordinal position is 0. In addition, for example, since the data symbol group d(15) is the data group next to d(14) in code word 6, the in-CW ordinal position is 1.

The column counter 1165 may calculate the in-CW ordinal position ($n_{CW}$) by using the following Eq. 48:
[Math. 51]

$$\text{(In-CW ordinal position)}=(\text{row counter value}-k_{offset}^{(q)})\bmod N_y \qquad \text{Eq. 48}$$

In this manner, the column counter 1165 of the deinterleaver 116a can easily identify the in-CW ordinal position from the value of the column counter and the value of $k_{offset}^{(q)}$. This effect can be obtained by the interleaver 104 of the communication apparatus 100 that determines the number of columns ($N_y$) on the basis of the code word size ($L_{CW}$), adds an offset ($n_{offset}^{(q)}$) to the interleave address, and performs interleaving so that the first data symbol group of code word 6 is allocated to the beginning of a subcarrier.

The demultiplexer 1166 selects one of output port 0 to output port 5 on the basis of the CW number calculated by the row counter 1164 and outputs the LLR input from the demodulation circuit 117a to the selected output port. For example, since the CW number of data symbol group d(14) is 1 (corresponding to code word 6), the demultiplexer 1166 outputs the LLR to output port 1.

The FEC decoding circuit 118 stores the LLR output from the deinterleaver 116a in an LDPC decoding buffer memory (not illustrated) on the basis of which one of output ports 0 to 5 the data is output from and the in-CW ordinal position output from the column counter 1165.

In this manner, the deinterleaver 116a can perform deinterleaving without a deinterleaving memory provided therein.

Note that the deinterleaver 116a may output the CW number to the FEC decoding circuit 118 instead of having the demultiplexer 1166 provided therein. The FEC decoding circuit 118 may store LLRs input from the deinterleaver 116a or the demodulation circuit 117a in an LDPC decoding buffer memory (not illustrated) by using the CW number and information regarding the in-CW ordinal position.

As described above, the deinterleaver 116a calculates the CW number and the in-CW ordinal position corresponding to the data interleaved in accordance with, for example, the procedure illustrated in FIG. 4A, FIG. 4B, FIG. 4C, FIG. 9A, FIG. 9B, FIG. 9C, or FIG. 30 and outputs the CW number and the in-CW ordinal position to the FEC decoding circuit. As a result, the communication apparatus 100a can perform deinterleaving with a simple configuration and, thus, the communication apparatus 100a can reduce processing delay and can reduce the circuit scale and power consumption.

Summary of Embodiment

According to an aspect of the present disclosure, a transmission apparatus includes an interleaver circuit that interleaves first to Nth code words, an OFDM modulation circuit that converts the interleaved first to Nth code words into OFDM signals, and a transmission circuit that transmits the OFDM signals. The number of data symbols included in the first code word is less than the number of data symbols included in the second code word, and the interleaver circuits writes the first code word to the Nth code word in ascending order and starts reading from the second code word.

According to an aspect of the present disclosure, the interleaver circuit has a memory size of $N_x \times N_y$, wherein $N_y$ is the same as the number of data symbols included in the second code word.

According to an aspect of the present disclosure, the interleaver circuit reads the second code word by using an address that is obtained by shifting, in accordance with the number of data symbols included in the first code word, an interleave address generated in accordance with an interleave size.

According to an aspect of the present disclosure, a reception apparatus includes a reception circuit that receives OFDM signals including first to Nth code words interleaved by a transmission apparatus, a DFT circuit that extracts the interleaved first to Nth code words from the OFDM signals, and a deinterleaver circuit that deinterleaves the interleaved first to Nth code words. The number of data symbols included in the first code word is less than the number of data symbols included in the second code word. The interleaved first to Nth code words are written in ascending order by an interleaver circuit of the transmission apparatus, and reading is started from the second code word so that the interleaved first to Nth code words are generated.

According to an aspect of the present disclosure, the deinterleaver has a memory size of $N_x \times N_y$, wherein $N_y$ is the same as the number of data symbols included in the second code word.

According to an aspect of the present disclosure, the interleaver circuit reads the second code word by using an address that is obtained by shifting, in accordance with the number of data symbols included in the first code word, an interleave address generated in accordance with an interleave size.

According to an aspect of the present disclosure, a transmission method includes interleaving first to Nth code words, converting the interleaved first to Nth code words into OFDM signals, and transmitting the OFDM signals. The number of data symbols included in the first code word is less than the number of data symbols included in the second code word, and the first code word to the Nth code word are written in ascending order, and reading is started from the second code word.

According to an aspect of the present disclosure, a reception method includes receiving OFDM signals including first to Nth code words interleaved by a transmission apparatus, extracting the interleaved first to Nth code words from the OFDM signals, and deinterleaving the interleaved first to Nth code words. The number of data symbols included in the first code word is less than the number of data symbols included in the second code word. The interleaved first to Nth code words are written in ascending order by an interleaver circuit of the transmission apparatus, and reading is started from the second code word so that the interleaved first to Nth code words are generated.

Note that the present disclosure can be implemented by software, hardware, or software in cooperation with hardware. Each of the functional blocks used in the description of the above embodiments is partially or entirely implemented in the form of an LSI, which is an integrated circuit, and each of the processes described in the above embodiment may be partially or totally controlled by a single LSI or a combination of LSIs. The LSI may be configured from individual chips or may be configured from a single chip so as to include some or all of the functional blocks. The LSI may have a data input and a data output. The LSI is also referred to as an "IC", a "system LSI", a "super LSI" or an "ultra LSI" depending on the level of integration. In addition, the method for circuit integration is not limited to LSI, and the circuit integration may be achieved by dedicated circuitry, a general-purpose processor, or a dedicated processor. Alternatively, an FPGA (Field Programmable Gate Array), which is programmable after fabrication of the LSI, or a reconfigurable processor which allows reconfiguration of connections and settings of circuit cells in LSI may be used. The present disclosure may be implemented as digital processing or analog processing. Moreover, should a circuit integration technology replacing LSI appear as a result of advancements in semiconductor technology or other technologies derived from the technology, the functional blocks could be integrated using such a technology. Another possibility is the application of biotechnology, for example.

INDUSTRIAL APPLICABILITY

One aspect of the present disclosure is useful for a communication system.

REFERENCE SIGNS LIST 100, 100a communication apparatus
101 MAC control circuit
102 FEC encoding circuit
103 modulation circuit
104, 104a, 104b, 104c interleaver
105, 105a OFDM modulation circuit
106 transmission RF circuit
107 transmission antenna array
111 reception antenna array
112 reception RF circuit
113 synchronization circuit
114 DFT circuit
115 equalization circuit
116, 116a deinterleaver
117, 117a demodulation circuit
118 FEC decoding circuit
119 channel estimation circuit
1040, 1052 memory
1041, 1041a address counter
1042, 1161 $N_x$, $N_y$ calculation circuit
1043, 1162 number-of-OFDM symbols counter
1044, 1044a, 1163 shift amount calculation circuit
1045 block interleave address idx0 generation circuit
1046 interleave address idx1 generation circuit
1047, 1047a address shift circuit
1048 deinterleave address table memory
1051 data subcarrier address calculation circuit
1053 pilot and guard subcarrier insertion circuit
1054 address generation circuit
1055 IDFT circuit
1056 CP addition and window function circuit
1164 row counter
1165 column counter
1166 demultiplexer

The invention claimed is:

1. A transmission apparatus comprising:
an interleaver circuit that interleaves first to Nth code words (N is an integer of 2 or greater), a number of data symbols included in the first code word being less than a number of data symbols included in the second code word, wherein the interleaving is performed by:

writing a first set of data symbols included in the first code word to an Nth set of data symbols included in the Nth code word in a row direction in an ascending order; and
reading the first set of written data symbols to the Nth set of written data symbols in a column direction starting from a first data symbol of a second set of data symbols included in the second code word;
an OFDM modulation circuit that converts the interleaved first to Nth code words into OFDM signals; and
a transmission circuit that transmits the OFDM signals.

2. The transmission apparatus according to claim 1, wherein the interleaver circuit has a memory size of $N_x \times N_y$, wherein $N_x$ is a number of rows and is a ceiling function of a number obtained by dividing a number of data subcarriers in an OFDM symbol by the number of data symbols included in the second code word and $N_y$ is a number of columns and is the same as the number of data symbols included in the second code word.

3. The transmission apparatus according to claim 1, wherein the interleaver circuit reads the second code word by using an address that is obtained by shifting, in accordance with the number of data symbols included in the first code word, an interleave address generated in accordance with an interleave size.

4. A reception apparatus comprising:
a reception circuit that receives OFDM signals including first to Nth code words (N is an integer of 2 or greater) interleaved by a transmission apparatus;
a DFT circuit that extracts the interleaved first to Nth code words from the OFDM signals; and
a deinterleaver circuit that deinterleaves the interleaved first to Nth code words,
wherein a number of data symbols included in the first code word is less than a number of data symbols included in the second code word, and
wherein the interleaved first to Nth code words are generated by an interleaver circuit of the transmission apparatus by:
writing a first set of data symbols included in the first code word to an Nth set of data symbols included in the Nth code word in a row direction in an ascending order; and
reading the first set of written data symbols to the Nth set of written data symbols in a column direction starting from a first data symbol of a second set of data symbols included in the second code word.

5. The reception apparatus according to claim 4, wherein the deinterleaver has a memory size of $N_x \times N_y$, wherein $N_x$ is a number of rows and is a ceiling function of a number obtained by dividing a number of data subcarriers in an OFDM symbol by the number of data symbols included in the second code word and $N_y$ is a number of columns and is the same as the number of data symbols included in the second code word.

6. The reception apparatus according to claim 4, wherein the interleaver circuit reads the second code word by using an address that is obtained by shifting, in accordance with the number of data symbols included in the first code word, an interleave address generated in accordance with an interleave size.

7. A transmission method comprising:
interleaving first to Nth code words (N is an integer of 2 or greater), a number of data symbols included in the first code word being less than a number of data symbols included in the second code word, wherein the interleaving is performed by:
writing a first set of data symbols included in the first code word to an Nth set of data symbols included in the Nth code word in a row direction in an ascending order; and
reading the first set of written data symbols to the Nth set of written data symbols in a column direction starting from a first data symbol of a second set of data symbols included in the second code word;
converting the interleaved first to Nth code words into OFDM signals; and
transmitting the OFDM signals.

8. A reception method comprising:
receiving OFDM signals including first to Nth code words (N is an integer of 2 or greater) interleaved by a transmission apparatus;
extracting the interleaved first to Nth code words from the OFDM signals; and
deinterleaving the interleaved first to Nth code words,
wherein a number of data symbols included in the first code word is less than a number of data symbols included in the second code word, and
wherein the interleaved first to Nth code words are generated by an interleaver circuit of the transmission apparatus by:
writing a first set of data symbols included in the first code word to an Nth set of data symbols included in the Nth code word in a row direction in an ascending order; and
reading the first set of written data symbols to the Nth set of written data symbols in a column direction starting from a first data symbol of a second set of data symbols included in the second code word.

9. The transmission apparatus according to claim 1, wherein
in a case where a number of remaining data symbol groups of the last data symbol within a previous OFDM symbol is zero, the reading of the first set of written data symbols to the Nth set of written data symbols starts from a first data symbol of the first set of data symbols included in the first code word.

10. The reception apparatus according to claim 4, wherein
in a case where a number of remaining data symbol groups of the last data symbol within a previous OFDM symbol is zero, the reading of the first set of written data symbols to the Nth set of written data symbols starts from a first data symbol of the first set of data symbols included in the first code word.

11. The transmission method according to claim 7, wherein
in a case where a number of remaining data symbol groups of the last data symbol within a previous OFDM symbol is zero, the reading of the first set of written data symbols to the Nth set of written data symbols starts from a first data symbol of the first set of data symbols included in the first code word.

12. The reception method according to claim 8, wherein
in a case where a number of remaining data symbol groups of the last data symbol within a previous OFDM symbol is zero, the reading of the first set of written data symbols to the Nth set of written data symbols starts from a first data symbol of the first set of data symbols included in the first code word.

* * * * *